(12) United States Patent
Barbato

(10) Patent No.: US 10,431,592 B2
(45) Date of Patent: *Oct. 1, 2019

(54) 3D MEMORY DEVICE

(71) Applicant: Sabrina Barbato, Turate (IT)

(72) Inventor: Sabrina Barbato, Turate (IT)

(73) Assignee: Trinandable S.r.l., Milan (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,529

(22) Filed: Sep. 7, 2017

(65) Prior Publication Data

US 2018/0069017 A1 Mar. 8, 2018

(30) Foreign Application Priority Data

Sep. 8, 2016 (IT) .......................... 102016000090862

(51) Int. Cl.
*H01L 27/11582* (2017.01)
*H01L 29/10* (2006.01)
(Continued)

(52) U.S. Cl.
CPC .... *H01L 27/11582* (2013.01); *G11C 16/0483* (2013.01); *H01L 21/28282* (2013.01);
(Continued)

(58) Field of Classification Search
CPC ............ G11C 11/4087; G11C 11/1697; G11C 11/4085; G11C 11/4093; G11C 11/4097;
(Continued)

(56) References Cited

U.S. PATENT DOCUMENTS 8,194,453 B2 * 6/2012 Maejima ............. H01L 27/0688
257/324
8,970,040 B1 * 3/2015 Chen ................. H01L 21/76838
257/211
(Continued)

*Primary Examiner* — Sung Il Cho
(74) *Attorney, Agent, or Firm* — Janeway Patent Law PLLC; John M. Janeway

(57) ABSTRACT

A 3D memory device comprising: a substrate; at least one first group of four first "U"-shaped memory cells strings each including a first buried string portion, a first source line selector side string portion and a first bit line selector side string portion, wherein the first buried string portion is formed in the substrate and connects the first source line selector side string portion and the first bit line selector side string portion, each of the first "U"-shaped memory cells strings including memory cells stacks along the first source line selector side string portion and along the first bit line selector side string portion; and at least one second group of four second "U"-shaped memory cells strings each including a second buried string portion, a second source line selector side string portion and a second bit line selector side string portion, wherein the second buried string portion is formed in the substrate and connects the second source line selector side string portion and the second bit line selector side string portion, each of the second "U"-shaped memory cells strings including memory cells stacks along the second source line selector side string portion and along the second bit line selector side string portion, wherein the first and second source line selector side string portions are between the first and second bit line selector side string portions, and wherein a first pair of the first "U"-shaped memory cells strings are mutually co-planar and one surrounded by the other, a second pair of the first "U"-shaped memory cells strings are mutually co-planar but staggered with respect to the first pair of first "U"-shaped memory cells strings and one surrounded by the other, a first pair of the second "U"-shaped memory cells strings are mutually co-planar and one surrounded by (Continued)

the other, a second pair of the second "U"-shaped memory cells strings are mutually co-planar but staggered with respect to the first pair of second "U"-shaped memory cells strings and one surrounded by the other.

9 Claims, 63 Drawing Sheets

(51) Int. Cl.
  *G11C 16/04* (2006.01)
  *H01L 21/28* (2006.01)
  *H01L 27/1157* (2017.01)
  *H01L 27/11565* (2017.01)
  *H01L 27/11568* (2017.01)
  *H01L 29/792* (2006.01)
  *H01L 27/11524* (2017.01)
  *H01L 27/11556* (2017.01)

(52) U.S. Cl.
  CPC ...... *H01L 27/1157* (2013.01); *H01L 29/1037* (2013.01); *H01L 27/11524* (2013.01); *H01L 27/11556* (2013.01); *H01L 27/11565* (2013.01); *H01L 27/11568* (2013.01); *H01L 29/7926* (2013.01)

(58) Field of Classification Search
  CPC . G11C 11/411; G11C 11/4125; G11C 7/1048; G11C 7/24; G11C 15/04
  USPC ..................................................... 365/230.03
  See application file for complete search history.

(56) References Cited

U.S. PATENT DOCUMENTS

| | | | |
|---|---|---|---|
| 9,391,087 B2* | 7/2016 | Shibata | G11C 8/14 |
| 9,397,043 B1* | 7/2016 | Minemura | H01L 27/11582 |
| 9,553,106 B1* | 1/2017 | Sung | H01L 27/11575 |
| 2011/0233644 A1* | 9/2011 | Fukuzumi | H01L 21/28282 |
| | | | 257/324 |
| 2012/0267699 A1* | 10/2012 | Kiyotoshi | H01L 27/11524 |
| | | | 257/319 |
| 2012/0300547 A1* | 11/2012 | Choi | H01L 27/11565 |
| | | | 365/185.05 |
| 2013/0107628 A1* | 5/2013 | Dong | G11C 16/0483 |
| | | | 365/185.17 |
| 2013/0153978 A1 | 6/2013 | Lee et al. | |
| 2013/0194869 A1* | 8/2013 | Choi | G11C 16/0483 |
| | | | 365/185.11 |
| 2013/0264626 A1* | 10/2013 | Sawa | H01L 29/66825 |
| | | | 257/316 |
| 2015/0017771 A1 | 1/2015 | Lee et al. | |
| 2015/0155371 A1 | 6/2015 | Choi | |
| 2015/0262689 A1* | 9/2015 | Hashimoto | G11C 16/26 |
| | | | 365/185.11 |
| 2016/0020221 A1* | 1/2016 | Oh | H01L 27/11582 |
| | | | 257/324 |
| 2016/0118395 A1 | 4/2016 | Son et al. | |
| 2017/0040061 A1* | 2/2017 | Yeh | G11C 16/14 |
| 2017/0069731 A1* | 3/2017 | Kim | H01L 27/11556 |
| 2017/0293436 A1* | 10/2017 | Sethuraman | G06F 3/0613 |

* cited by examiner

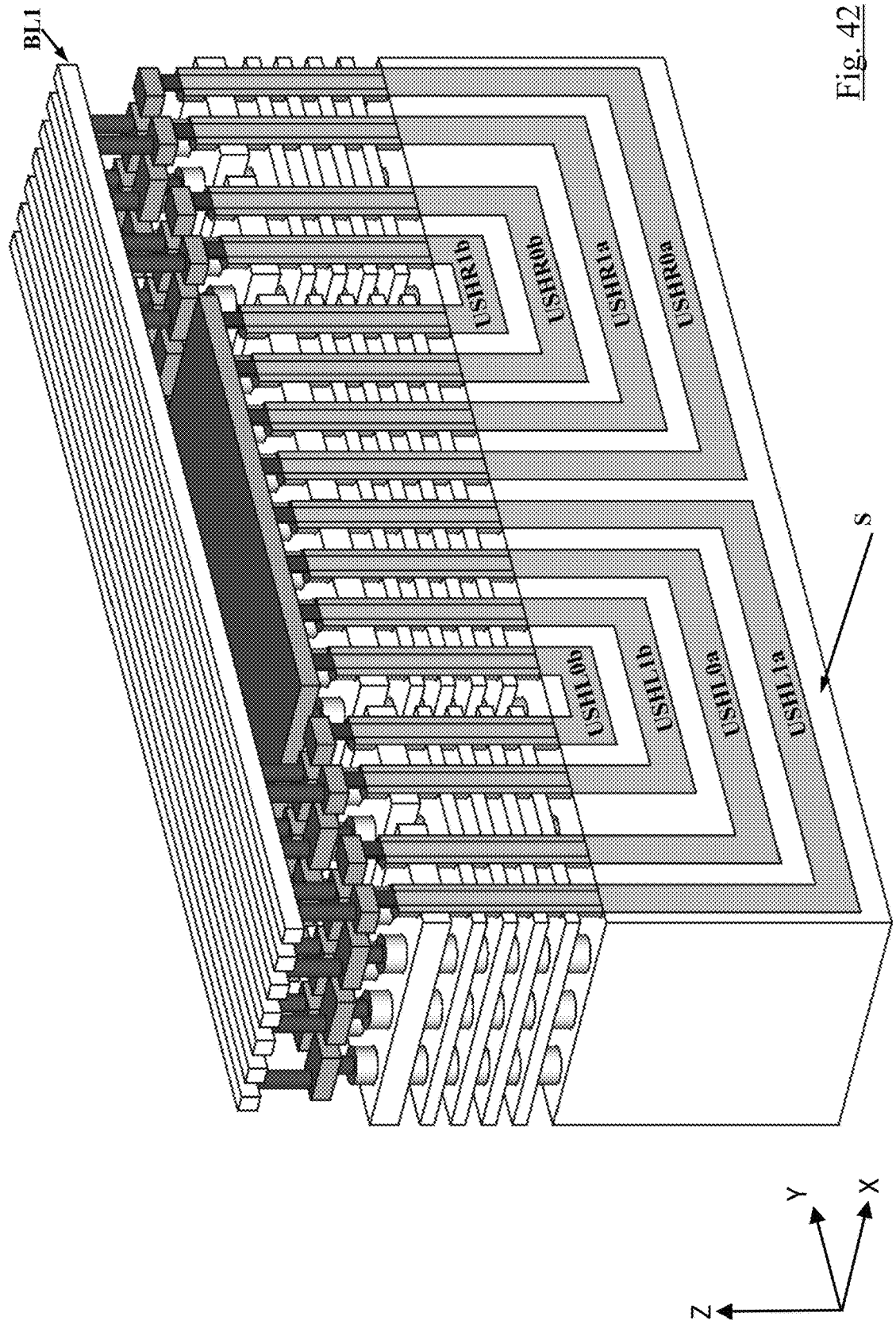

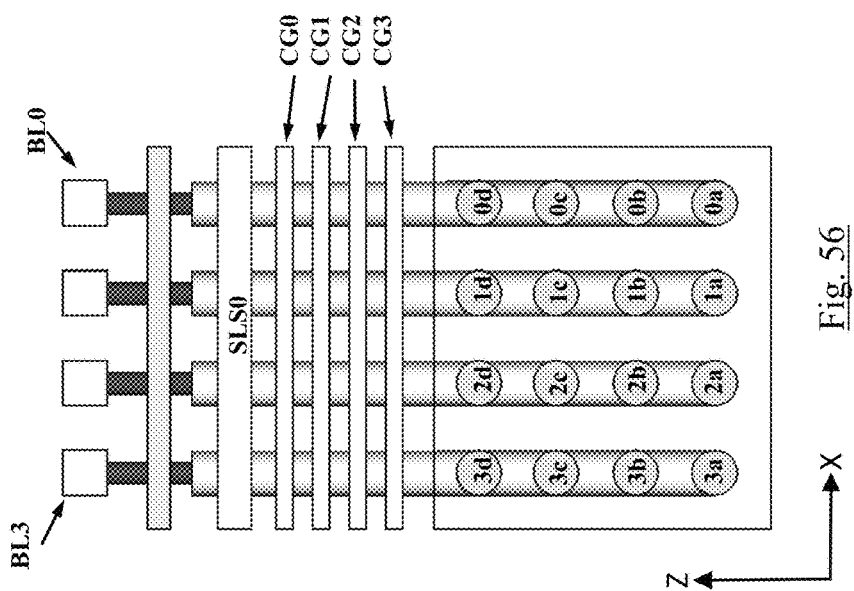

3D MEMORY DEVICE

BACKGROUND

Technical Field

The present invention generally relates to the field of semiconductor devices and in particular to the field of semiconductor memories. More specifically, the present invention relates to the so-called "three-dimensional" ("3D") semiconductor memory sector.

Related Art

In the industry of non-volatile semiconductor memory (memory devices that can hold the data stored therein even in the absence of an energy source), 3D semiconductor memories ("3D memories") represent an evolution of traditional "two-dimensional" memories semiconductor ("2D" memories, in which memory cells are formed as a single layer on a substrate of semiconductor material), which allows to exceed the limits of the 2D structure to further increase the integration scale and, therefore, further increase data storage capacity per unit area.

Examples of non-volatile 3D semiconductor memory devices with NAND architecture (in which there are serially connected memory cell groups to form memory cell strings) are described in US 2012/300547 A1, US 2015/0155371 A1, US 2013/0153978 A1, US 2015/0017771 A1.

In particular, in US 2015/017771 A1 there are described some memory cell block structures ("memory blocks"), where by memory block it is meant the structural unit which, replicated in two dimensions, constitutes a memory cell array (memory matrix).

SUMMARY OF THE INVENTION

The Applicant noticed that known memory block architectures, such as those described in US 2015/017771 A1, have a margin of improvement in terms of compactness, resulting in improved data storage capacity per unit area.

An object of the present invention is to propose a memory block architecture for a more compact 3D semiconductor memory than the known architectures, enabling further increases in data storage capacity per unit area.

According to with the present invention, it is proposed a 3D memory device comprising:
  a substrate;
  at least one first group of four first "U"-shaped strings of memory cells each including a first buried string portion, a first source line selector side string portion and a first bit line selector side string portion, wherein the first buried string portion is formed in the substrate and connects the first source line selector side string portion and the first bit line selector side string portion, each of the first "U"-shaped string of memory cells including stacks of memory cells along the first source line selector string side portion and along the first bit line selector side string portion; and
  at least one second group of four second "U"-shaped strings of memory cells each including a second buried string portion, a second source line selector side string portion and a second bit line selector side string portion, wherein the second buried string portion is formed in the substrate and connects the second source line selector side string portion and the second bit line selector side string portion, each of the second "U"-shaped string of memory cells including stacks of memory cells along the second source line selector side string portion and along the second bit line selector side string portion.

The first and second source line selector side string portions are between the first and second bit line selector side string portion.

A first pair of the first "U"-shaped memory cells strings are mutually co-planar and one surrounded by the other, a second pair of the first "U"-shaped memory cells strings are mutually co-planar but staggered with respect to the first pair of first "U"-shaped memory cells strings and one surrounded by the other, a first pair of the second "U"-shaped memory cells strings are mutually co-planar and one surrounded by the other, a second pair of the second "U"-shaped memory cells strings are mutually co-planar but staggered with respect to the first pair of second "U"-shaped memory cells strings and one surrounded by the other.

In embodiments, the first pair of first "U"-shaped memory cells strings have the respective first buried string portions formed at a first and a second different depths in the substrate and with a first and a second different lengths, the second pair of the first "U"-shaped memory cells strings have the respective first buried string portions formed at a third and a fourth different depths in the substrate, different from the first and second depths, and with a third and a fourth different lengths different from the first and second lengths, the first pair of the second "U"-shaped memory cells strings have the respective second buried string portions formed at the third and fourth depths in the substrate and with the third and four lengths, and the second pair of the second "U"-shaped memory cells strings have the respective second buried string portions formed at the first and second depths in the substrate and with the first and second lengths.

Preferably, the length of the first and second buried string portions increases with their depth in the substrate.

Advantageously, the first depth is less than the third depth, the third depths is less than the second depth and the second depth is less than the fourth depth.

Advantageously, the first length is less than the third length, the third length is less than the second length and the second length is less than the fourth length.

In embodiments, the first pair of first "U"-shaped memory cells strings are co-planar with the first pair of second "U"-shaped memory cells strings, and the second pair of first "U"-shaped memory cells strings are co-planar with the second pair of second "U"-shaped memory cells strings.

The 3D memory device may further comprise:
  a plurality of source line selector side word lines stacked over the substrate, wherein the plurality of source line selector side word lines surrounds the first source line selector side string portions and the second source line selector side string portions; and
  a first plurality and a second plurality of bit line selector side word lines stacked over the substrate, wherein the first plurality of bit line selector side word lines surrounds the first bit line selector side string portions and the second plurality of bit line selector side word lines surrounds the second bit line selector side string portions.

The 3D memory device may also include:
  source line selectors stacked over the plurality of source line selector side word lines, wherein the source line selectors surround the first source line selector side string portions and the second source line selector side string portions switch, which source line selectors include a source line selector for each of the first and second source line selector side string portions; is first bit line selectors stacked over the first plurality of bit line selector side word lines and second bit line selectors stacked above the second plurality of bit line selector side word lines, wherein the first bit line selectors surround the first bit line selector side string portions and the second bit line selectors surround the second bit line selector side string portions, and wherein the first bit line selectors comprise a first bit line selector for each of the first bit line selector side string portions and the second bit line selectors comprise a second bit line selector for each of the second bit line selector side string portions.

In embodiments, the plurality of word line on the source line selector side can include a stack of word line layers on the source line selector side, the word line on the source line selector side in each layer being electrically connected, and the source line selectors are formed so that they are controlled by a single common source line selector control signal.

In embodiments, the first bit line selectors may be formed so as to be controlled by a single common first bit line selector control signal, and the second bit line selectors may be formed so as to be controlled by a single common second bit line selector control signal.

In embodiments, the 3D memory device may comprise a first, a second, a third and a fourth bit lines operatively associated to the first and second groups of four first and second "U"-shaped memory cells strings, wherein:

the first bit line is connected, through a respective first bit line selector and second bit line selector, to the first bit line selector side string portions of the one of the first pair of the first "U"-shaped memory cells strings and to the second bit line selector side string portion of one of the first pair of the second "U"-shaped memory cells strings;

the second bit line is connected, through a respective first bit line selector and second bit line selector, to the first bit line selector side string portions of the other one of the first pair of the first "U"-shaped memory cells strings and to the second bit line selector side string portion of the other one of the first pair of the second "U"-shaped memory cells strings;

the third bit line is connected, through a respective first bit line selector and second bit line selector, to the first bit line selector side string portions of one of the second pair of the first "U"-shaped memory cells strings and to the second bit line selector side string portion of one of the second pair of the second "U"-shaped memory cells strings, and the fourth bit line is connected, through a respective first bit line selector and second bit line selector, to the first bit line selector side string portions of the other one of the second pair of the first "U"-shaped memory cells strings and to the second bit line selector side string portion of the other one of the second pair of the second "U"-shaped memory cells strings.

In embodiments, the first bit line selectors may be formed as a first and a second groups of first bit line selectors, each first and second group of first bit line selectors being controlled by a respective single common first bit line selector control signal, each first and second group of first bit line selectors surrounding a respective subset of the first bit line selector side string portions, and the second bit line selectors may be formed as a first and second groups of second bit line selectors, each first and second group of second bit line selectors being controlled by a respective single common second bit line selector control signal, each first and second group of second bit line selectors surrounding a respective subset of the second bit line selector side string portions.

In embodiments, the 3D memory device may comprise a first and a second bit lines operatively associated to the first and second groups of four first and second "U"-shaped memory cells strings, wherein the first bit line is connected, through respective first bit line selectors of the first and second groups of first bit line selectors, to the first bit line selector side string portions of the first pair of the first "U"-shaped memory cells strings and, through respective second bit line selectors of the first and second groups of second bit line selectors, to the second bit line selector side string portions of the first pair of the second "U"-shaped memory cells strings.

Preferably, the center lines of the first buried string portions are placed along a same respective line, and the center lines of the second buried string portions are placed along a same respective line.

Thanks to the present invention, it is possible to realize 3D semiconductor memories with data storage capacity improved over those known in the art.

BRIEF PRESENTATION OF THE ATTACHED FIGURES

These and other features and advantages of the present invention will become more apparent by reading the following detailed description of some of its exemplary embodiments being, to be considered as non-limitative. For a better intelligibility, the following description will make reference to the attached figures, briefly presented below:

Figure 2:
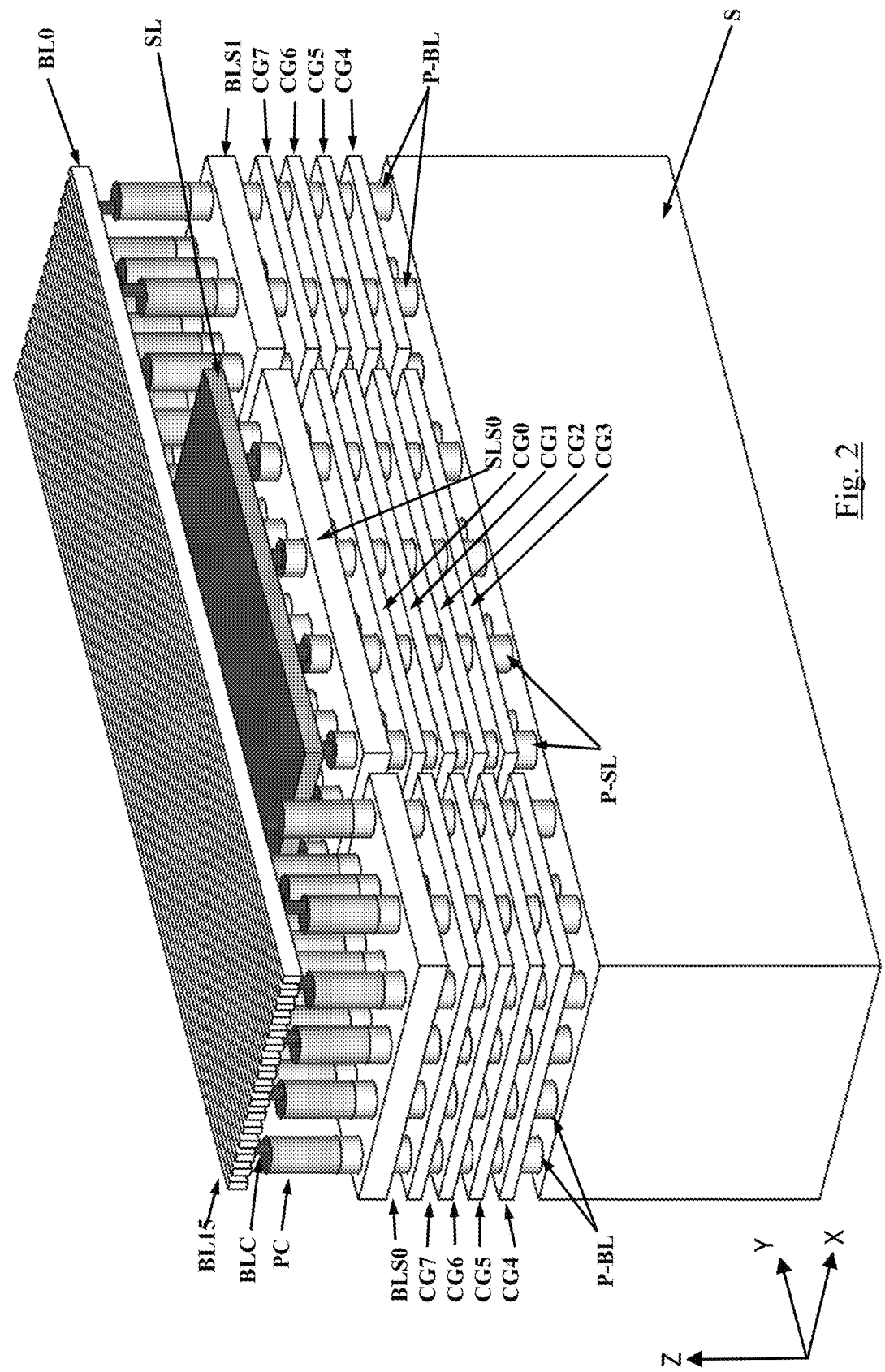
FIG. 2 is an isometric view of a portion of a memory device according to a first exemplary embodiment of the invention.
Figure 3:
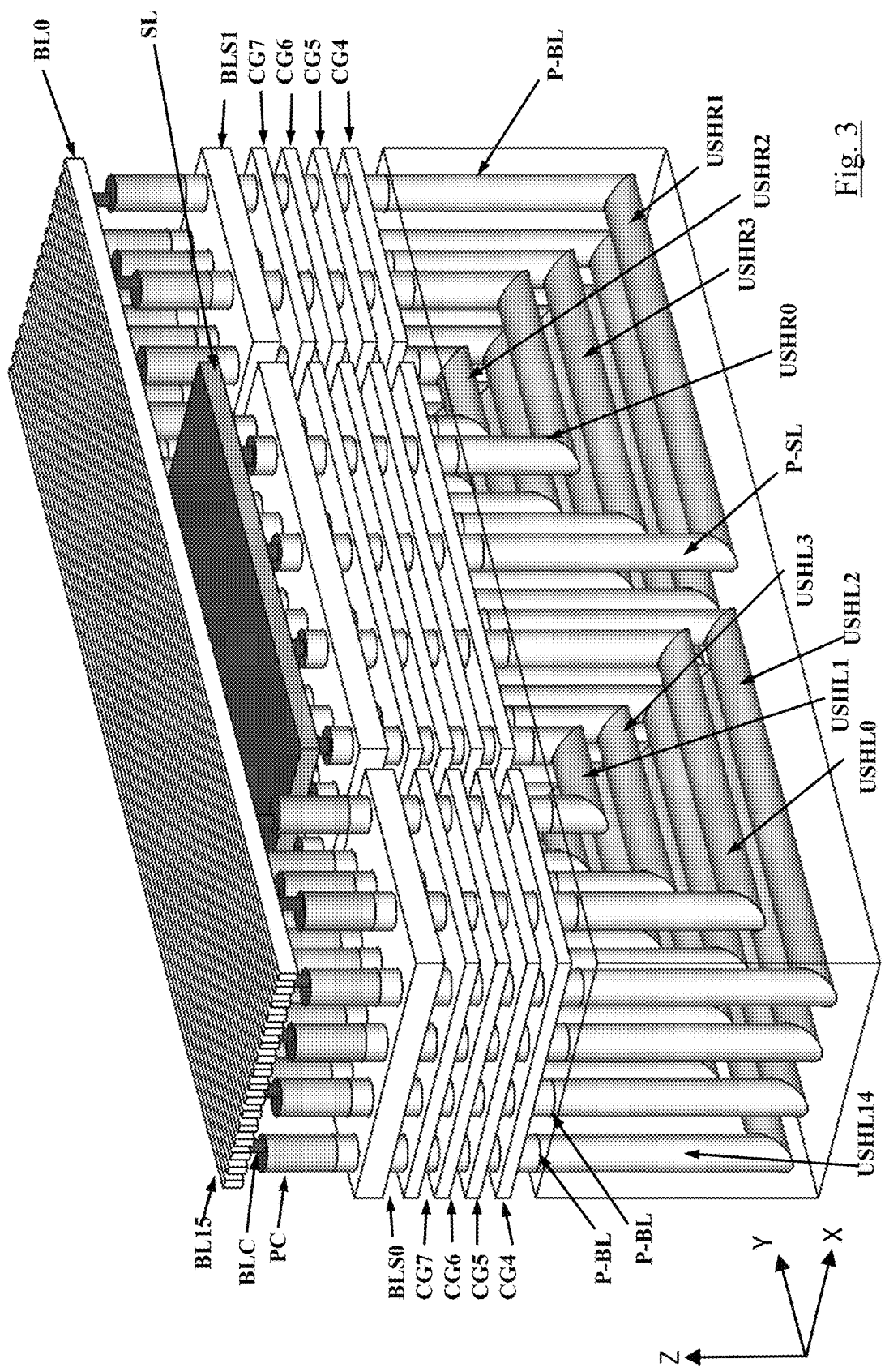
Figure 4:
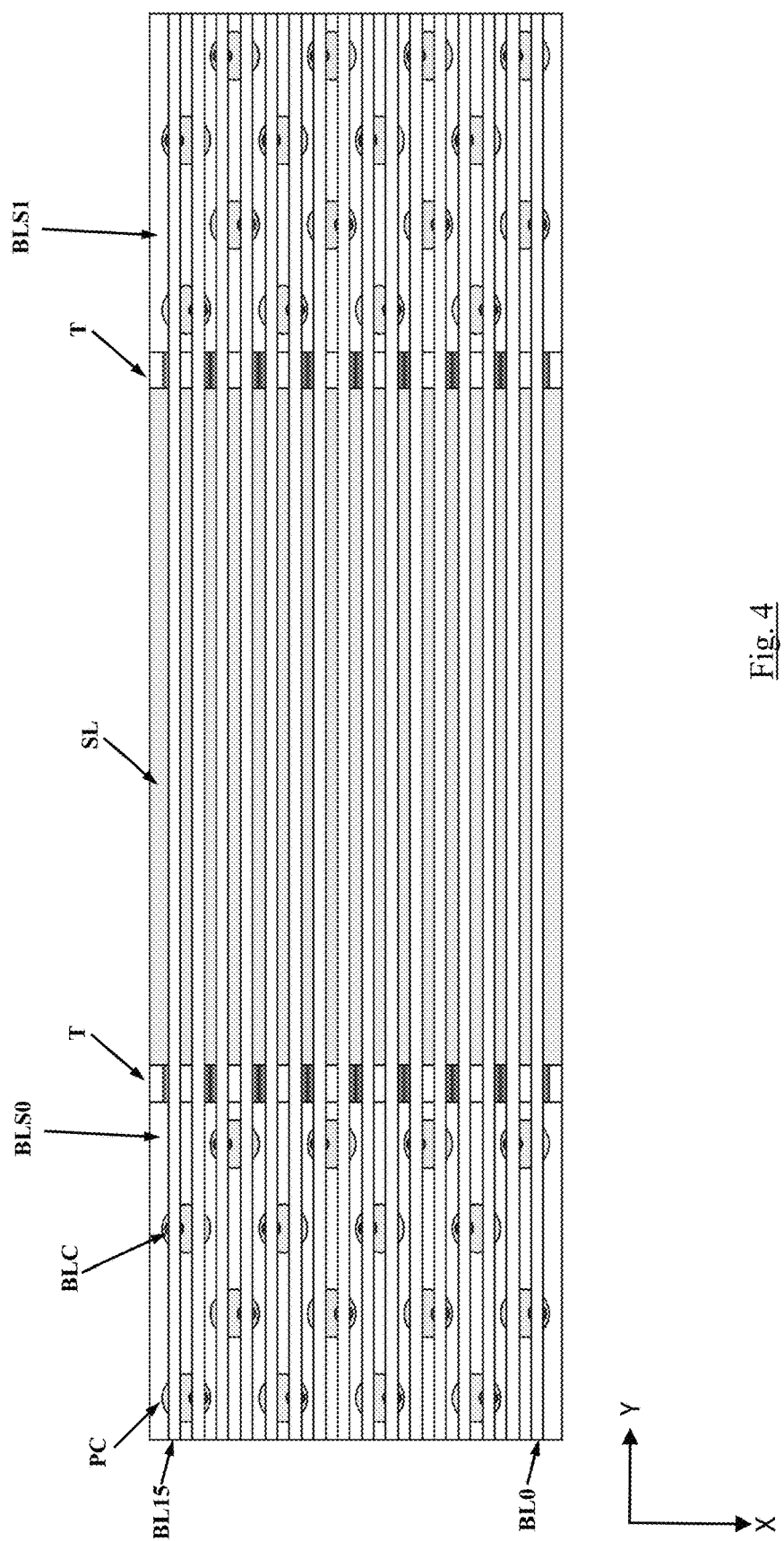
Figure 5:
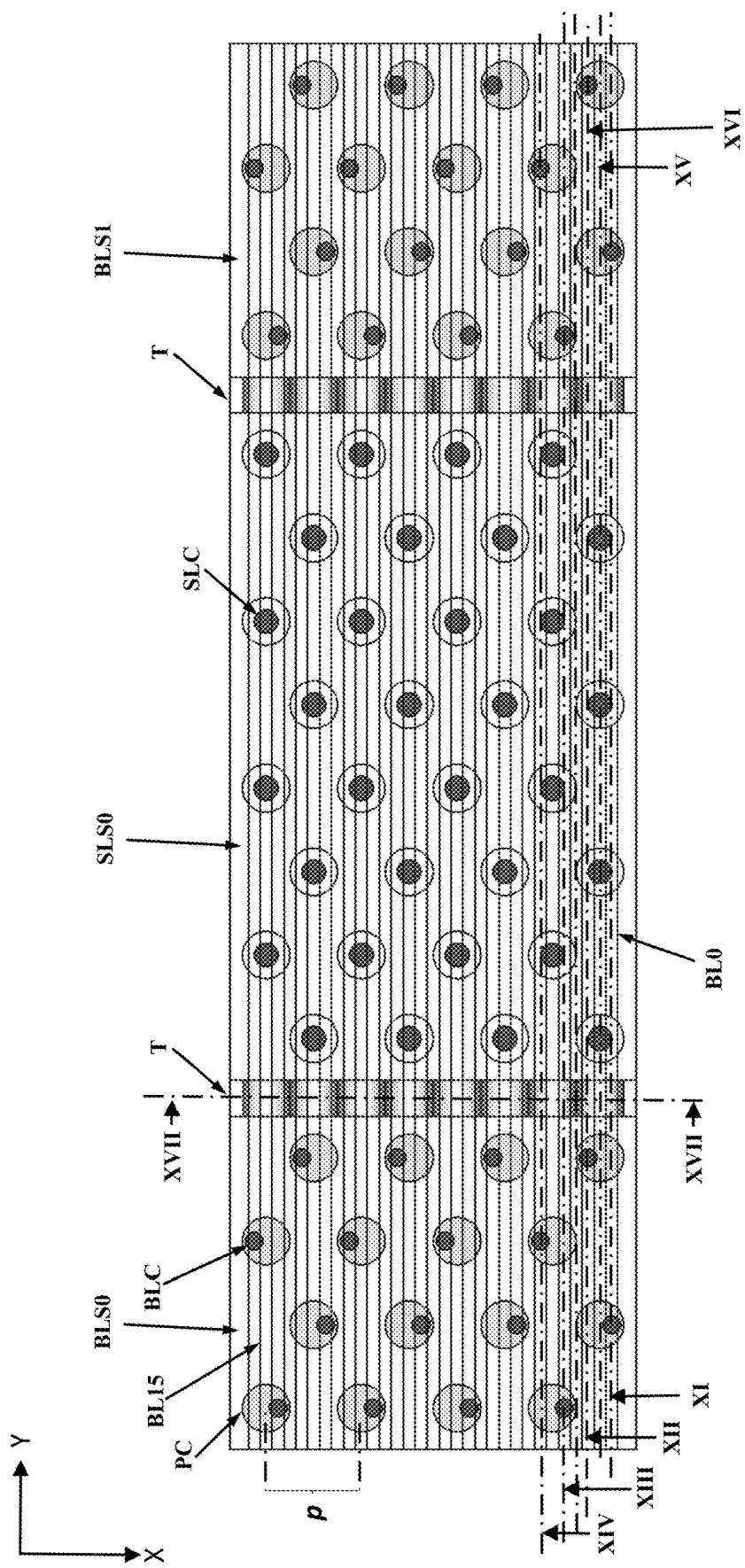
Figure 6:
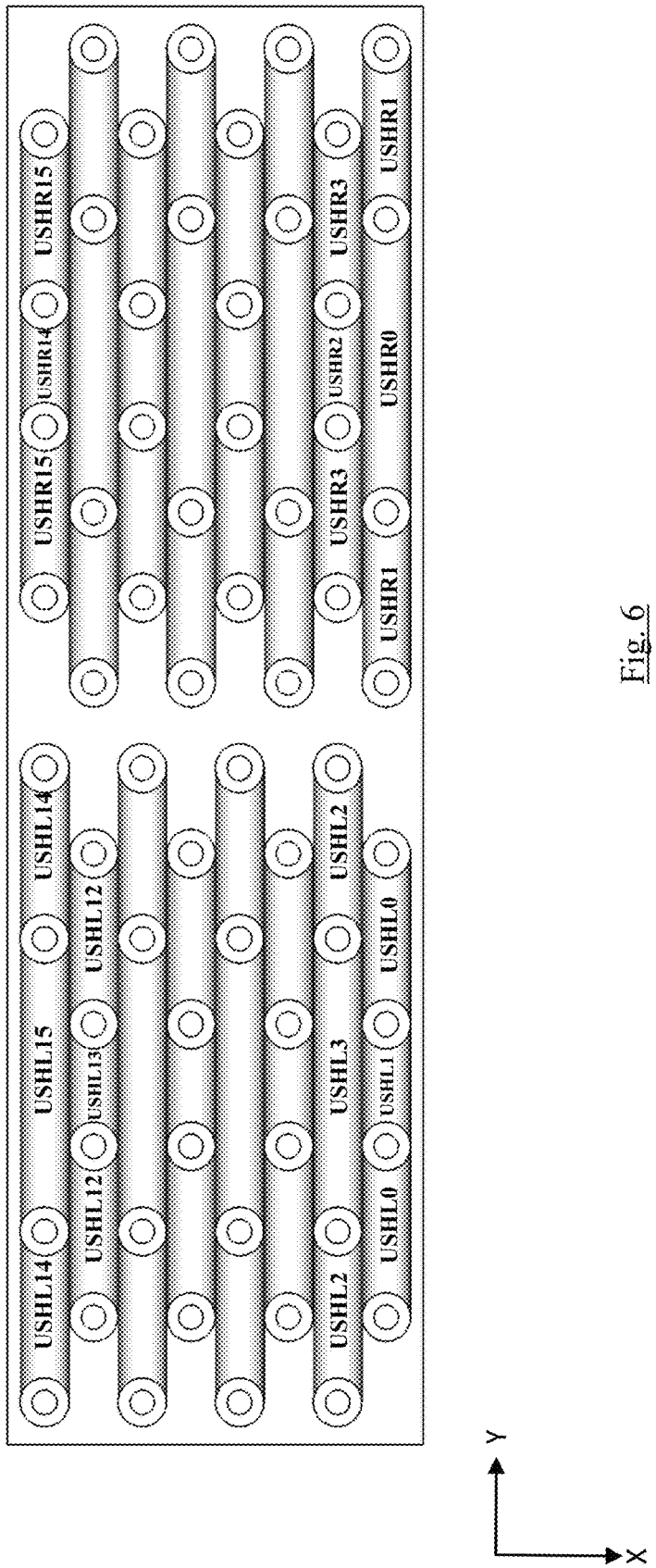
Figure 7:
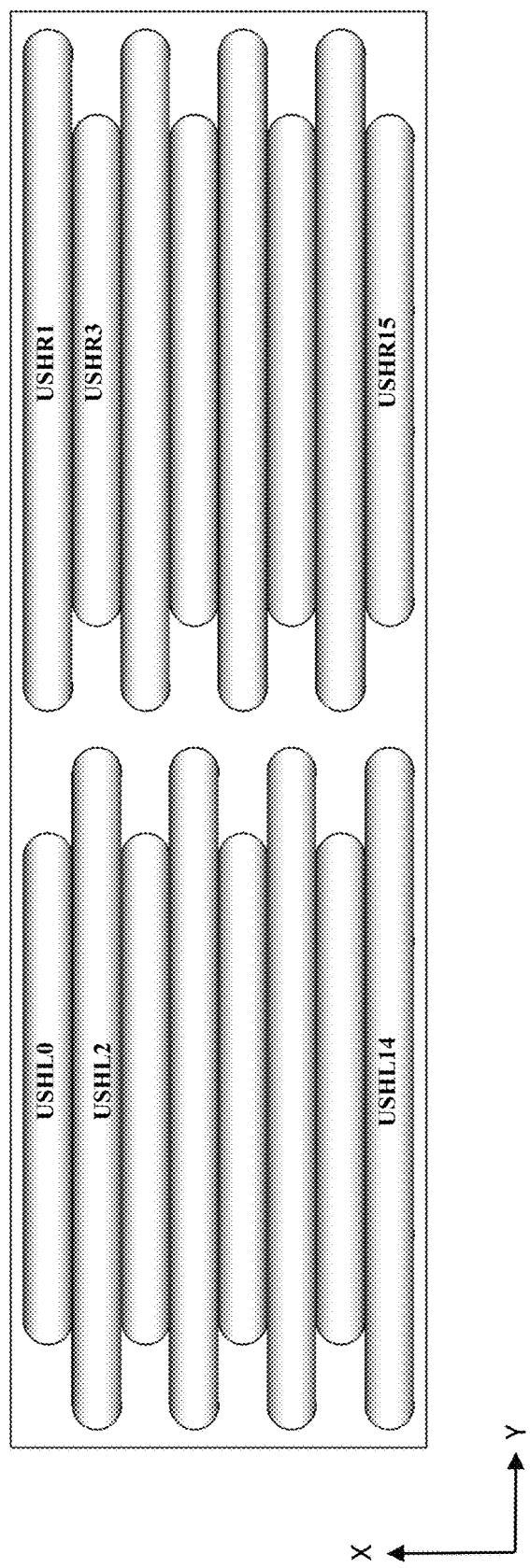
Figure 8:
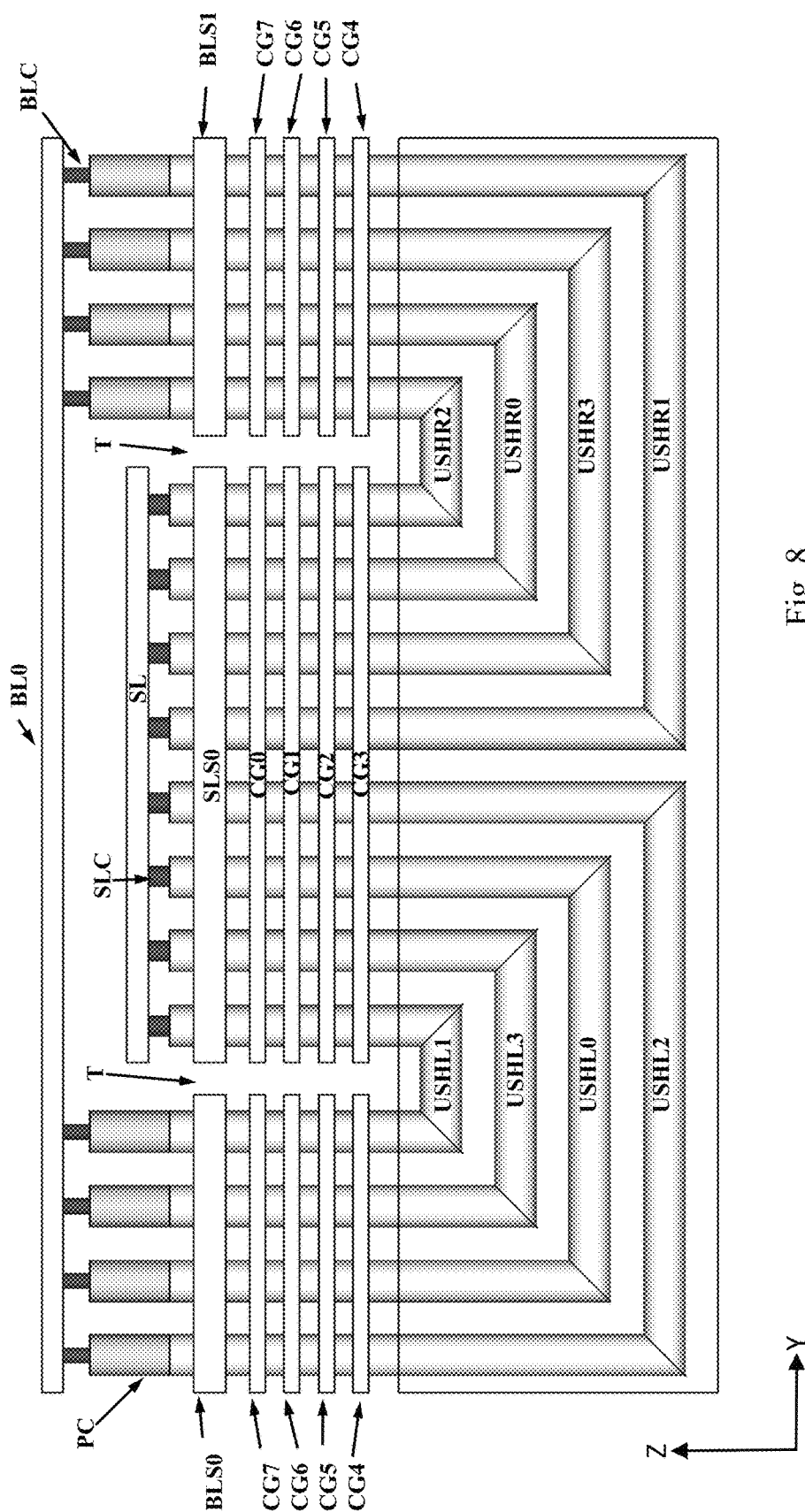
Figure 9:
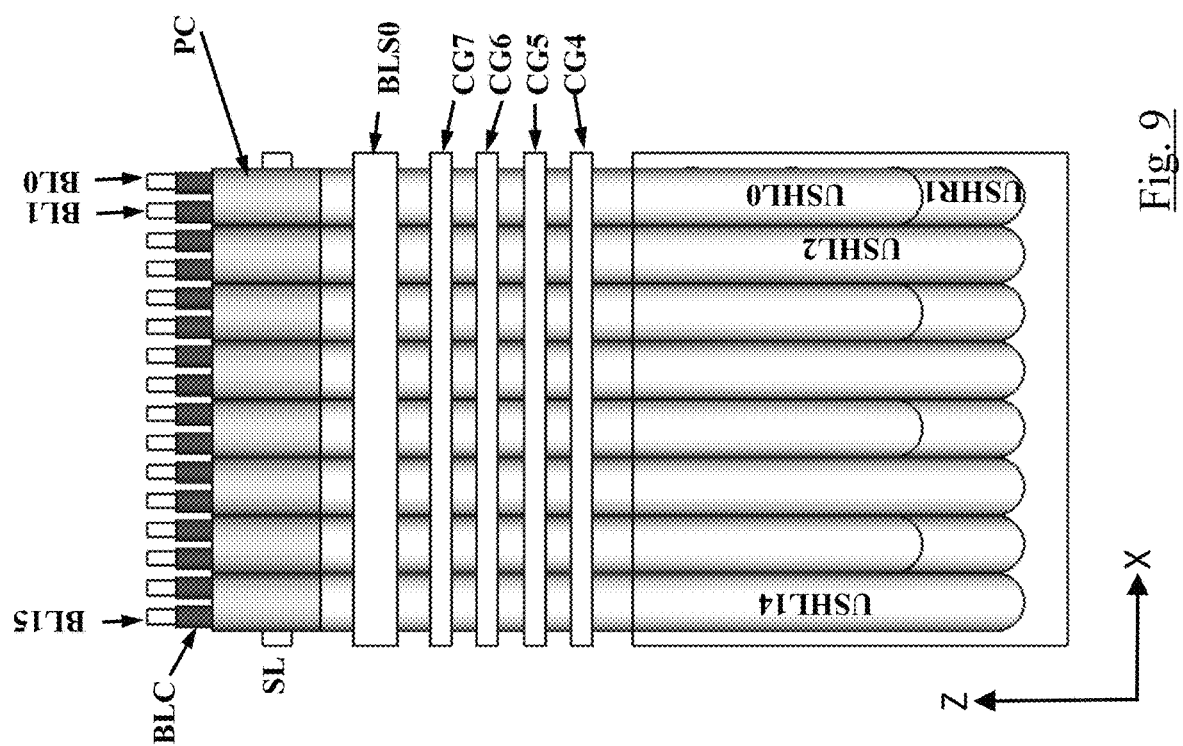
Figure 10:
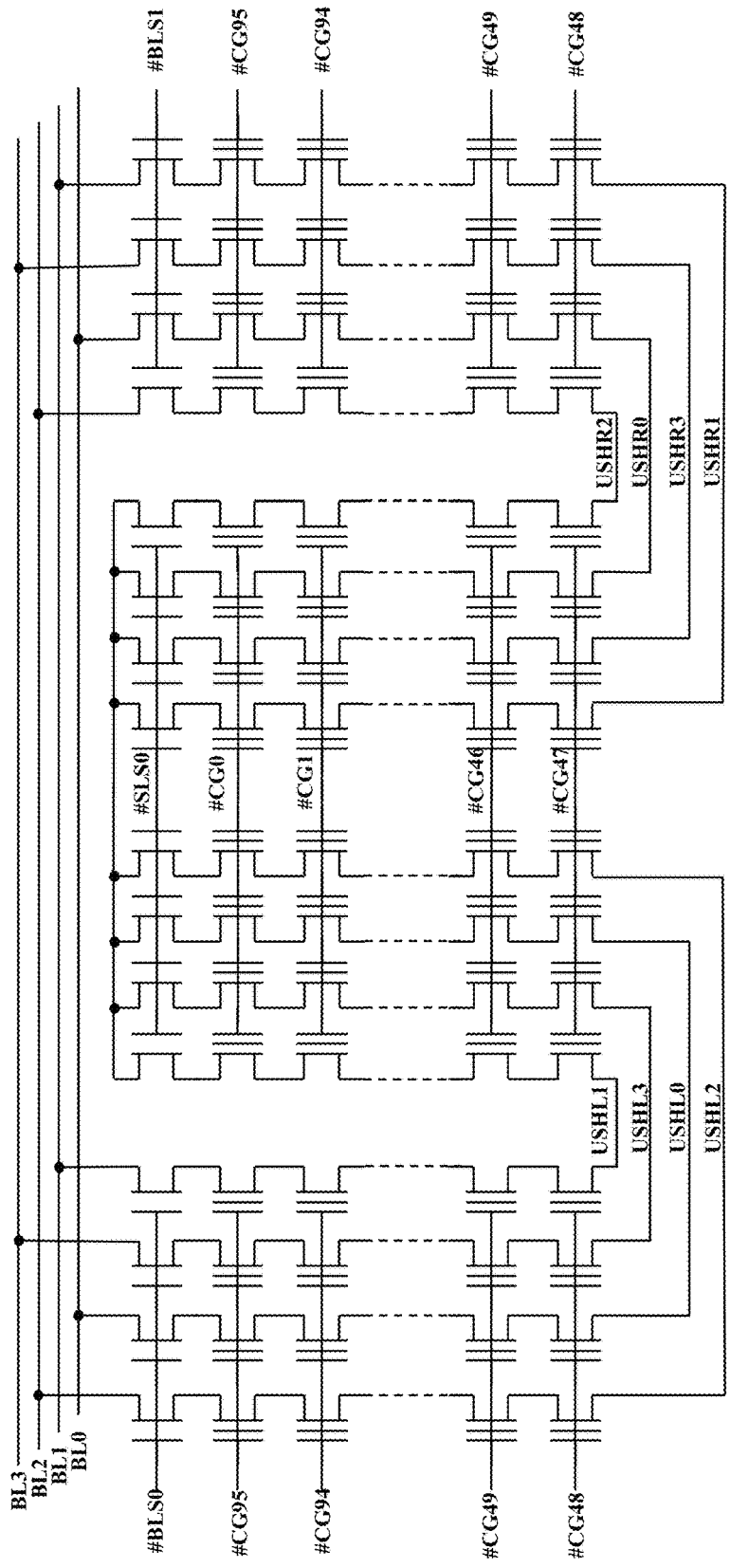
Figure 11:
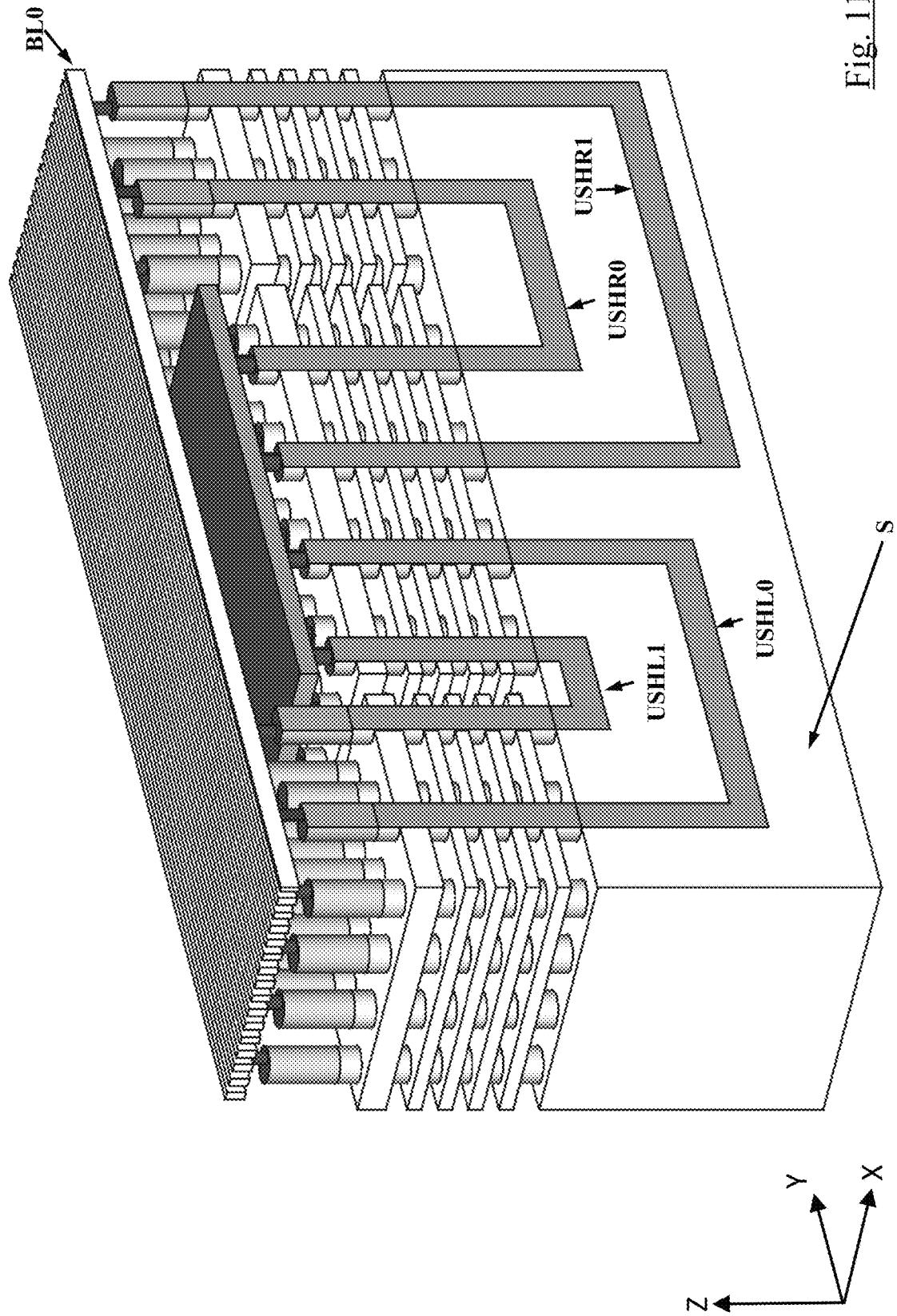
Figure 12:
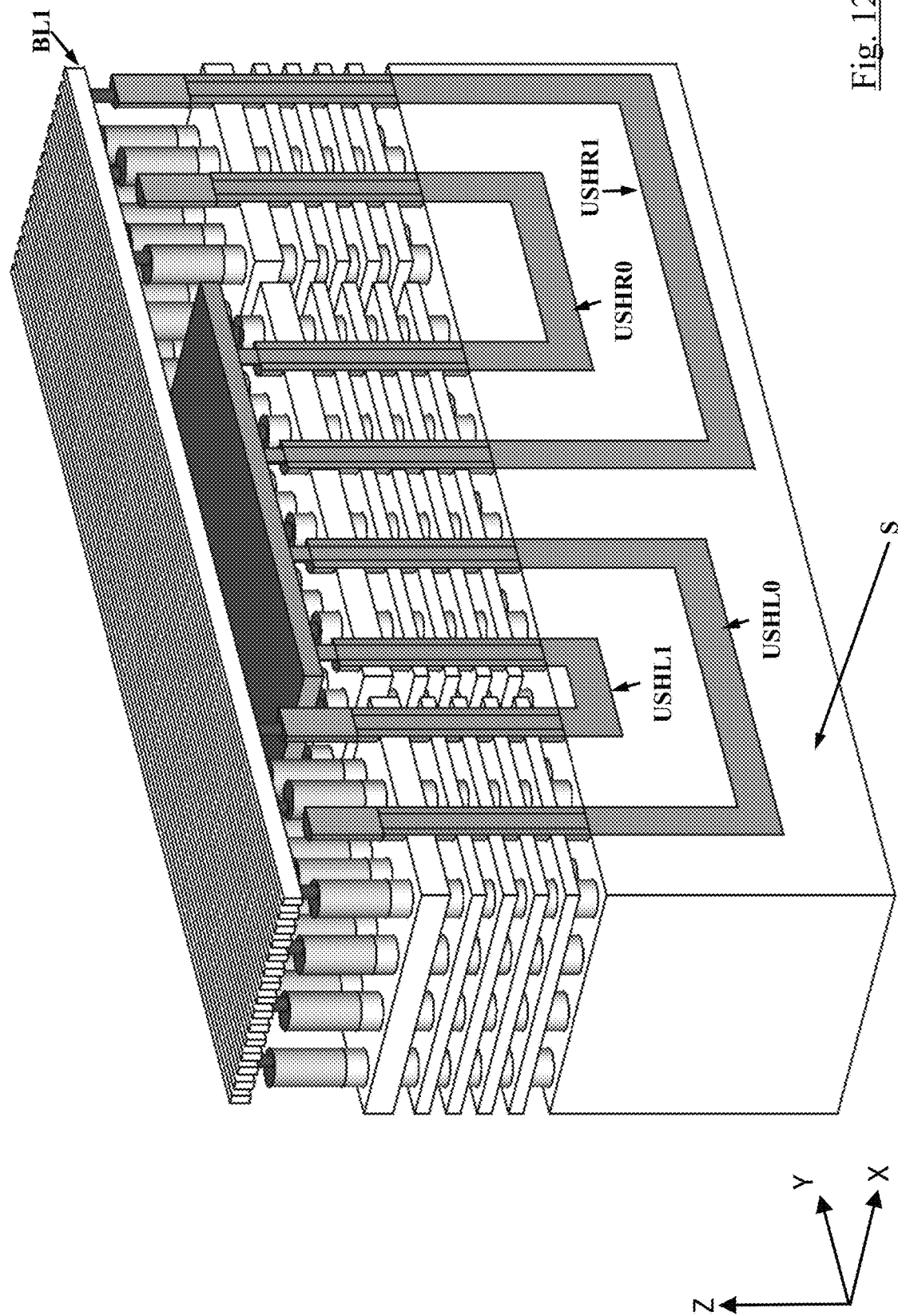
Figure 13:
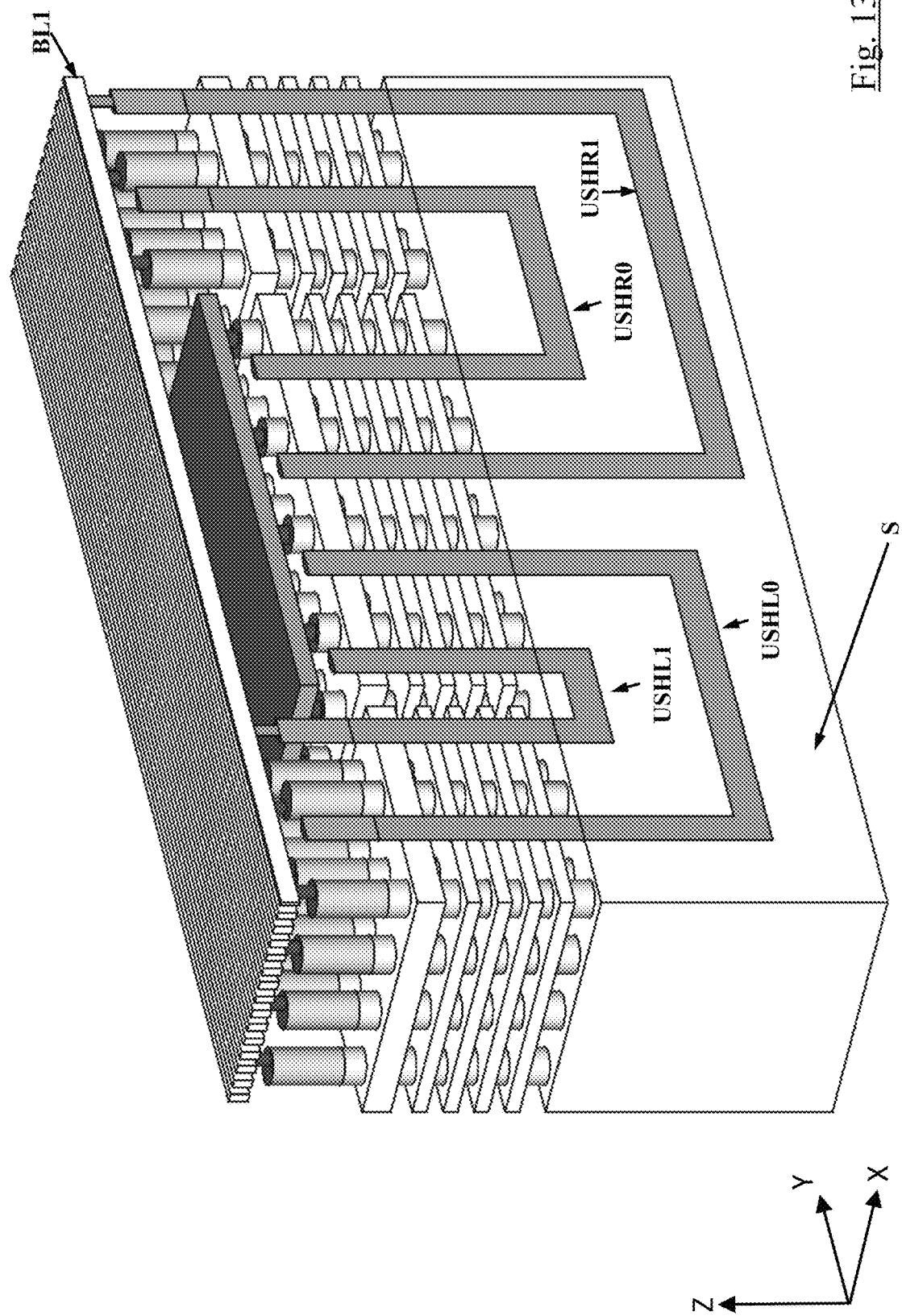
Figure 14:
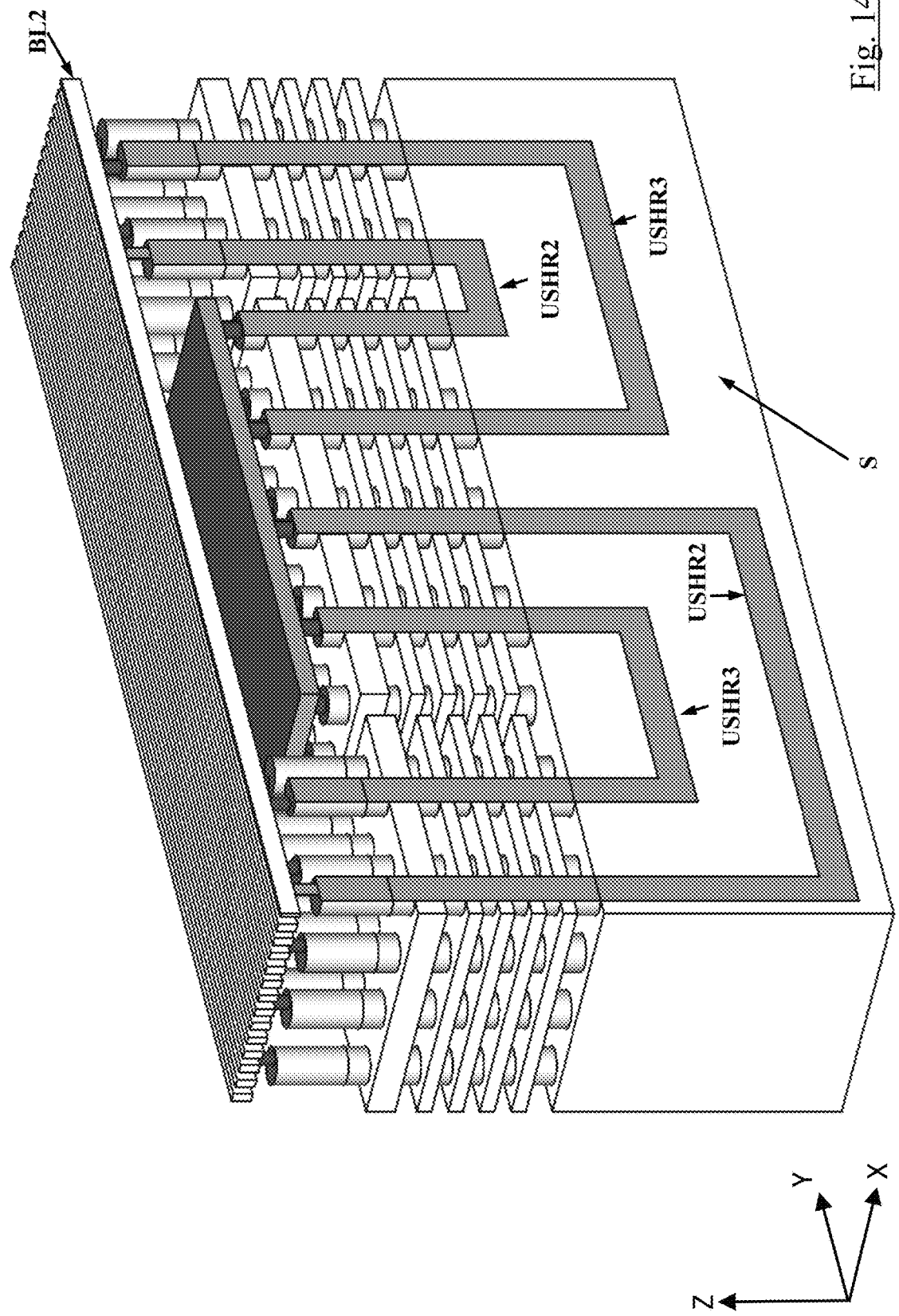
Figure 15:
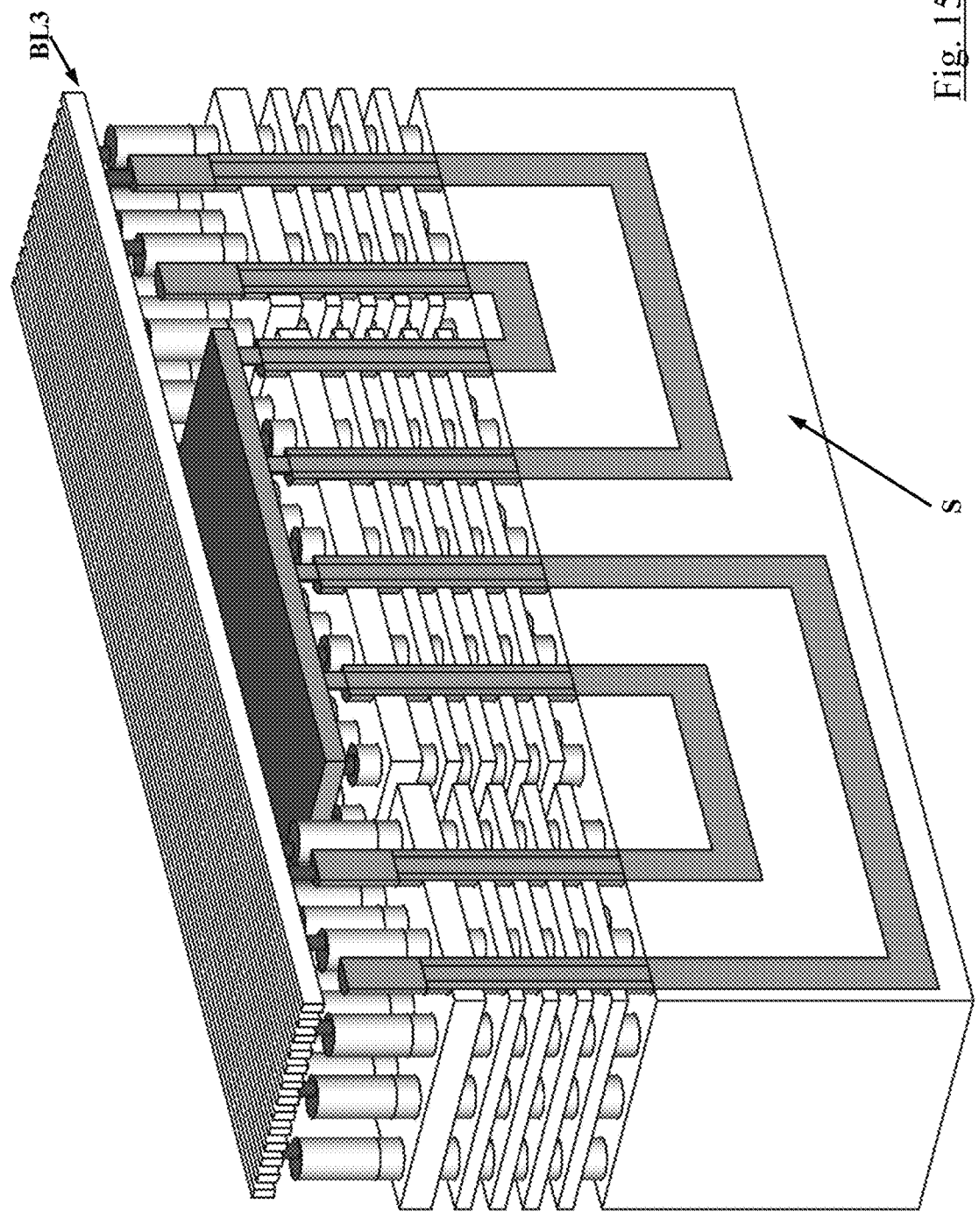
Figure 16:
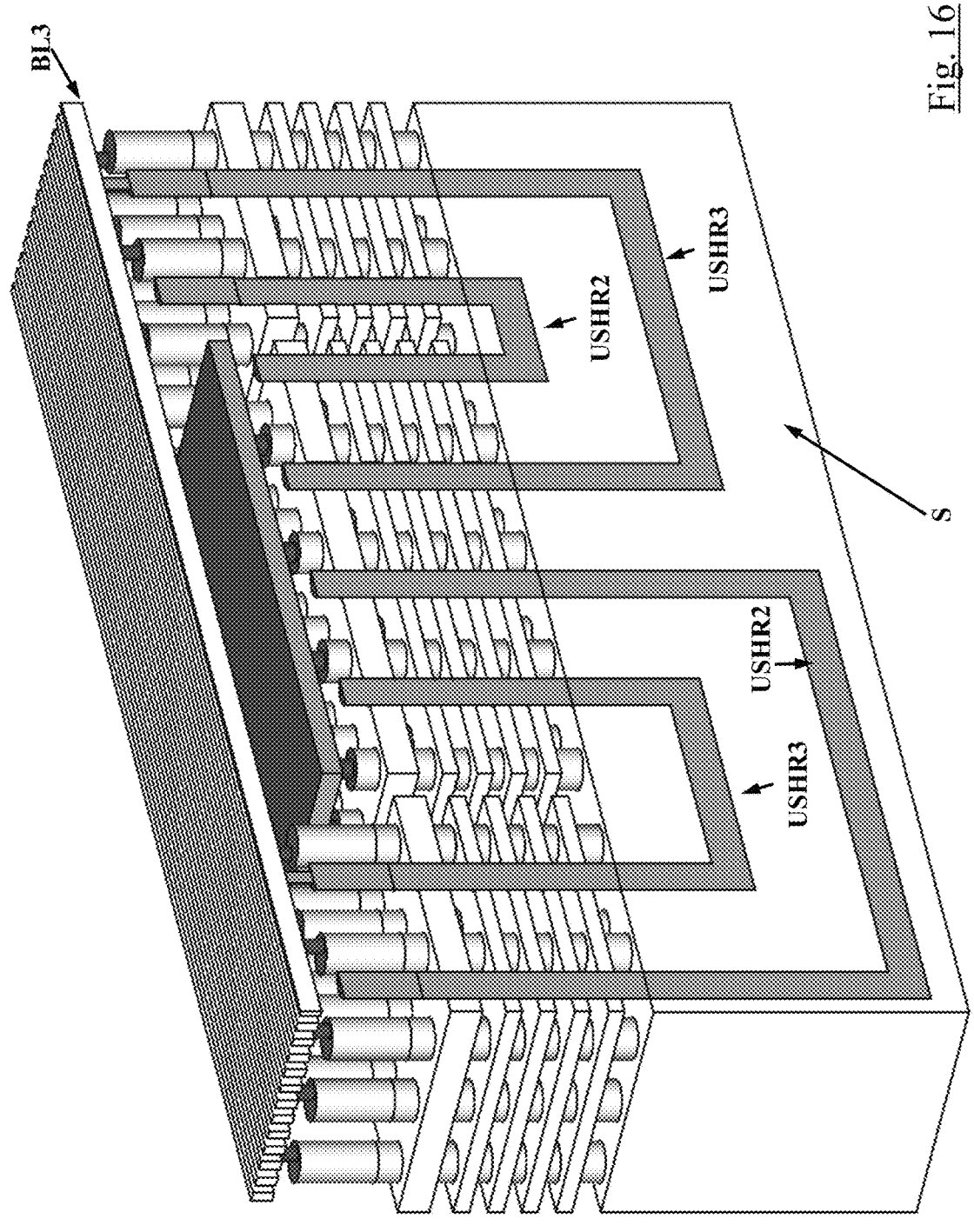
Figure 18:
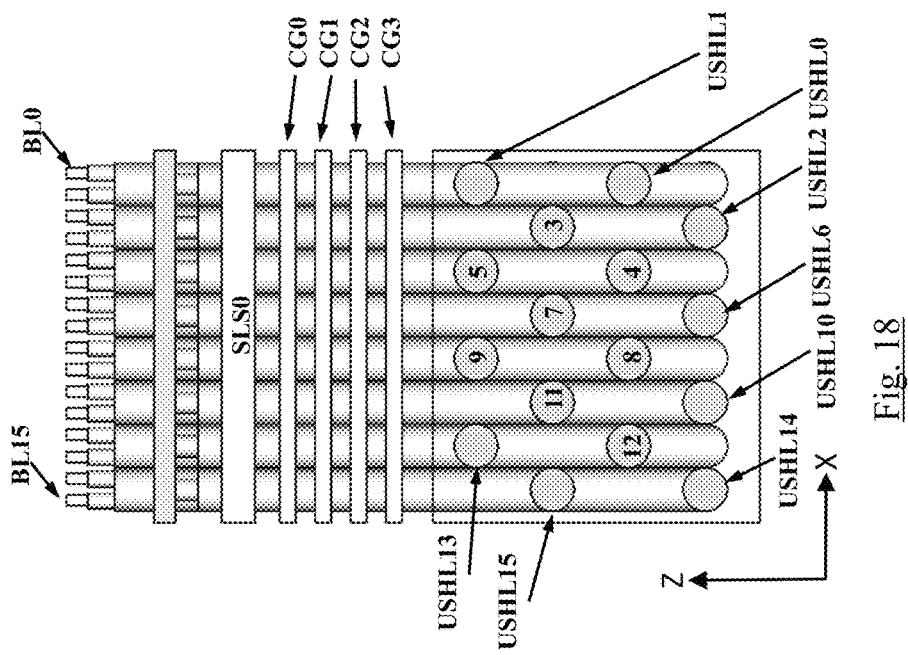
Figure 17:
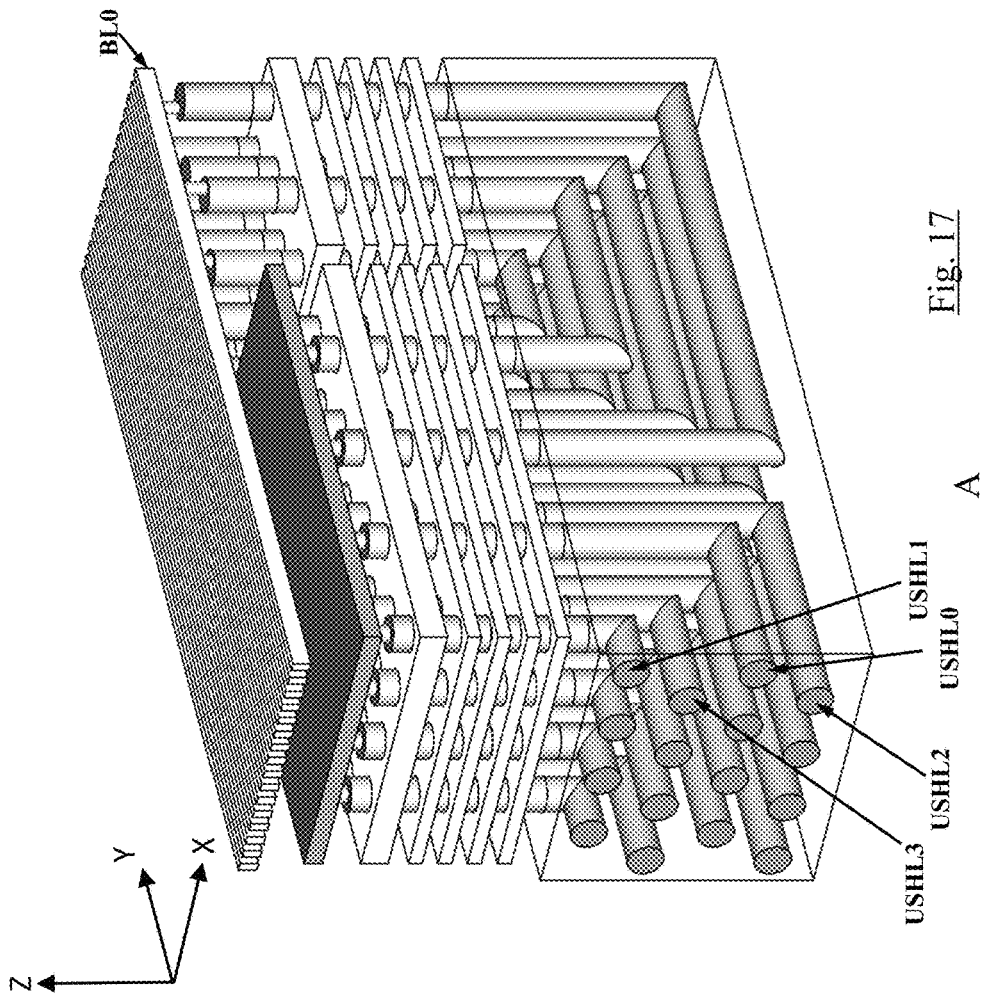
Figure 19:
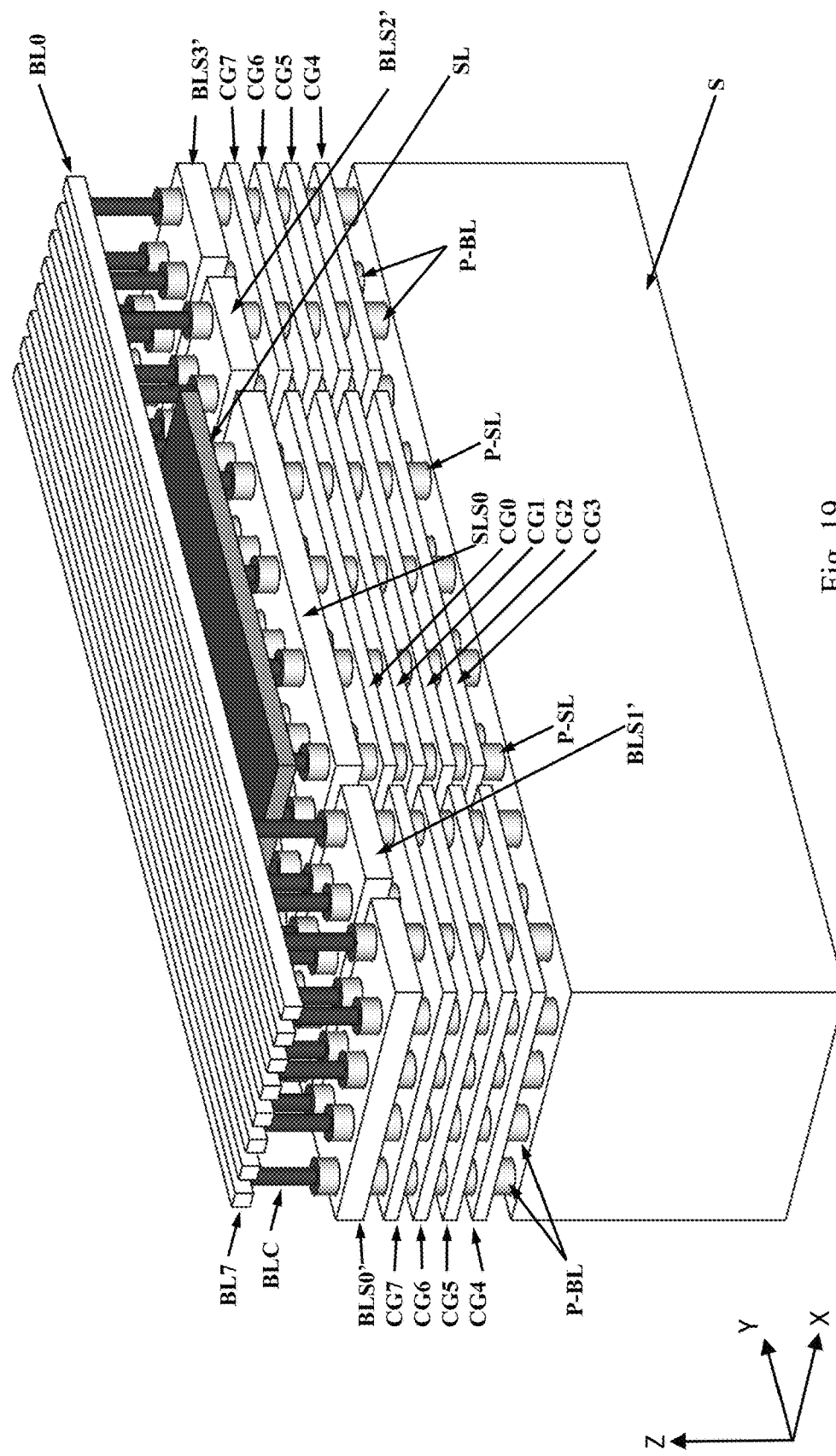
Figure 20:
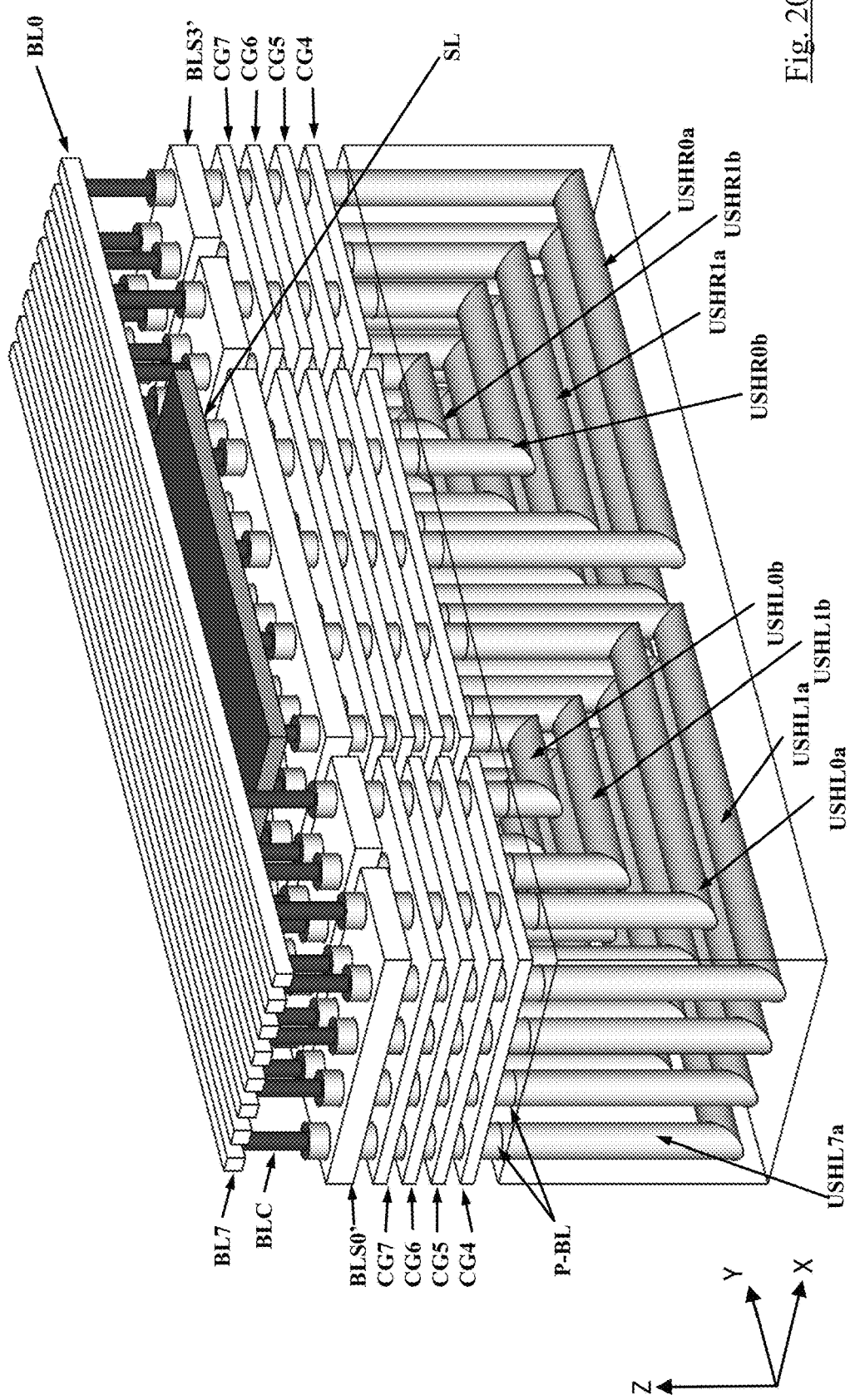
Figure 21:
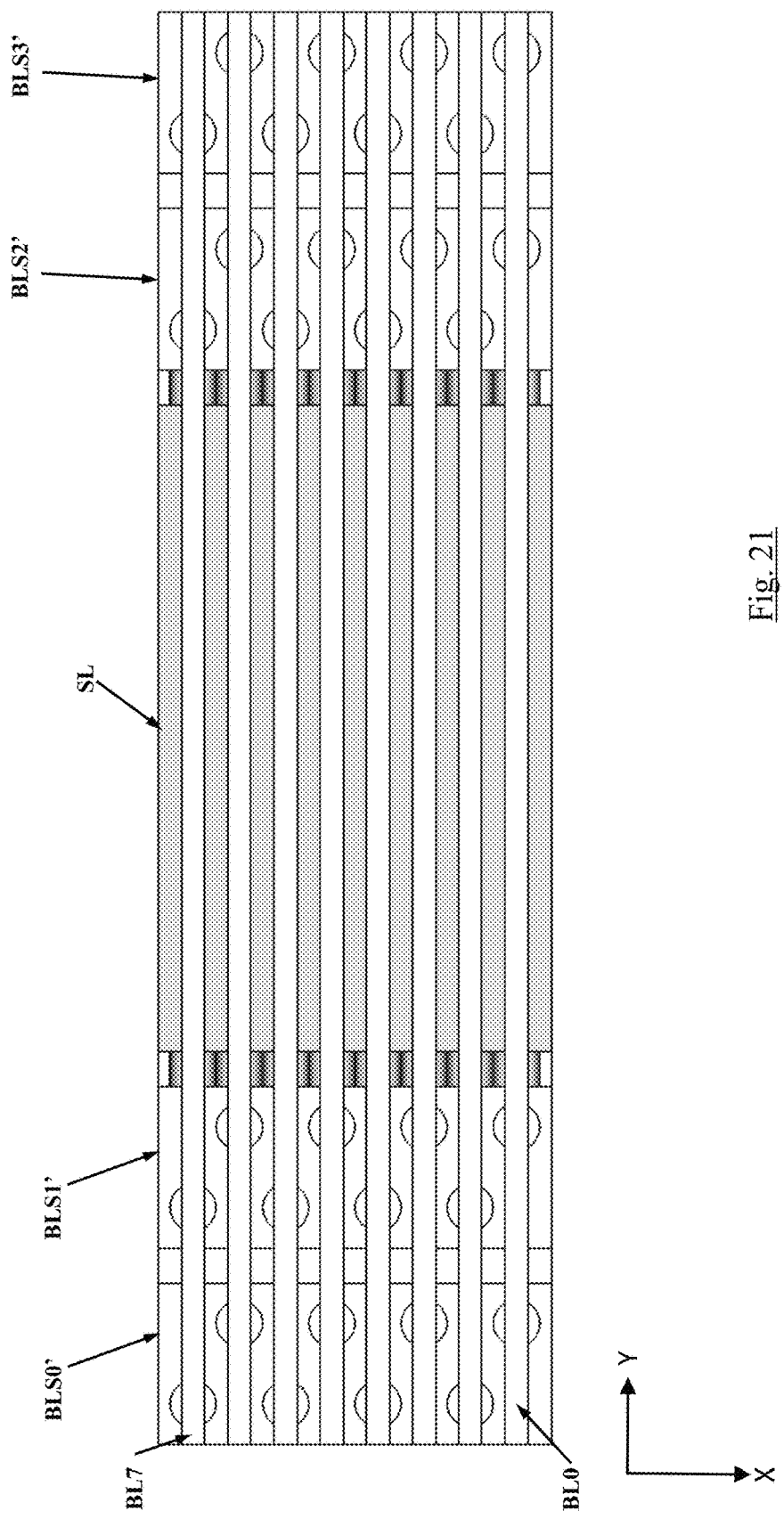
Figure 22:
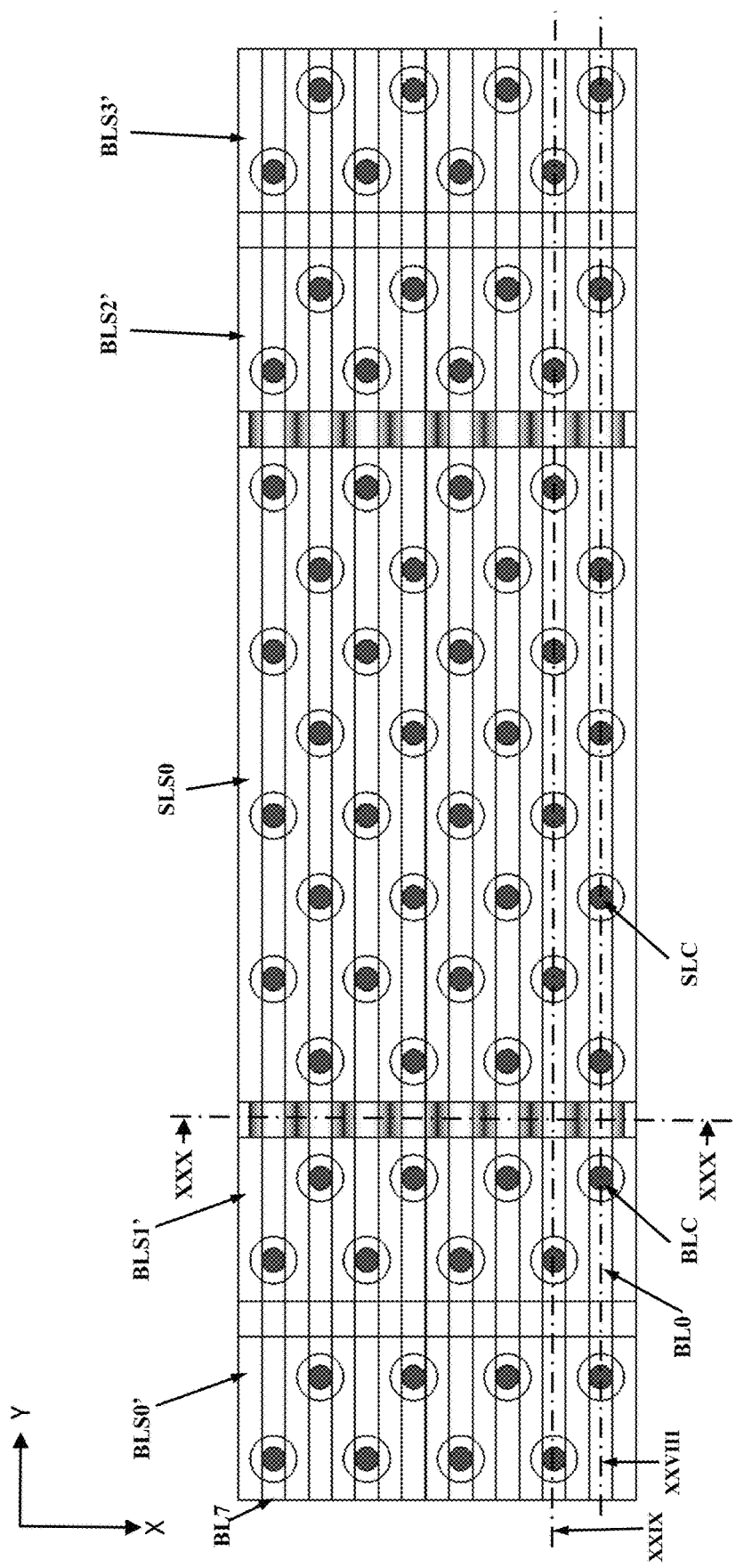
Figure 23:
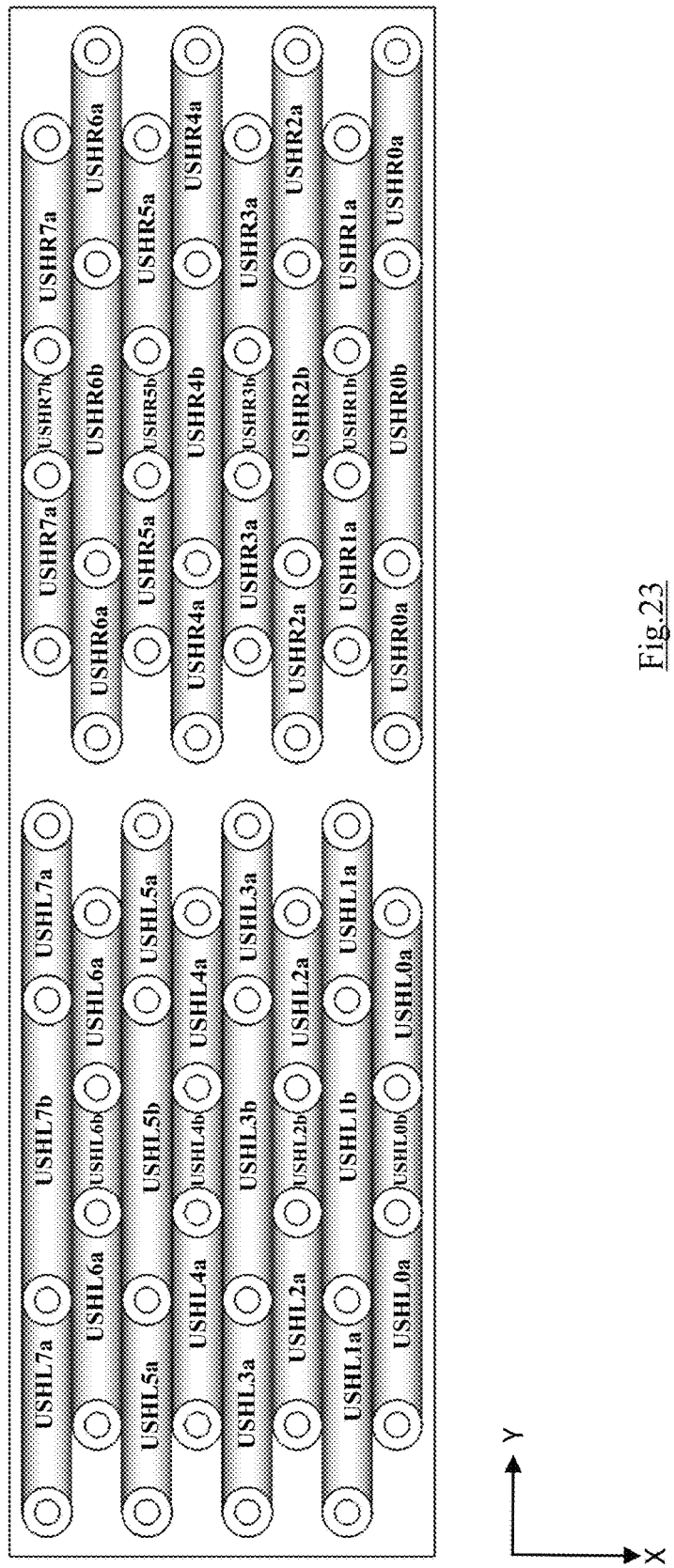
Figure 24:
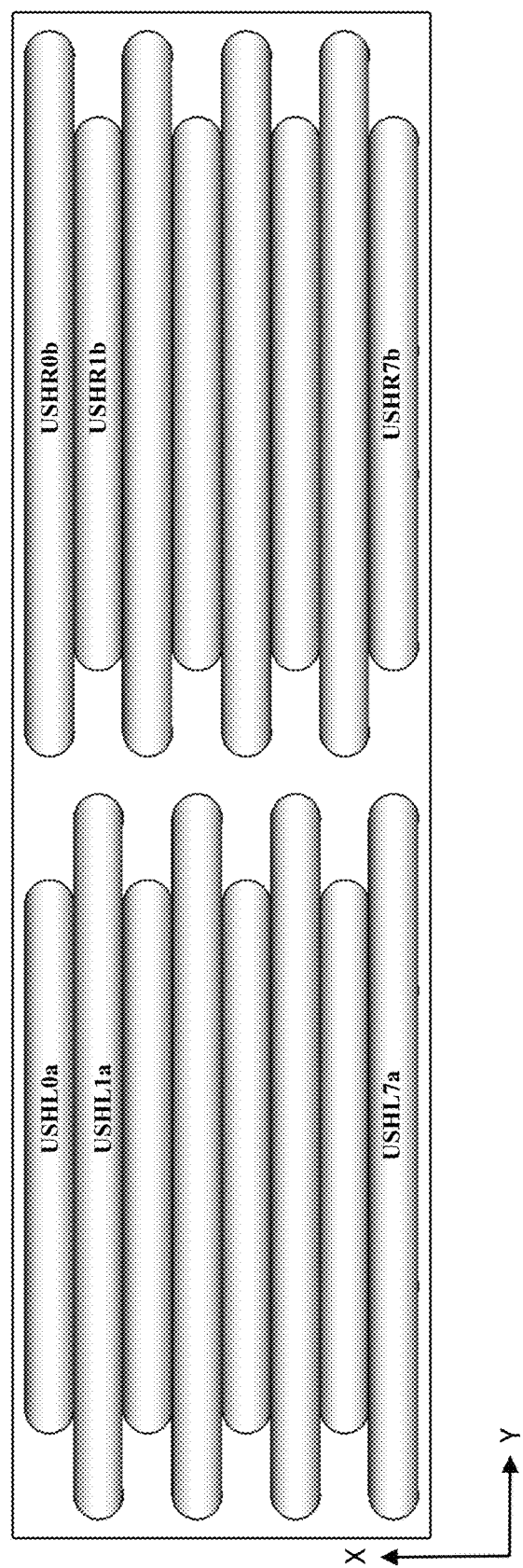
Figure 25:
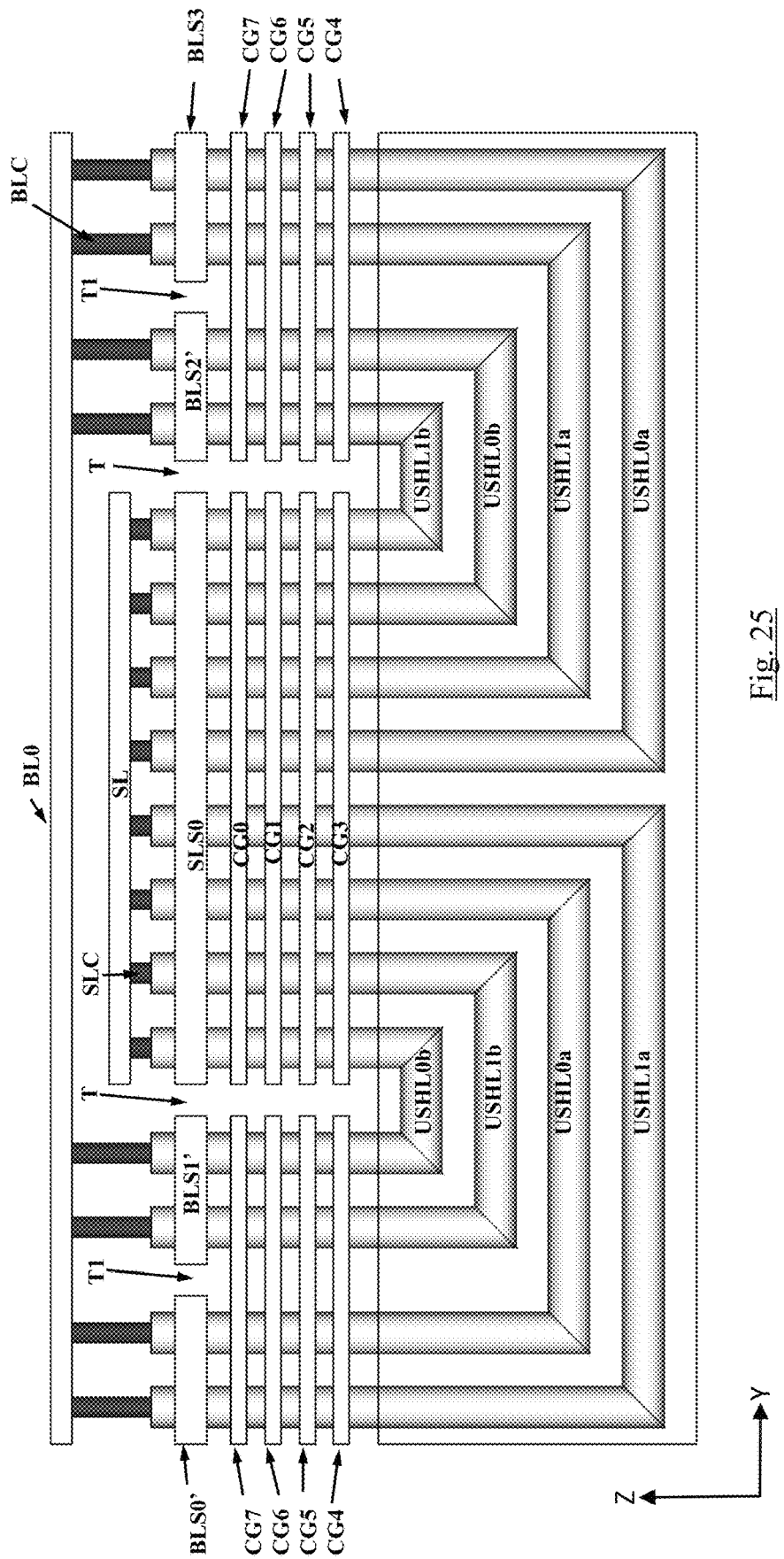
Figure 26:
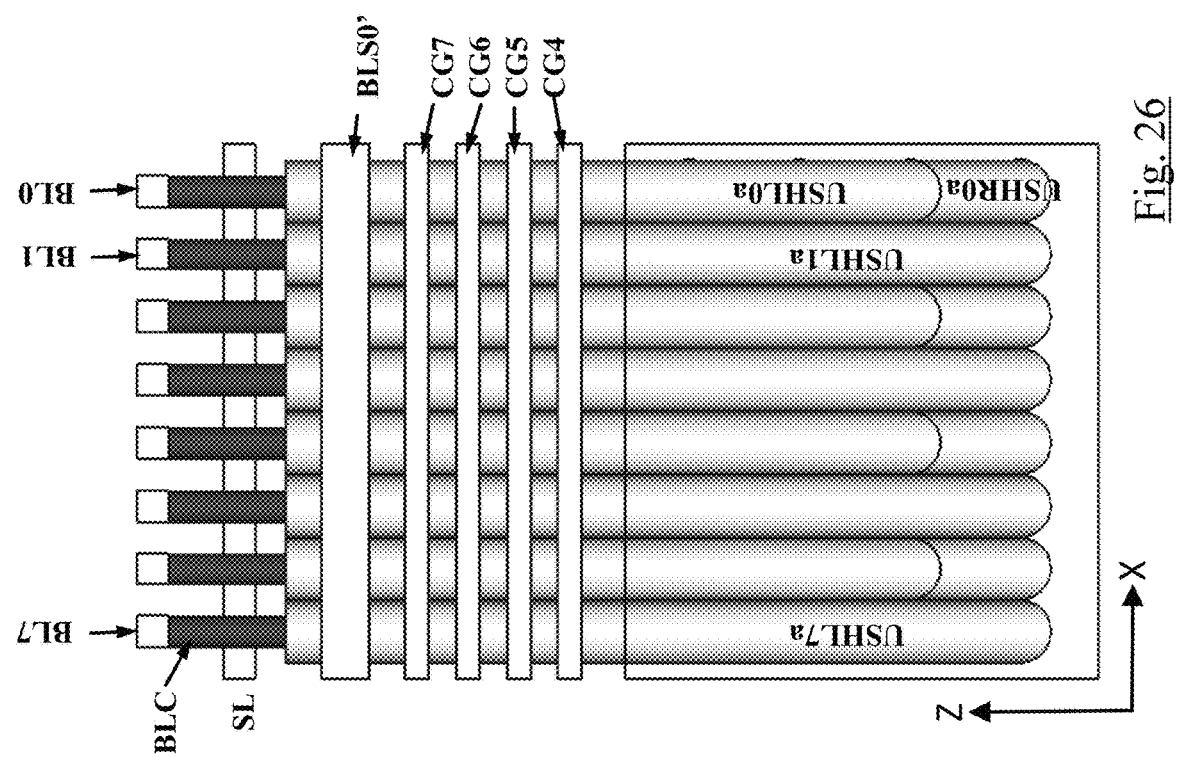
Figure 27:
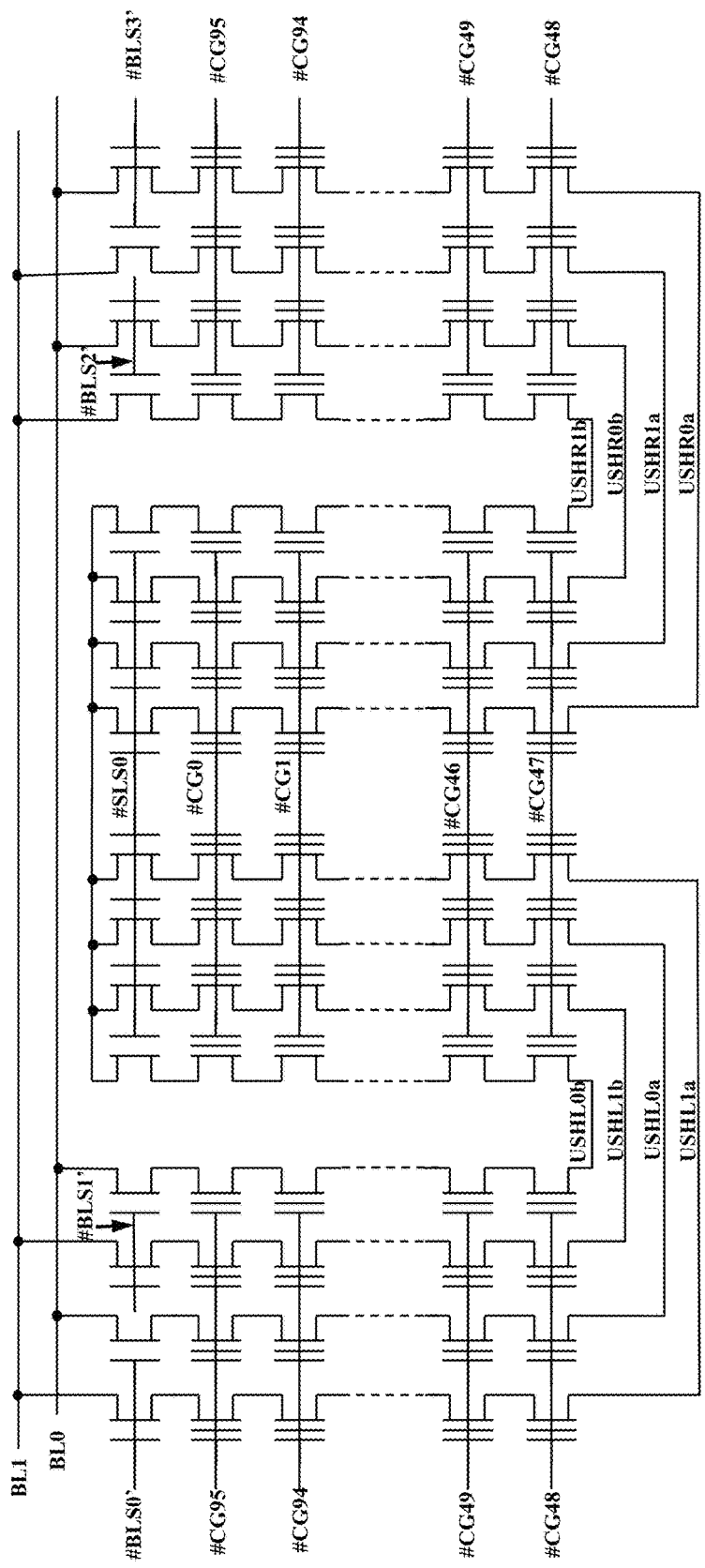
Figure 28:
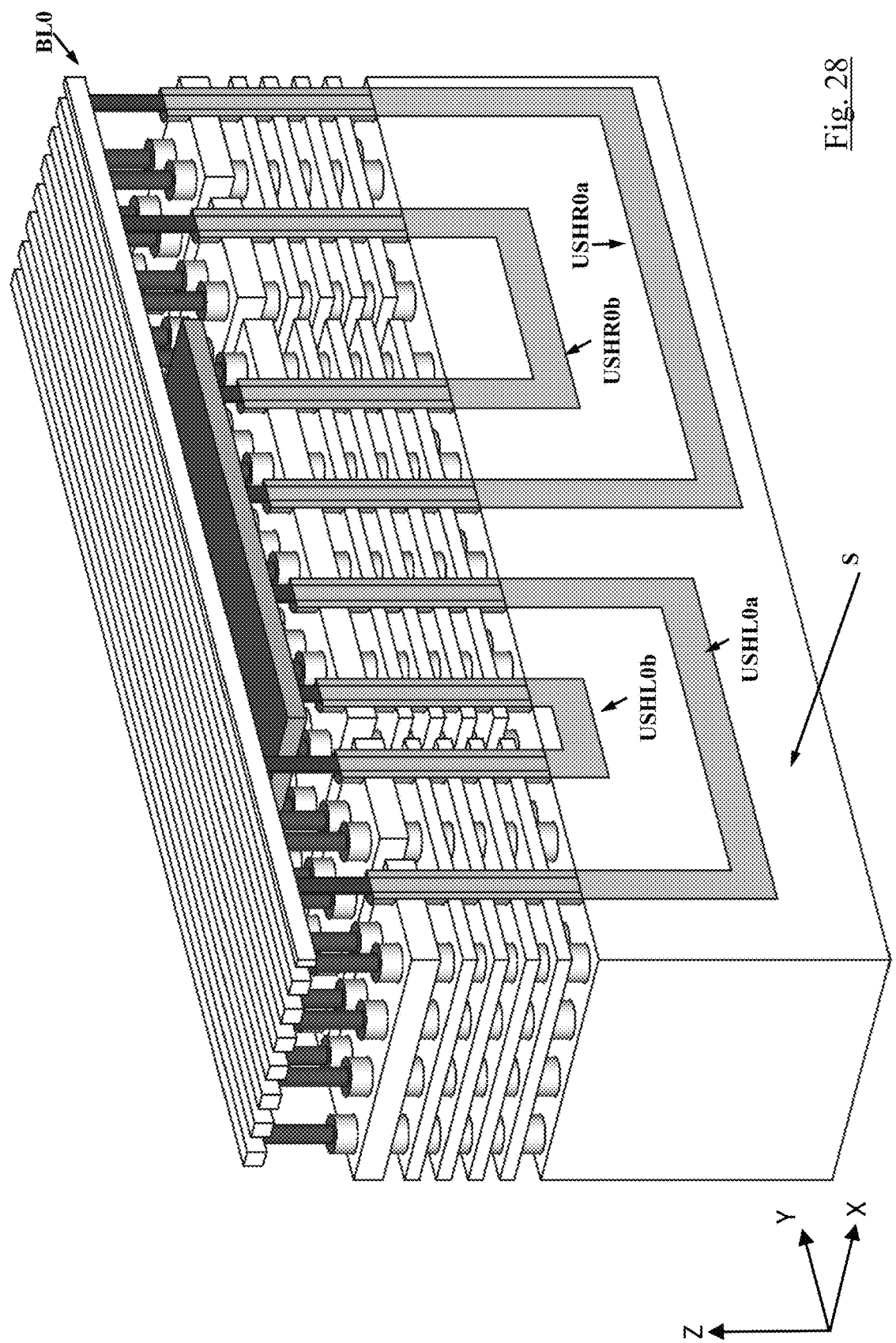
Figure 29:
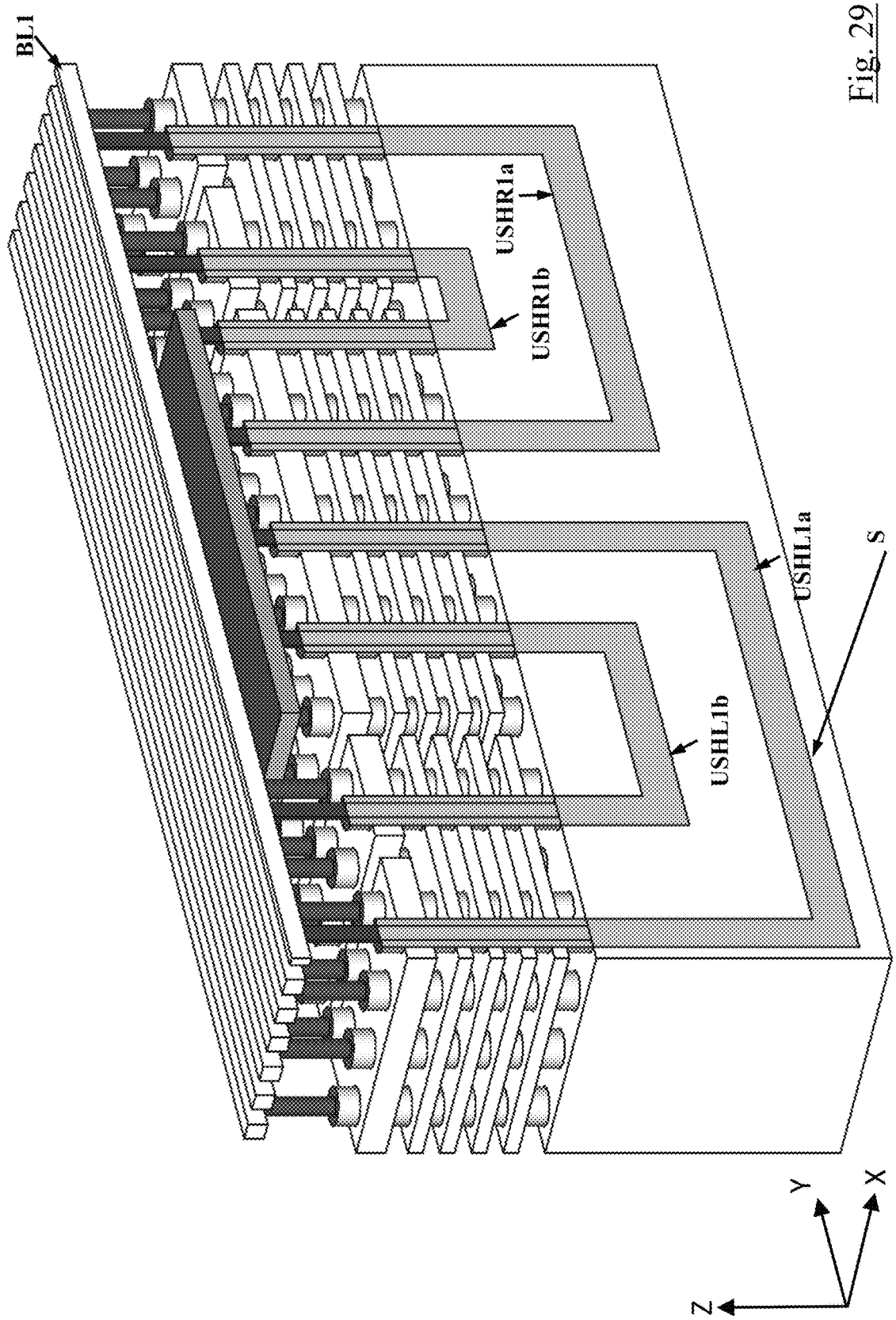
Figure 31:
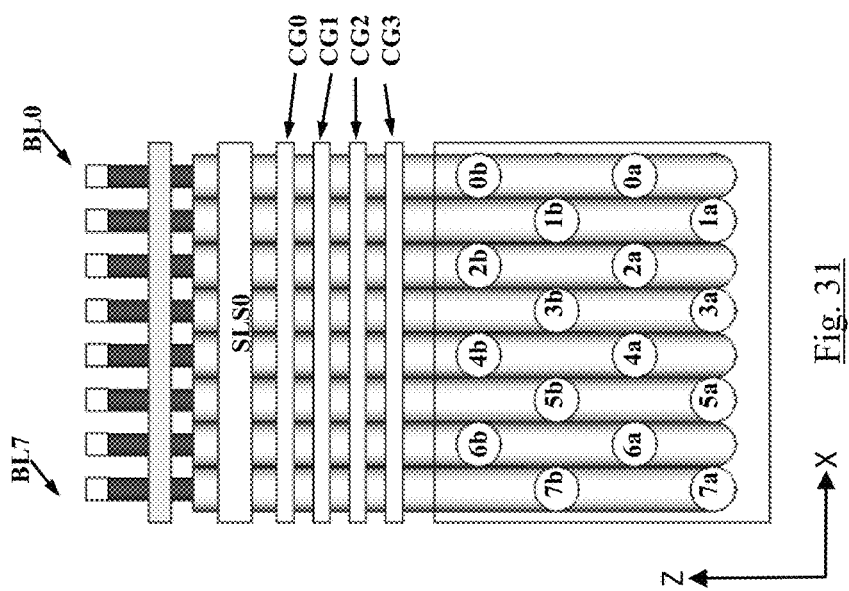
Figure 30:
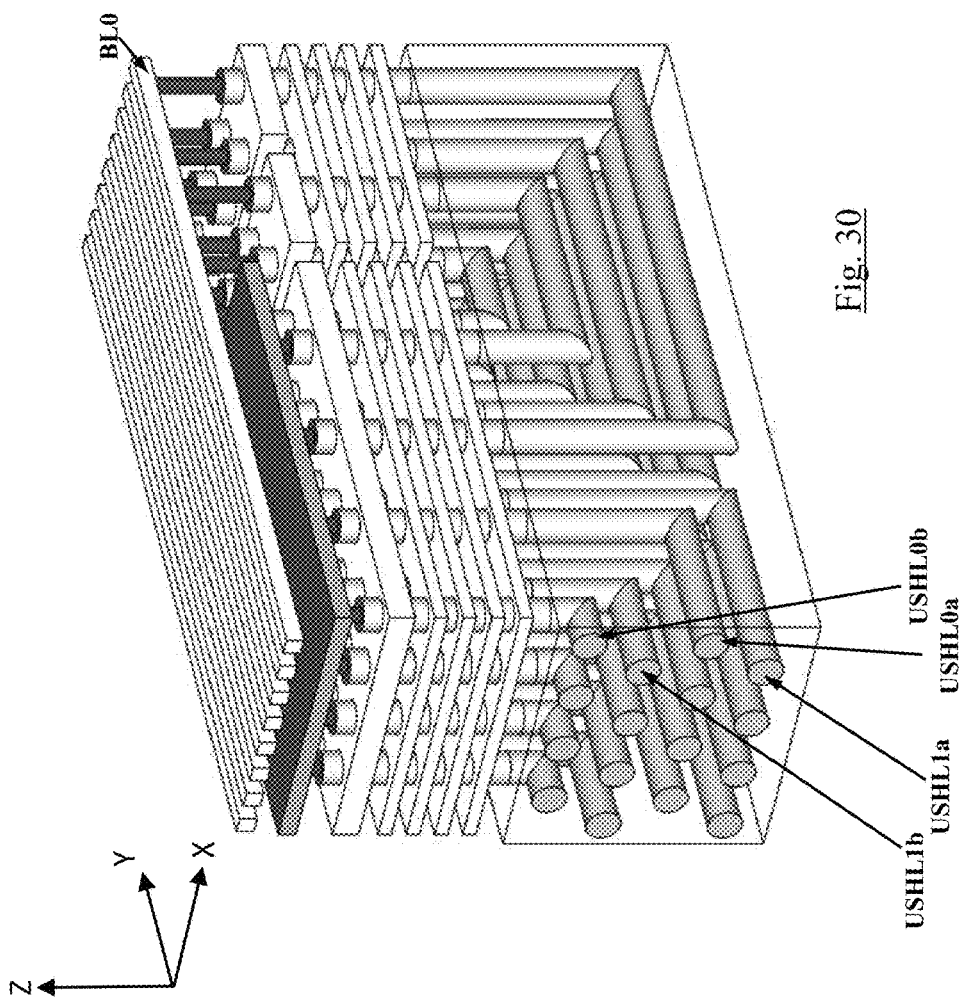
Figure 32:
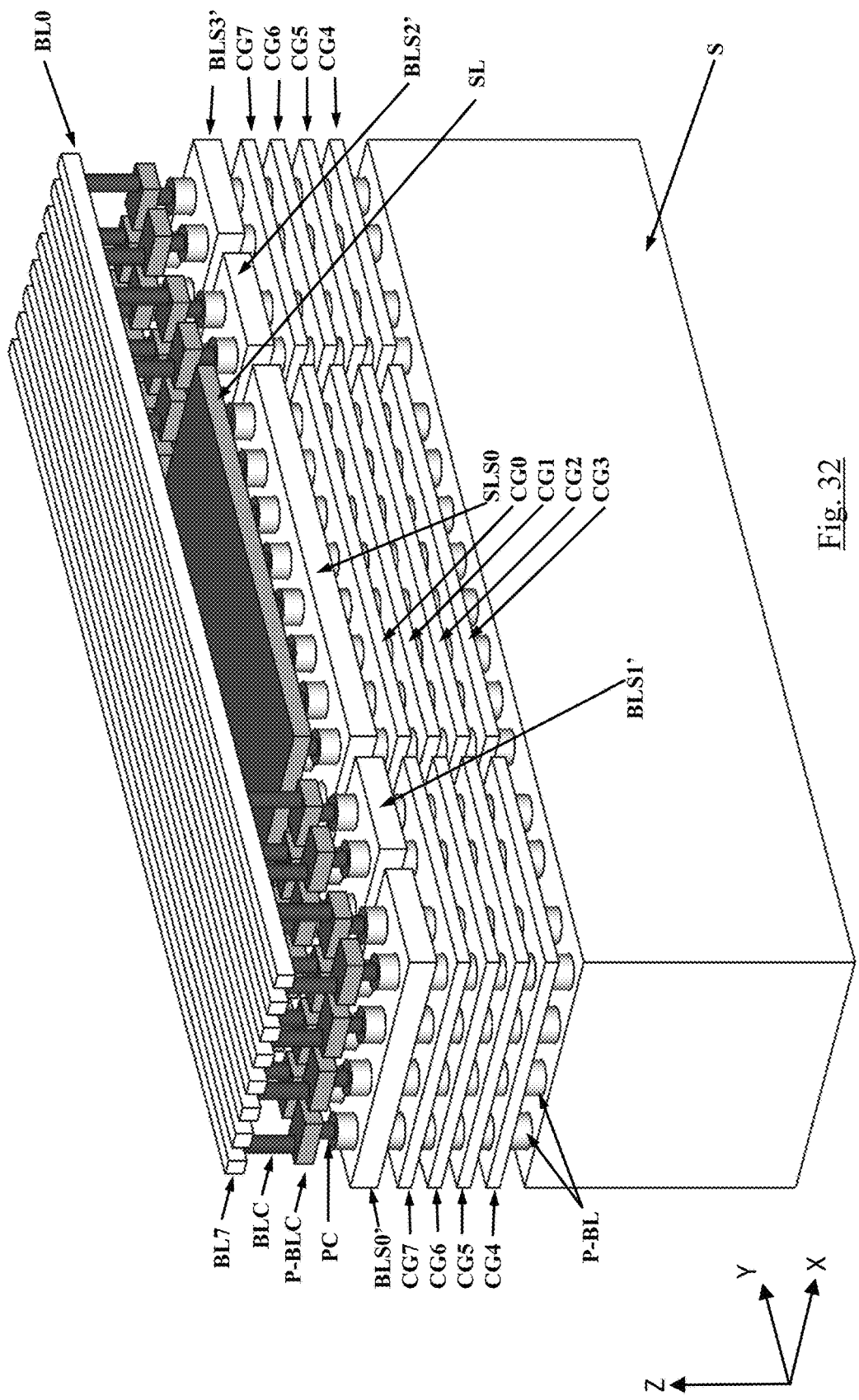
Figure 33:
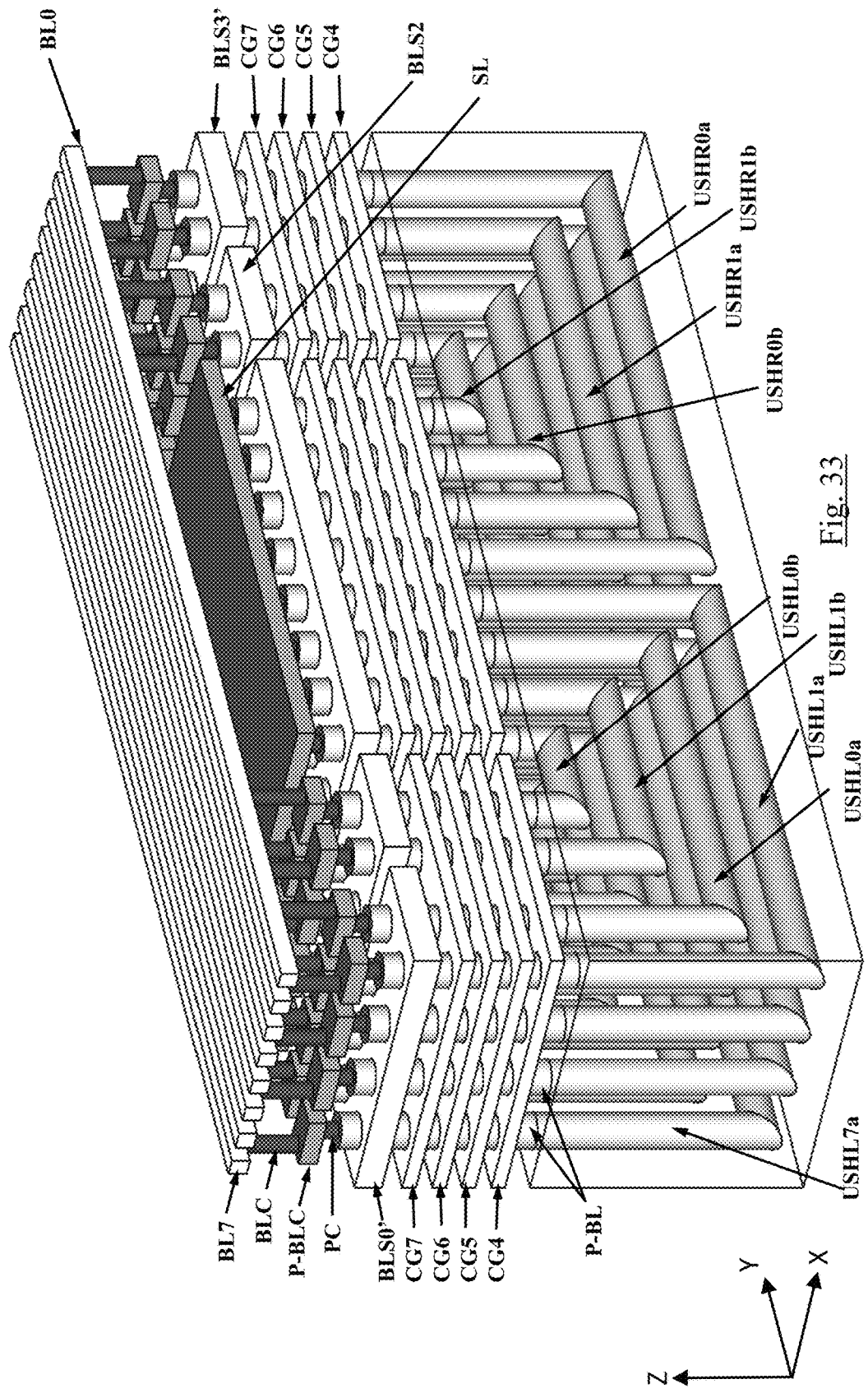
Figure 34:
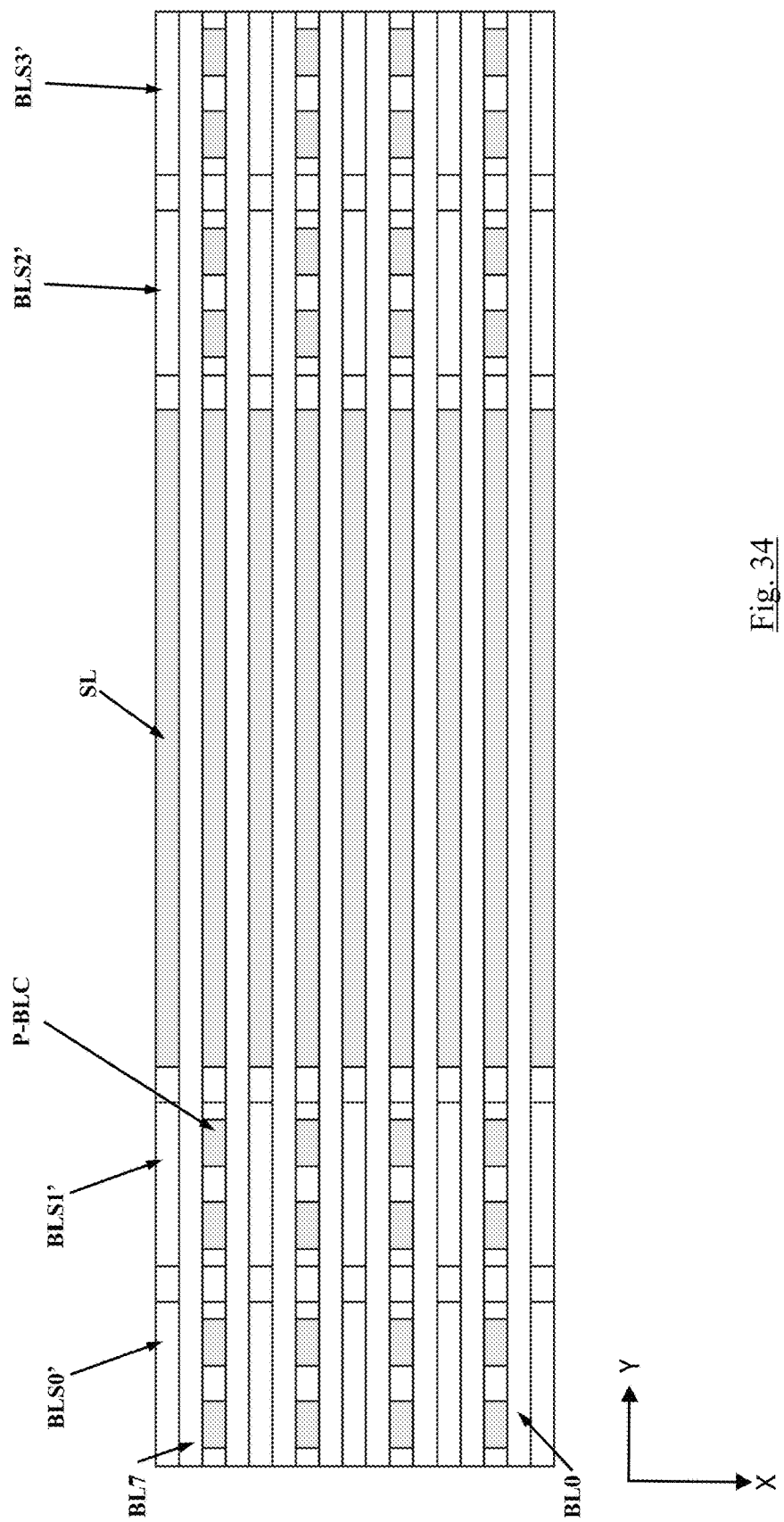
Figure 35:
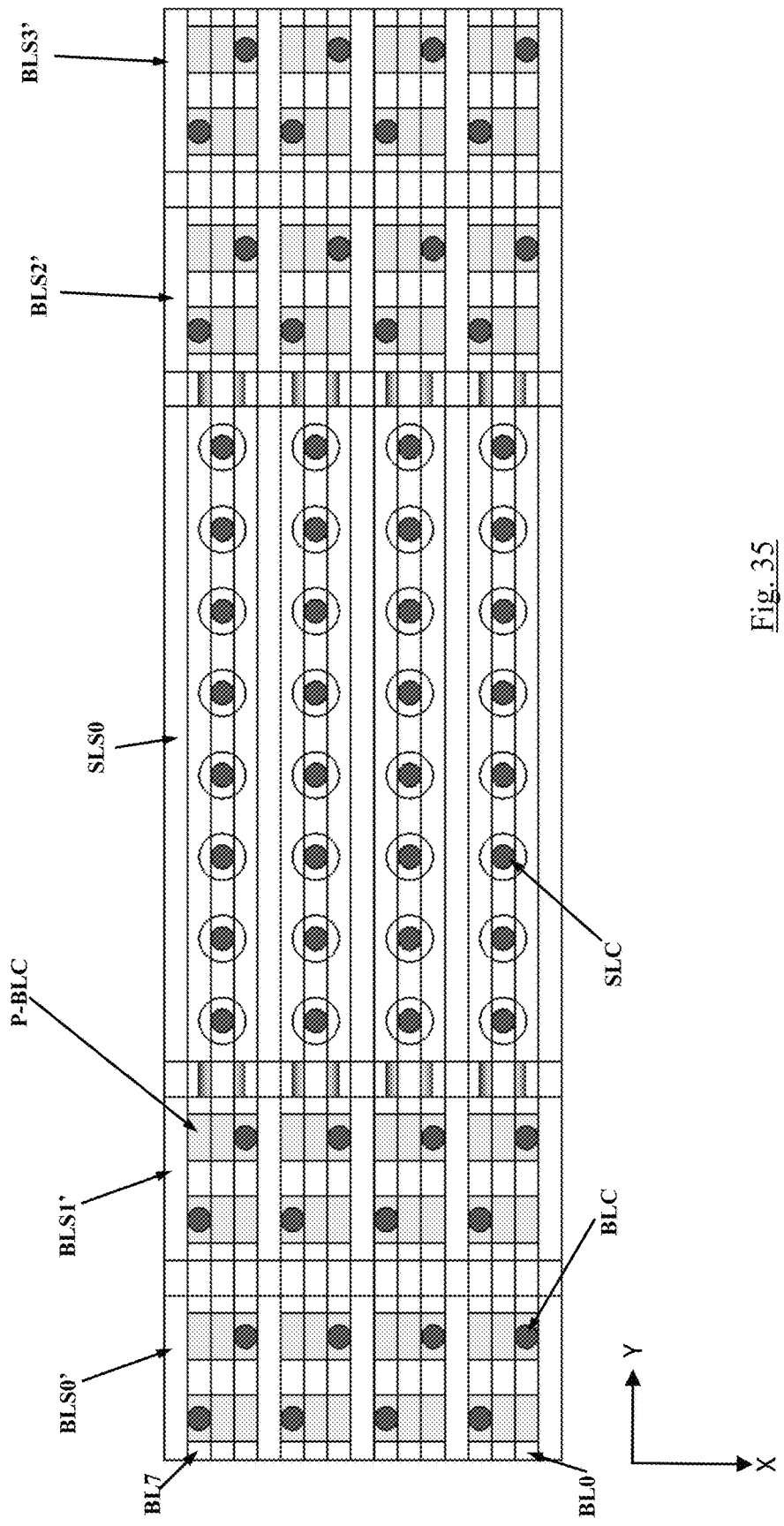
Figure 36:
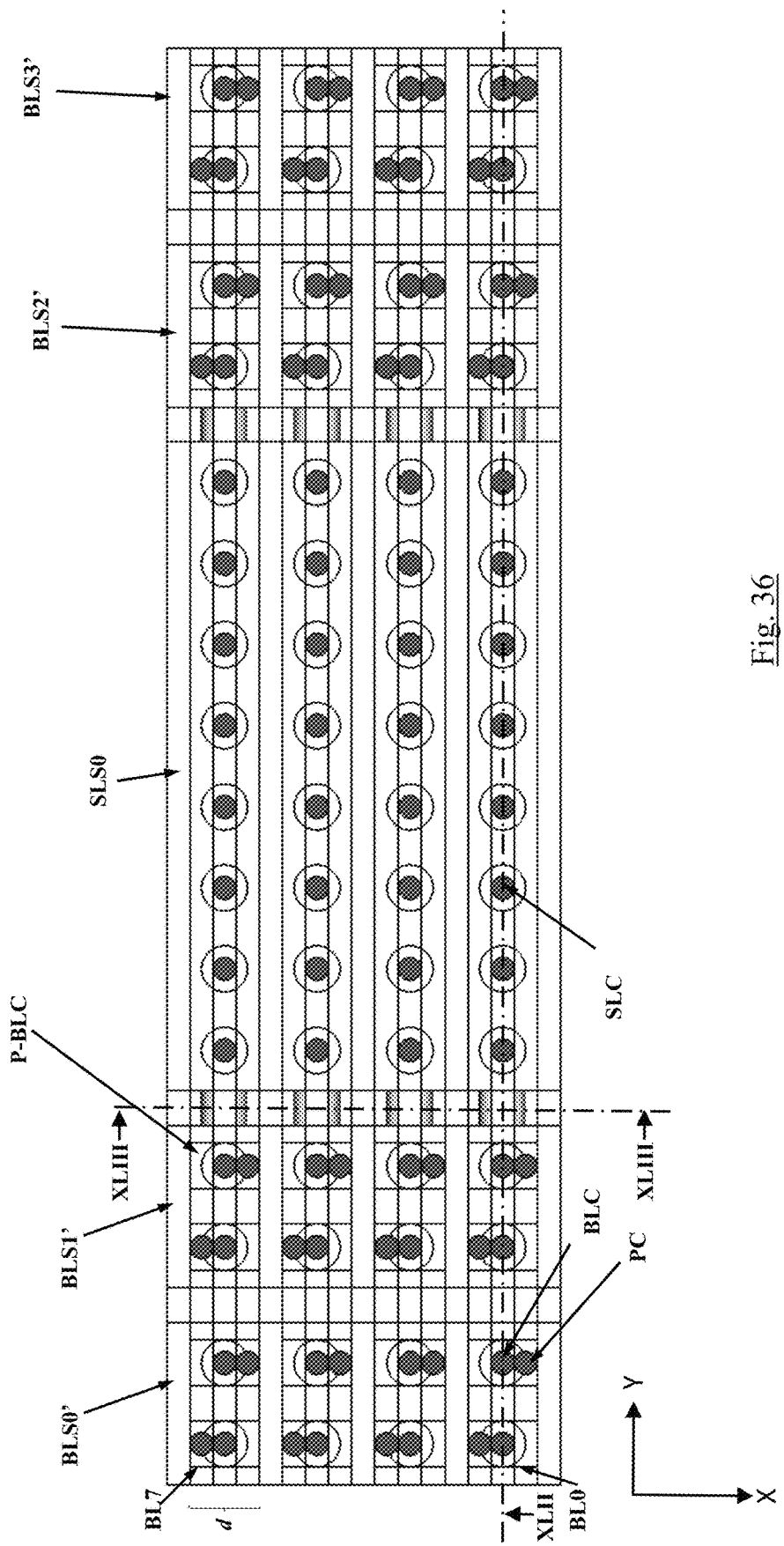
Figure 37:
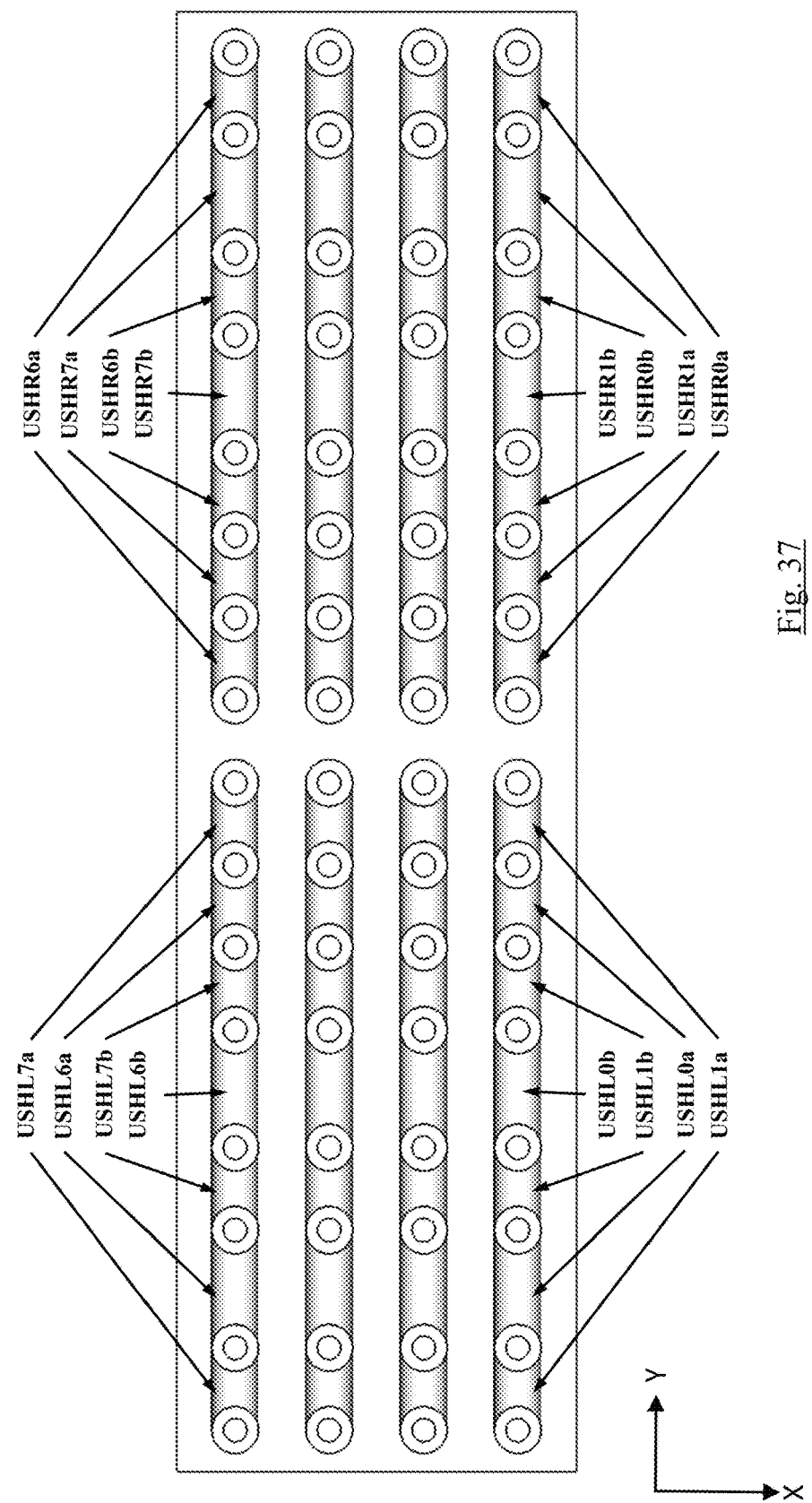
Figure 38:
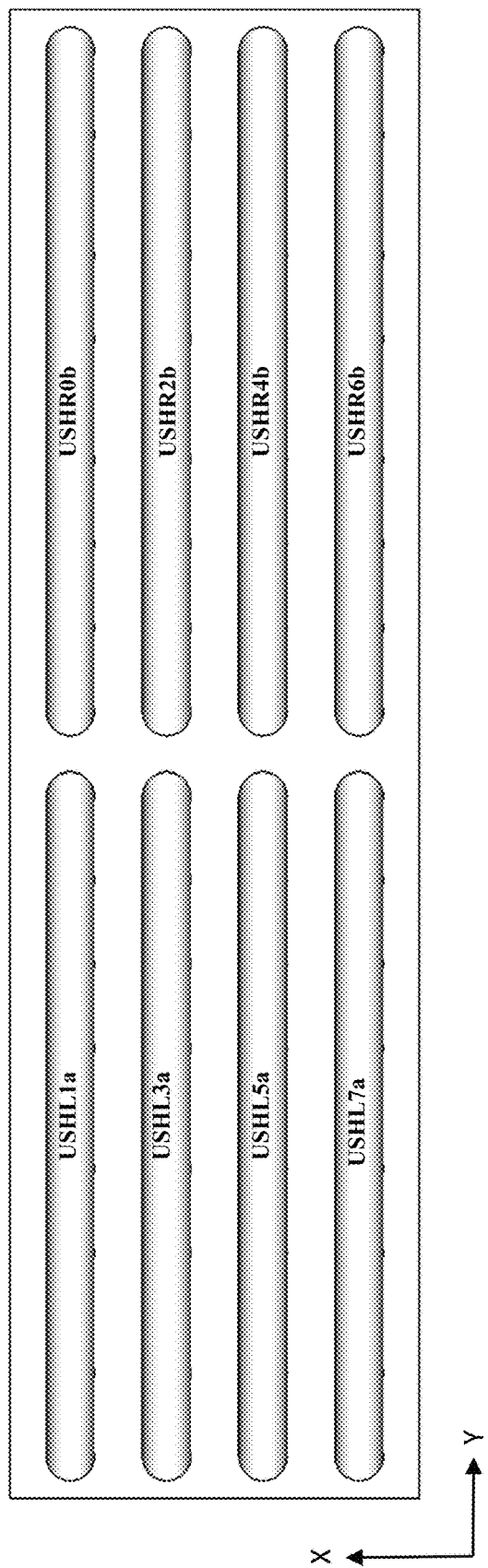
Figure 39:
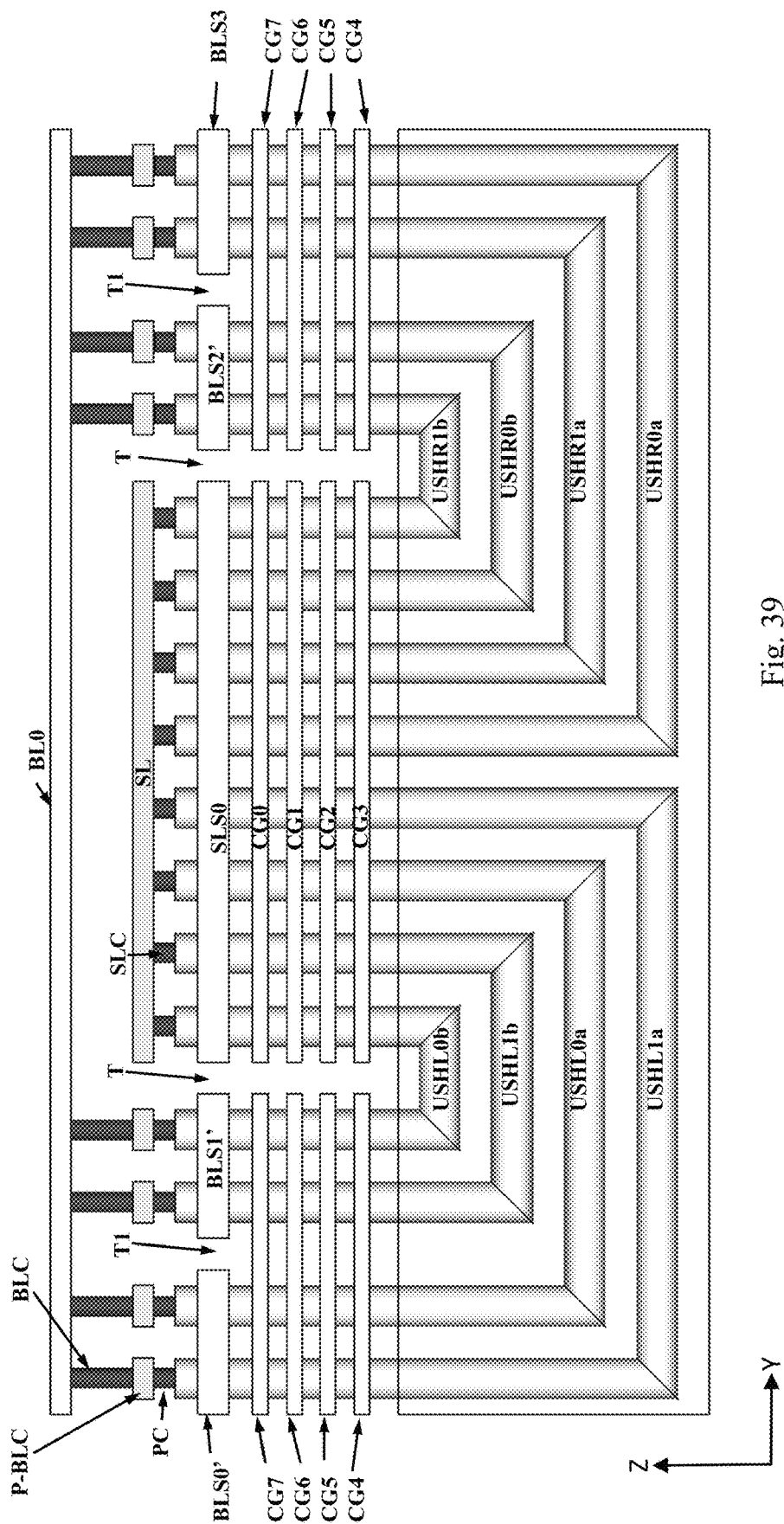
Figure 40:
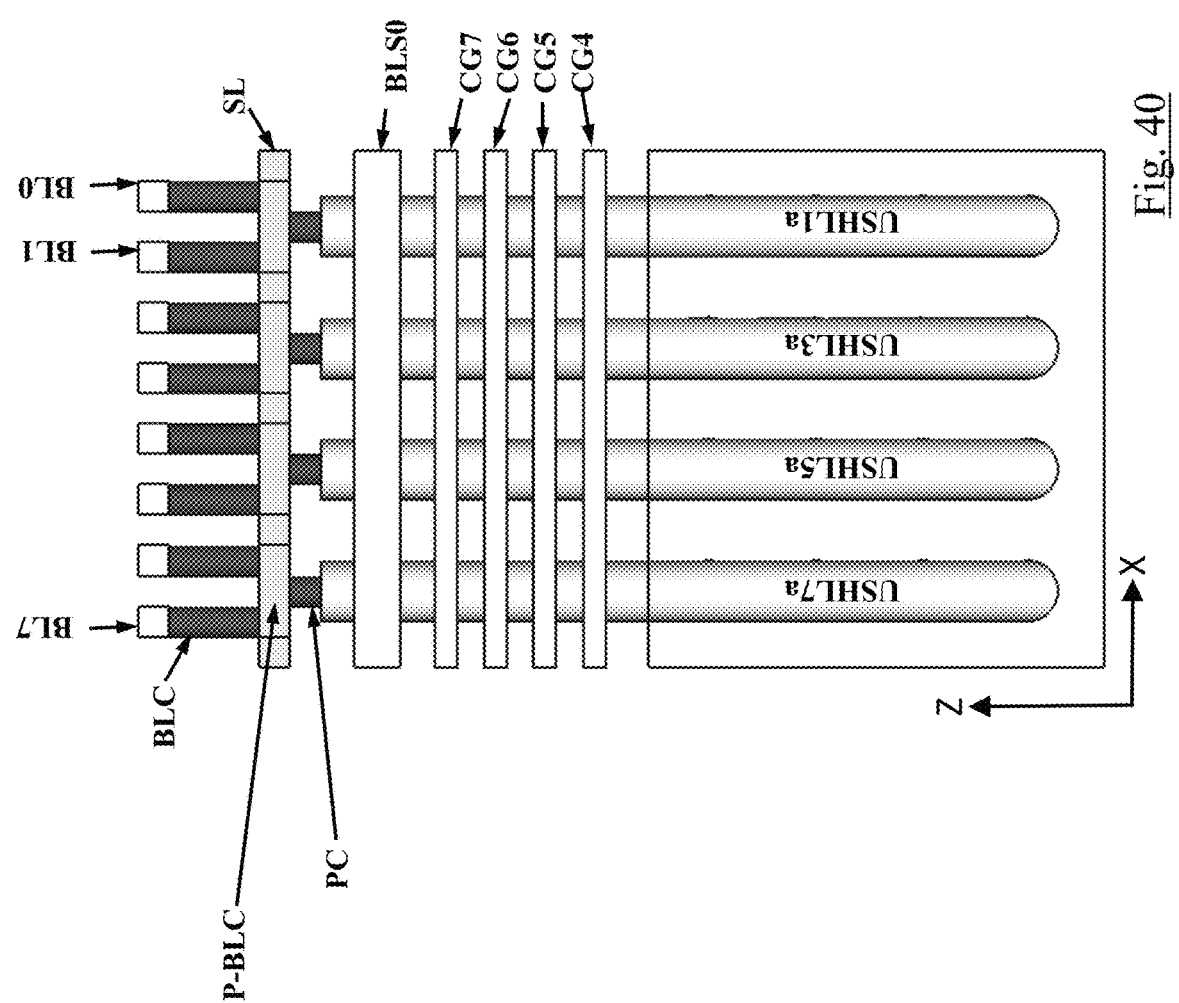
Figure 41:
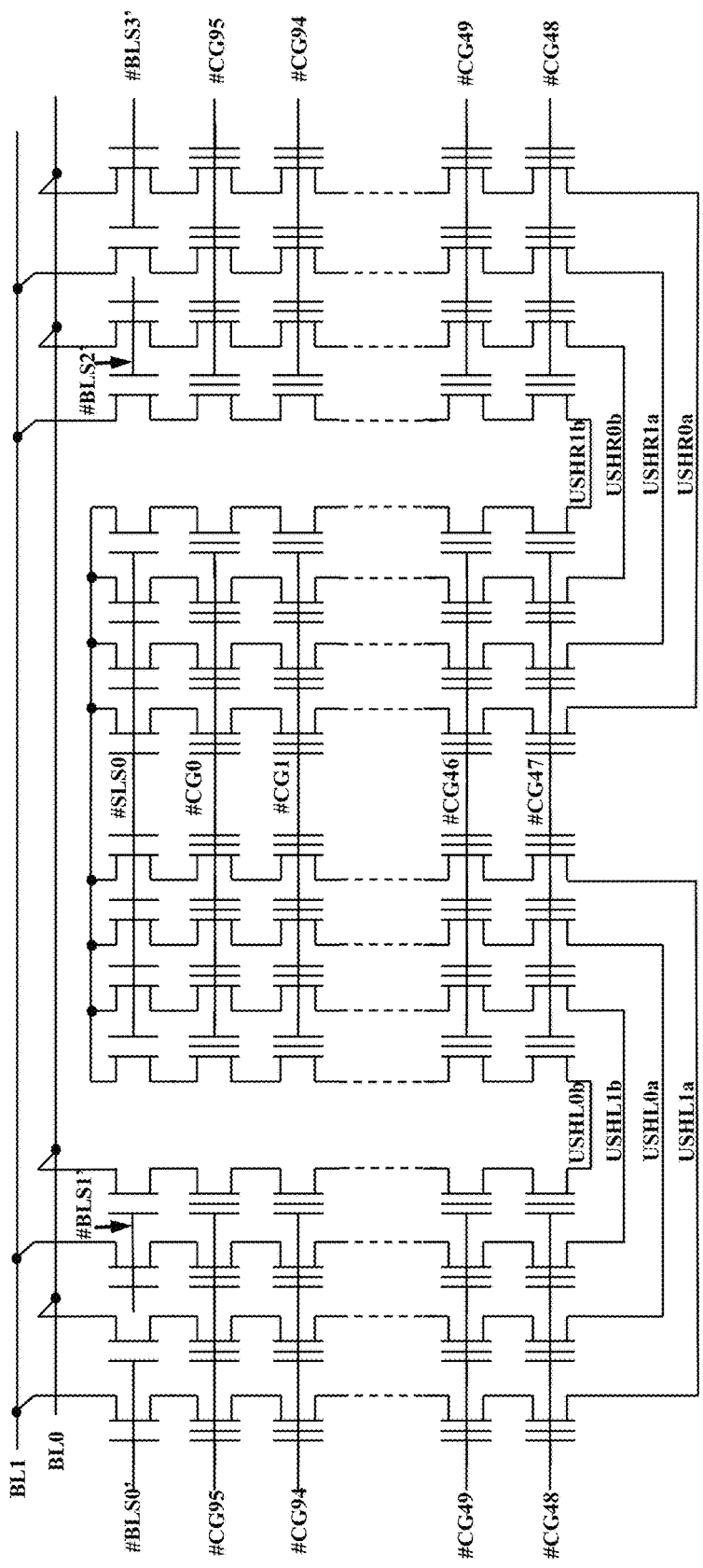
Figure 44:
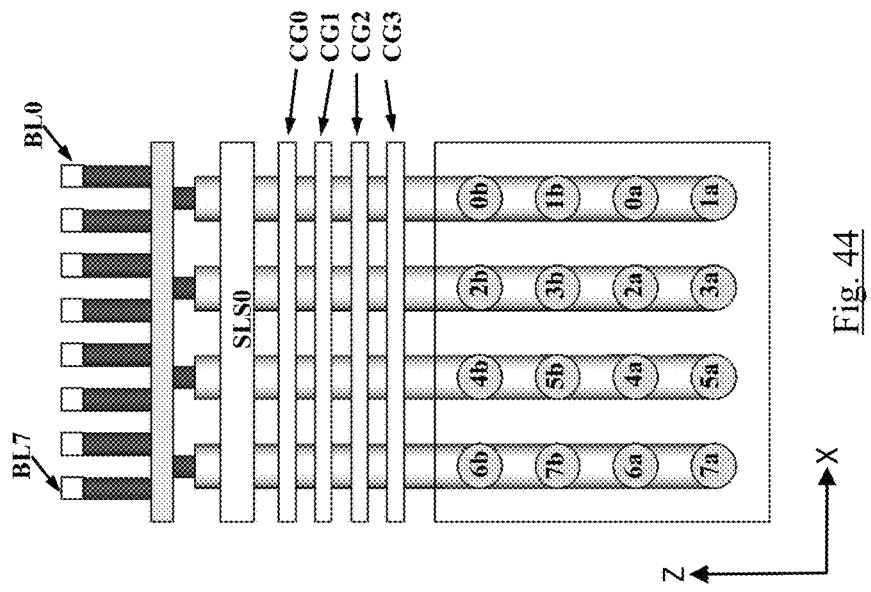
Figure 43:
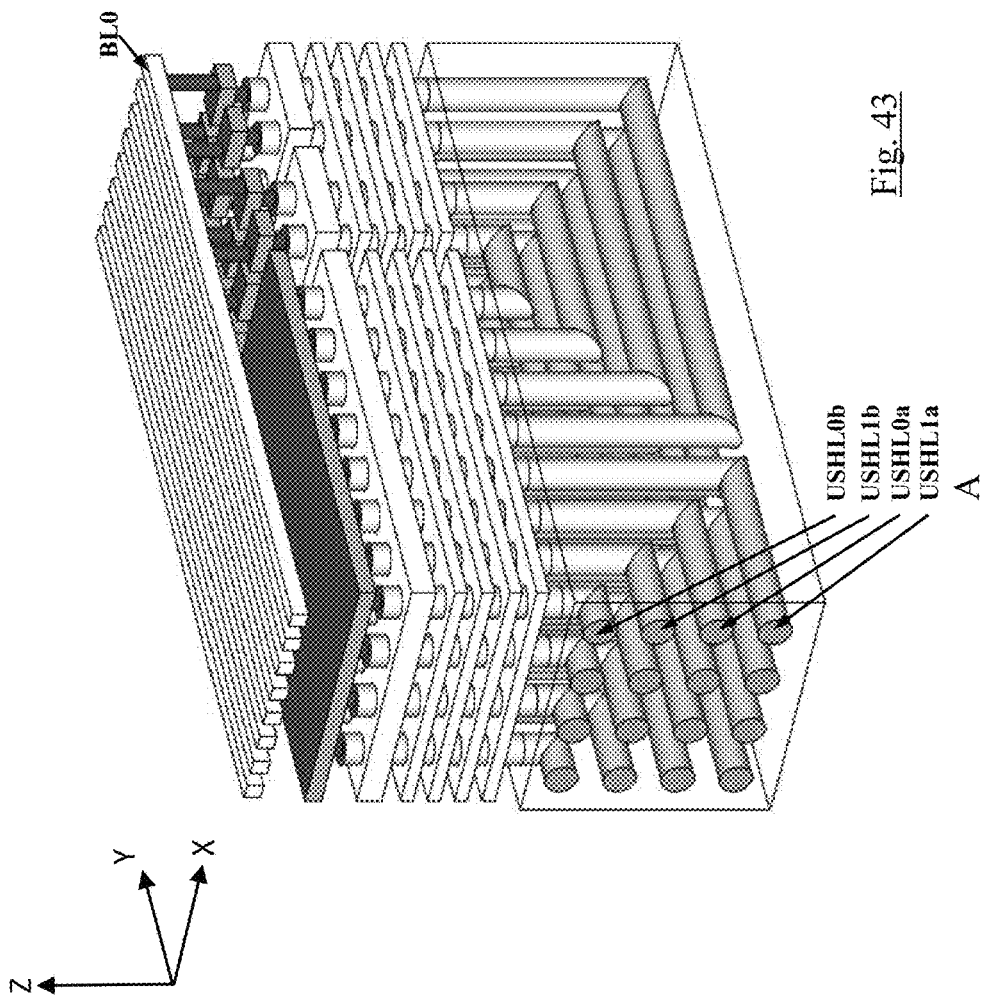
Figure 45:
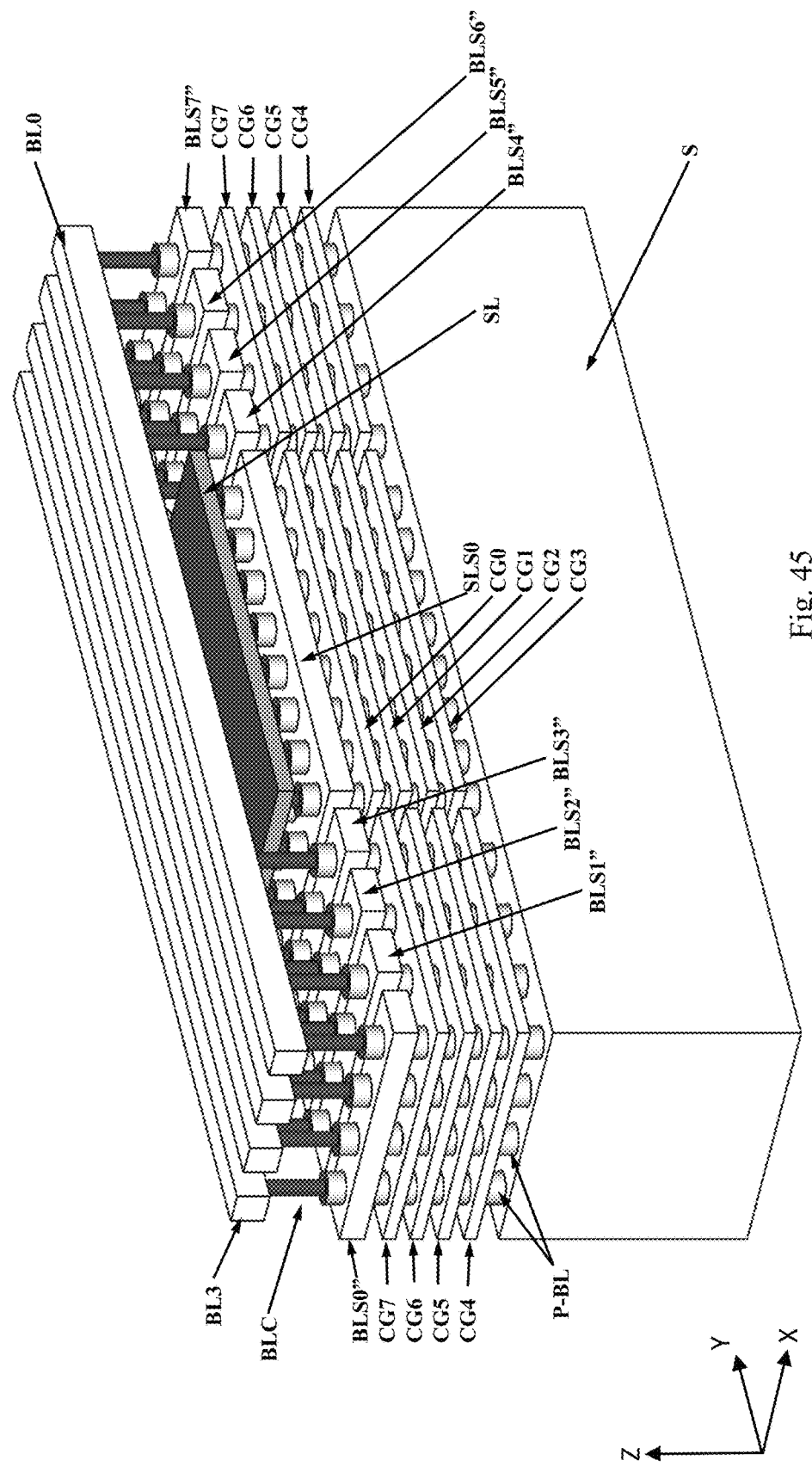
Figure 46:
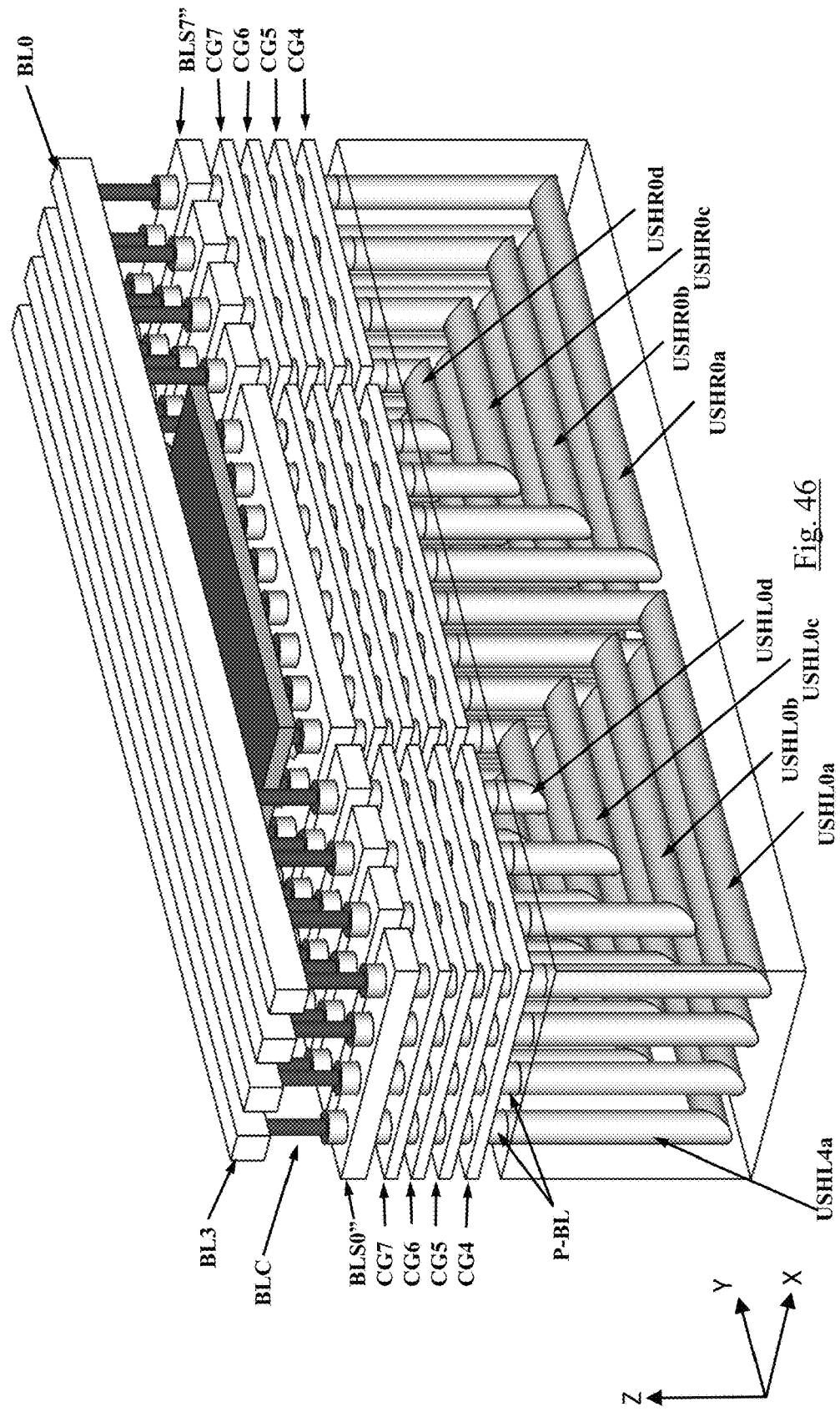
Figure 47:
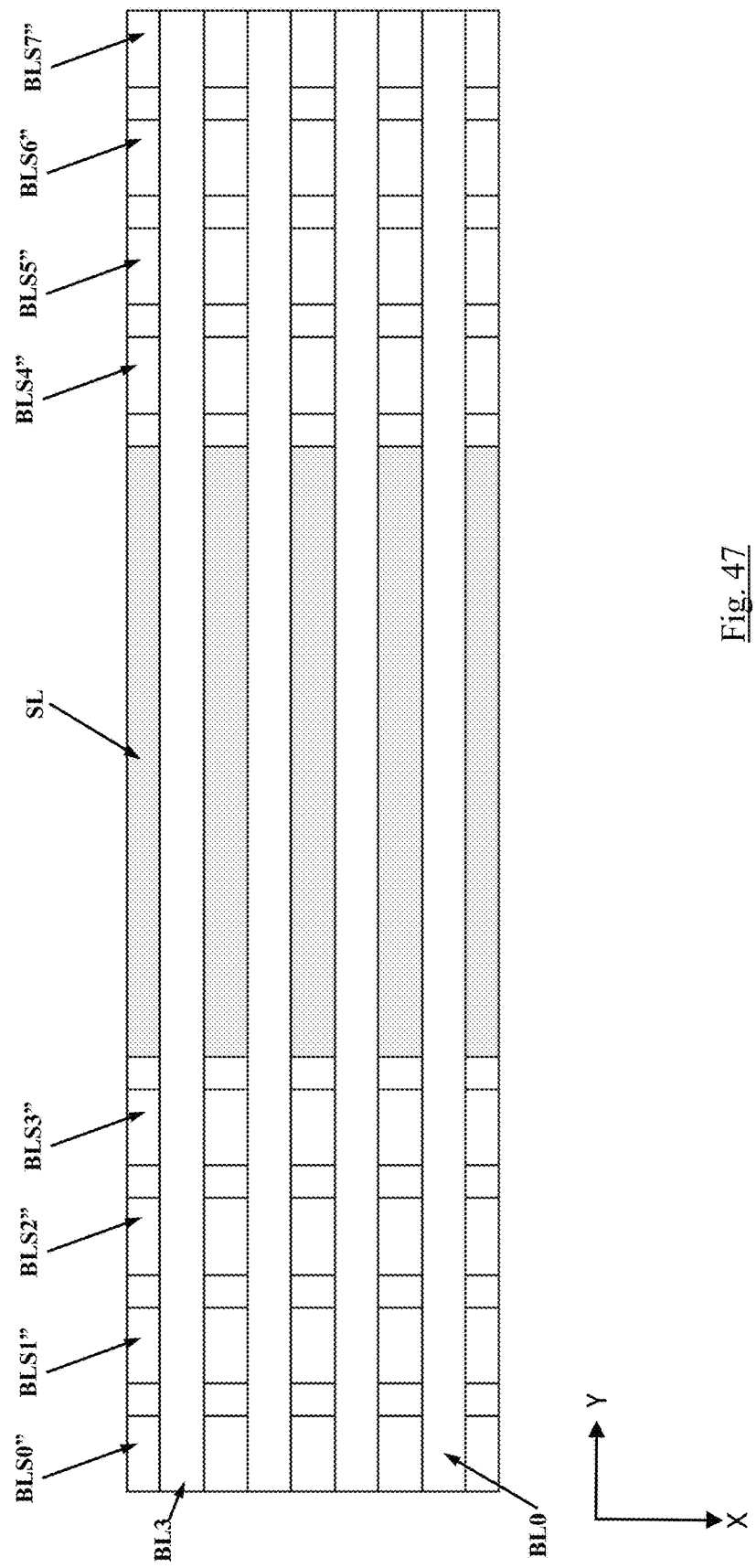
Figure 48:
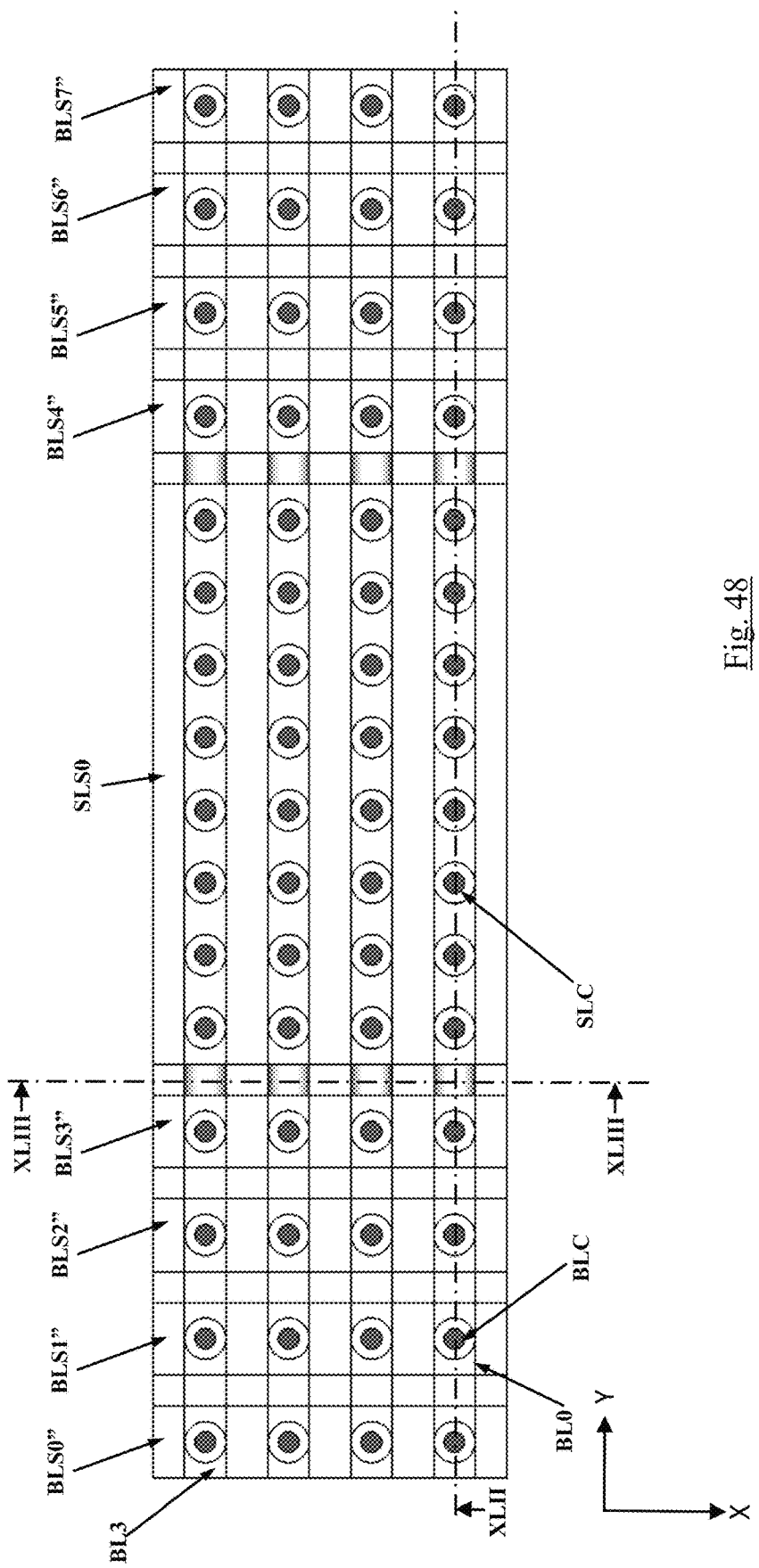
Figure 49:
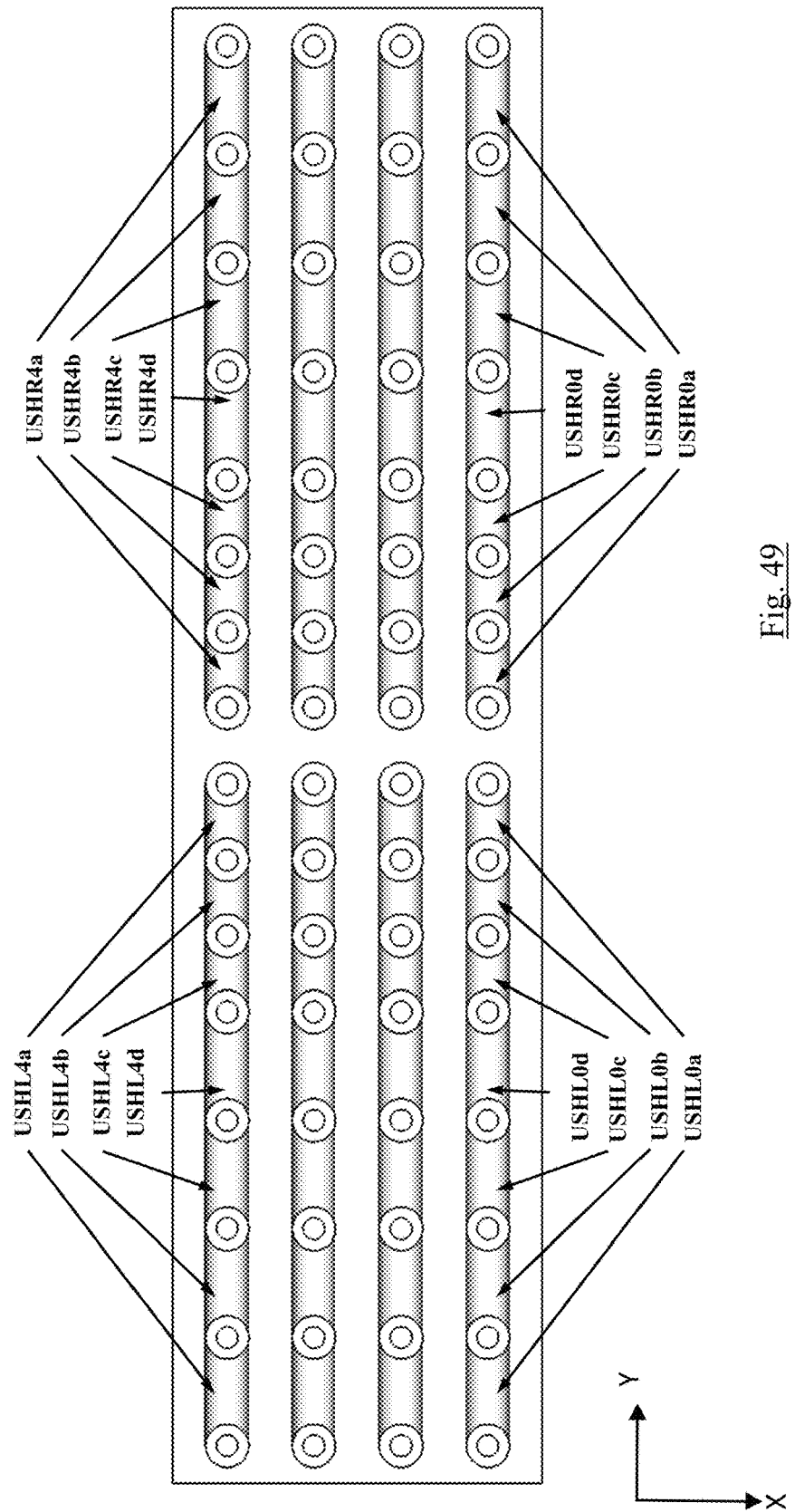
Figure 50:
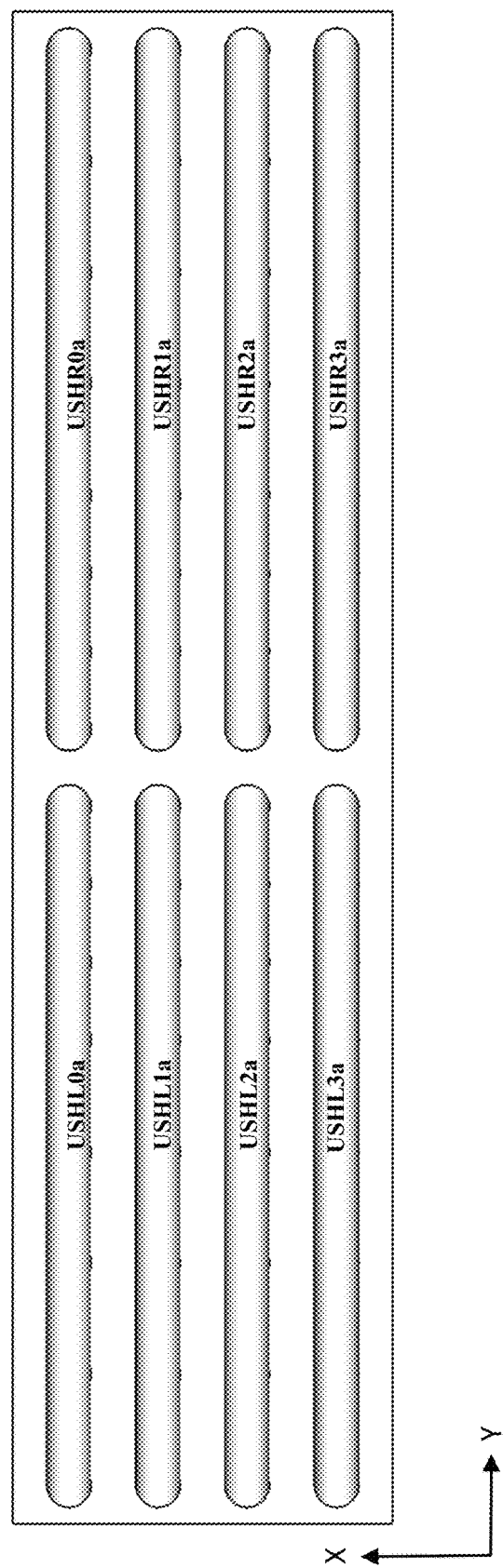
Figure 51:
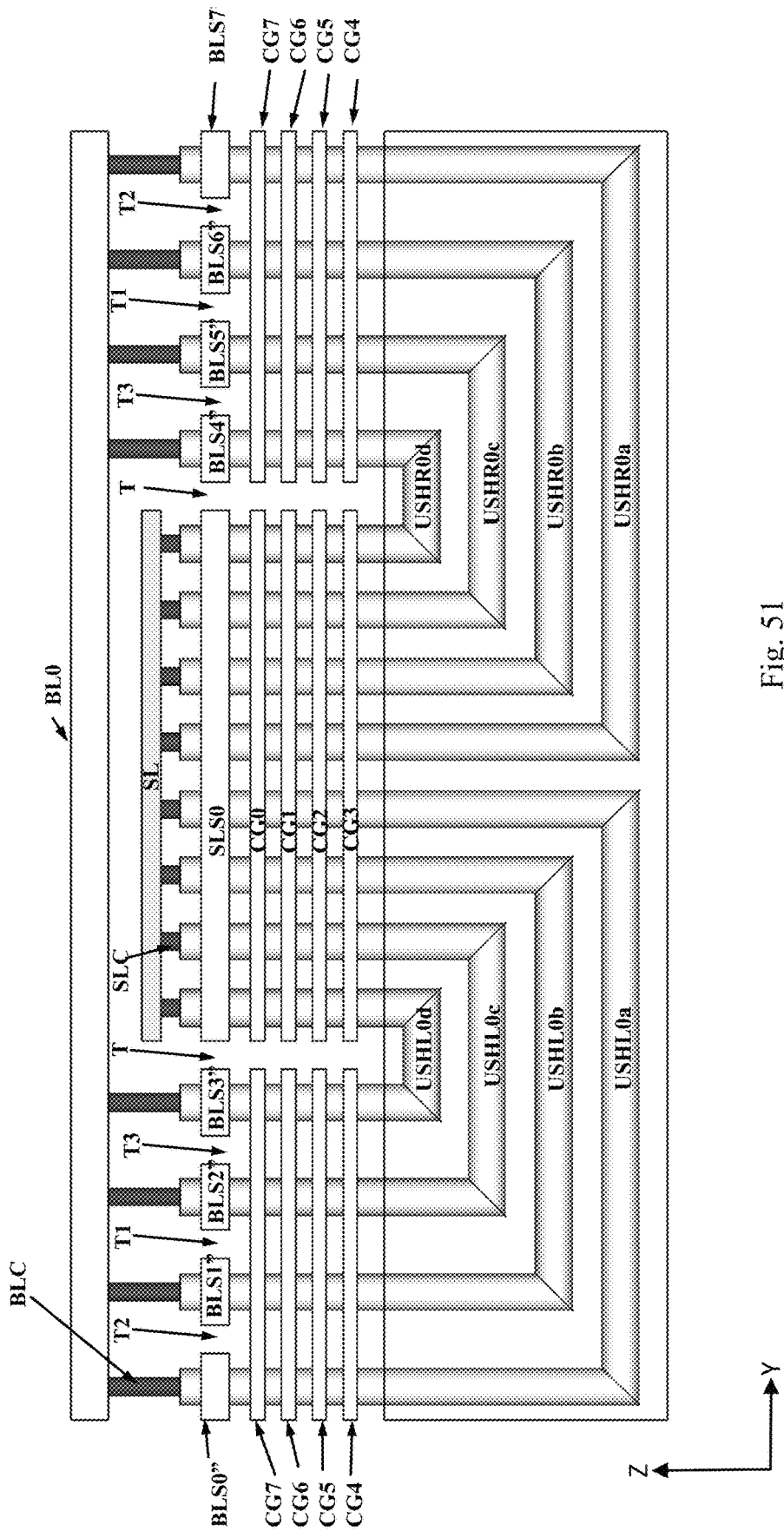
Figure 52:
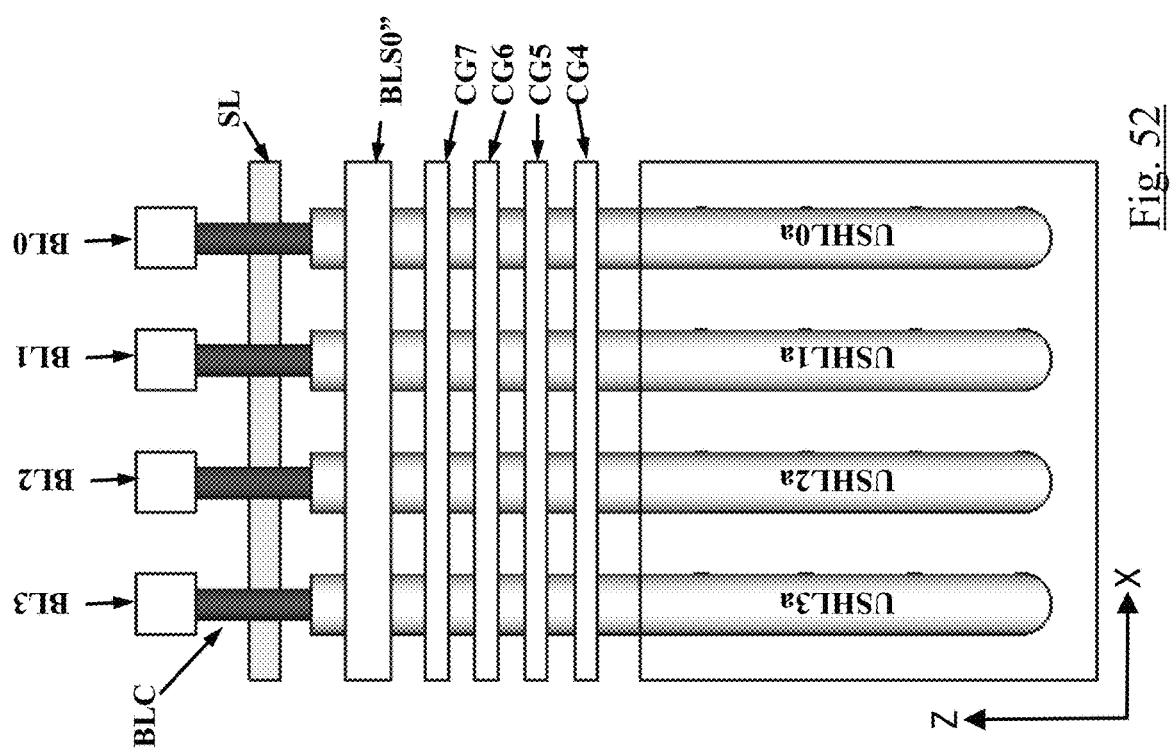
Figure 53:
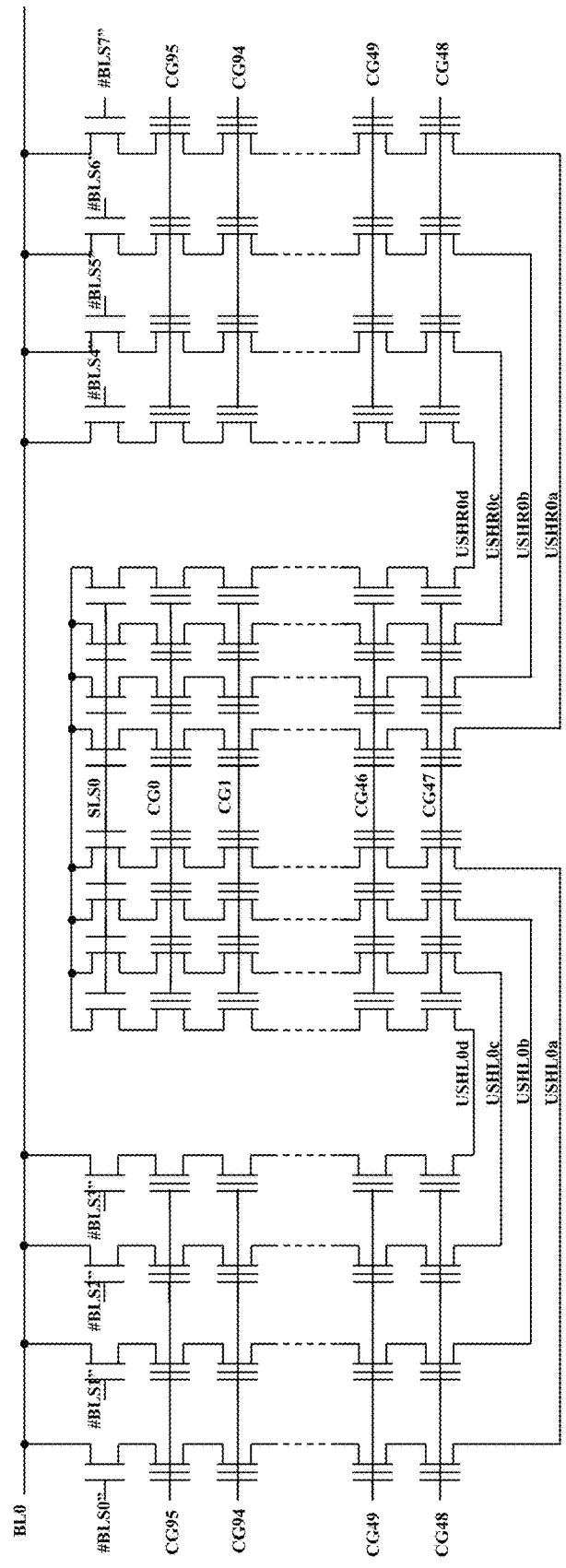
Figure 54:
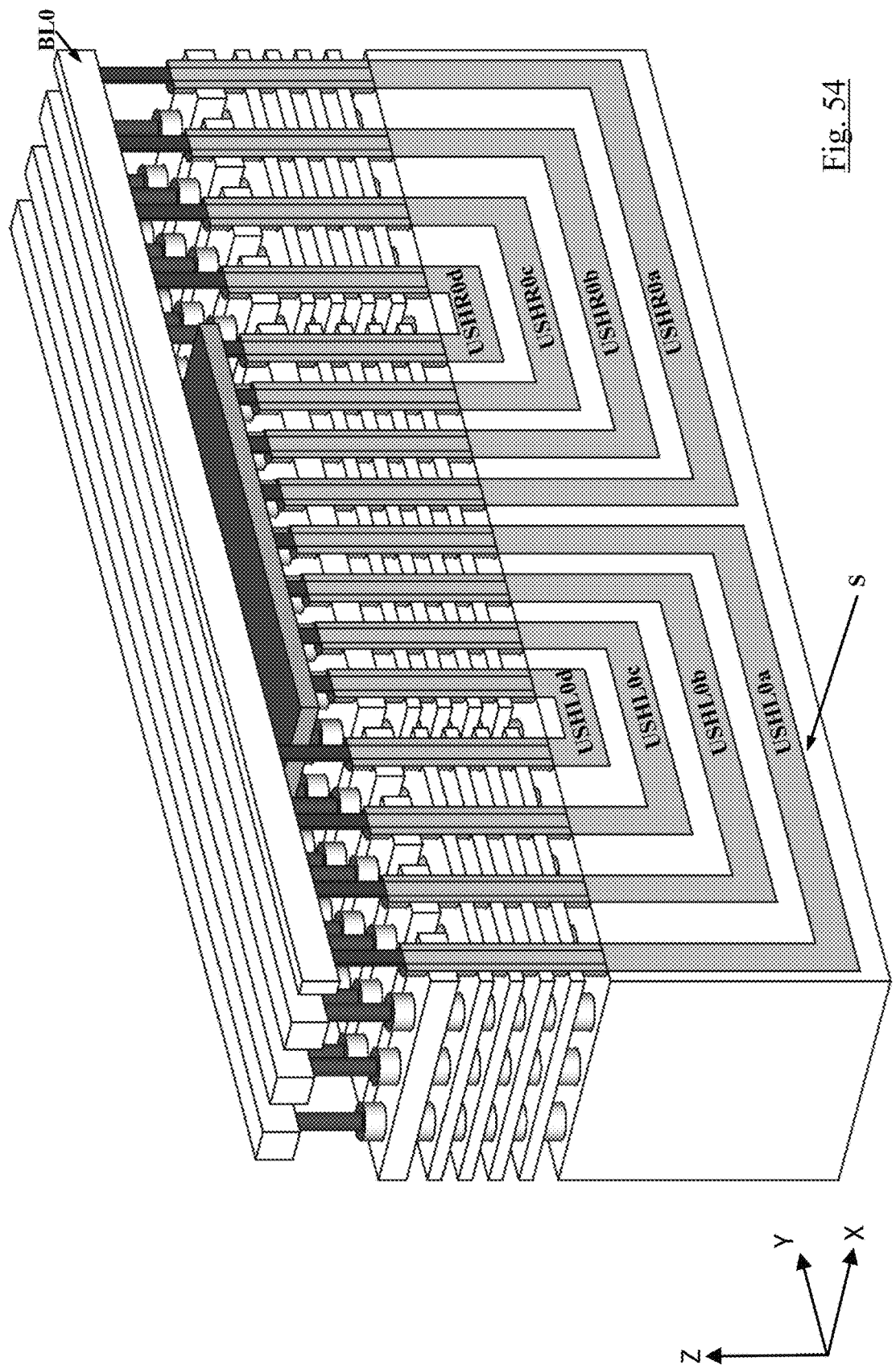
Figure 57:
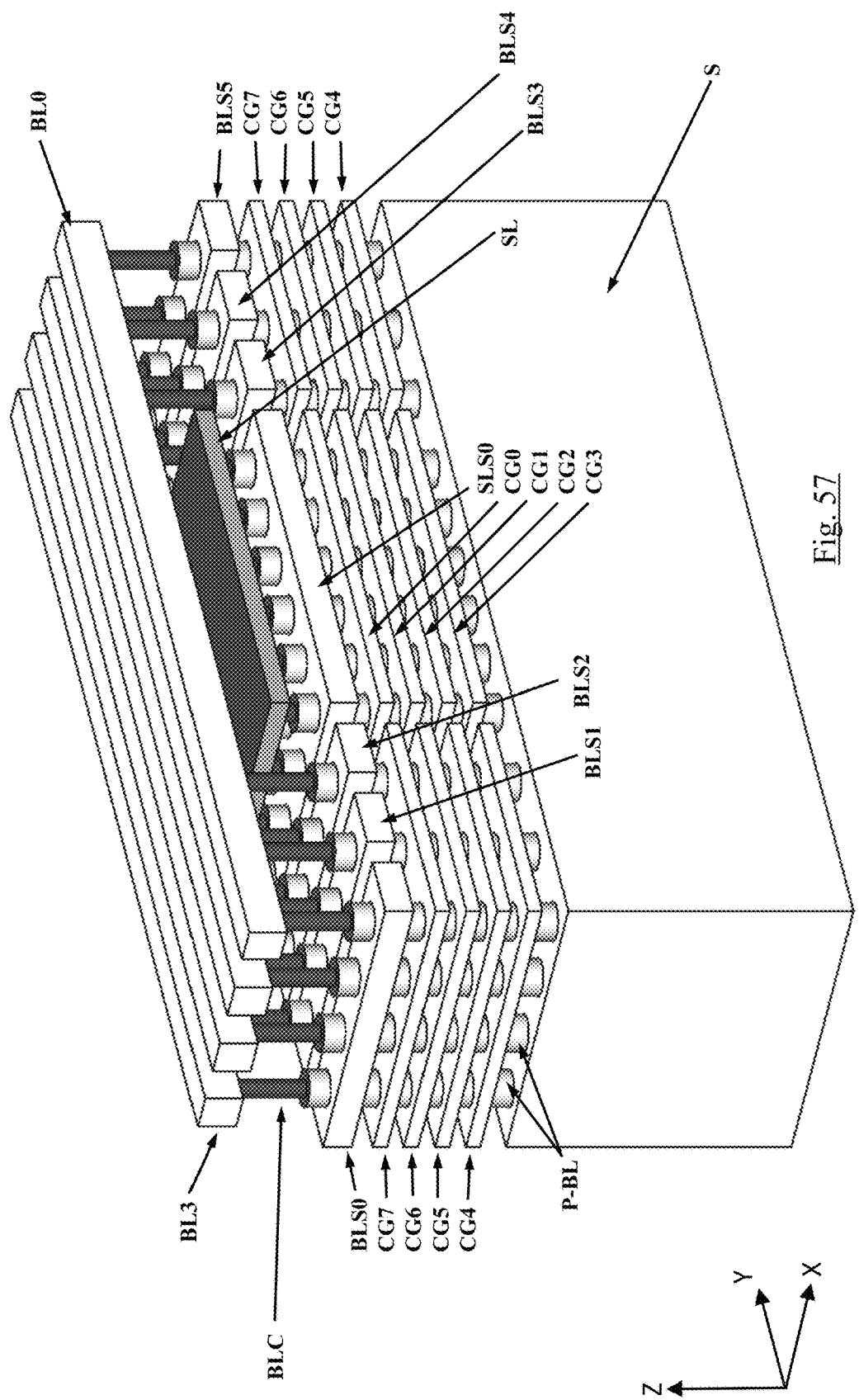
Figure 58:
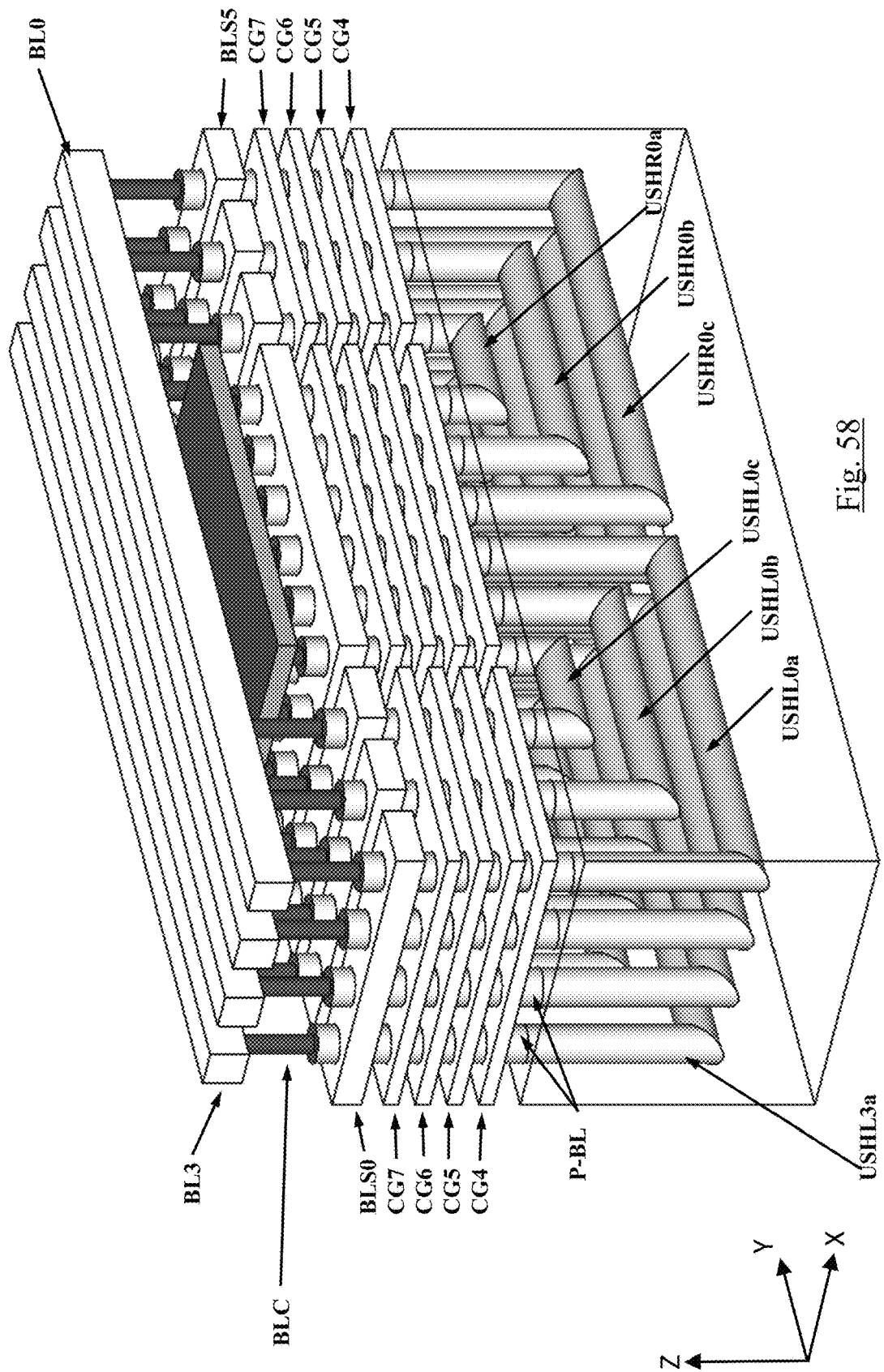
Figure 59:
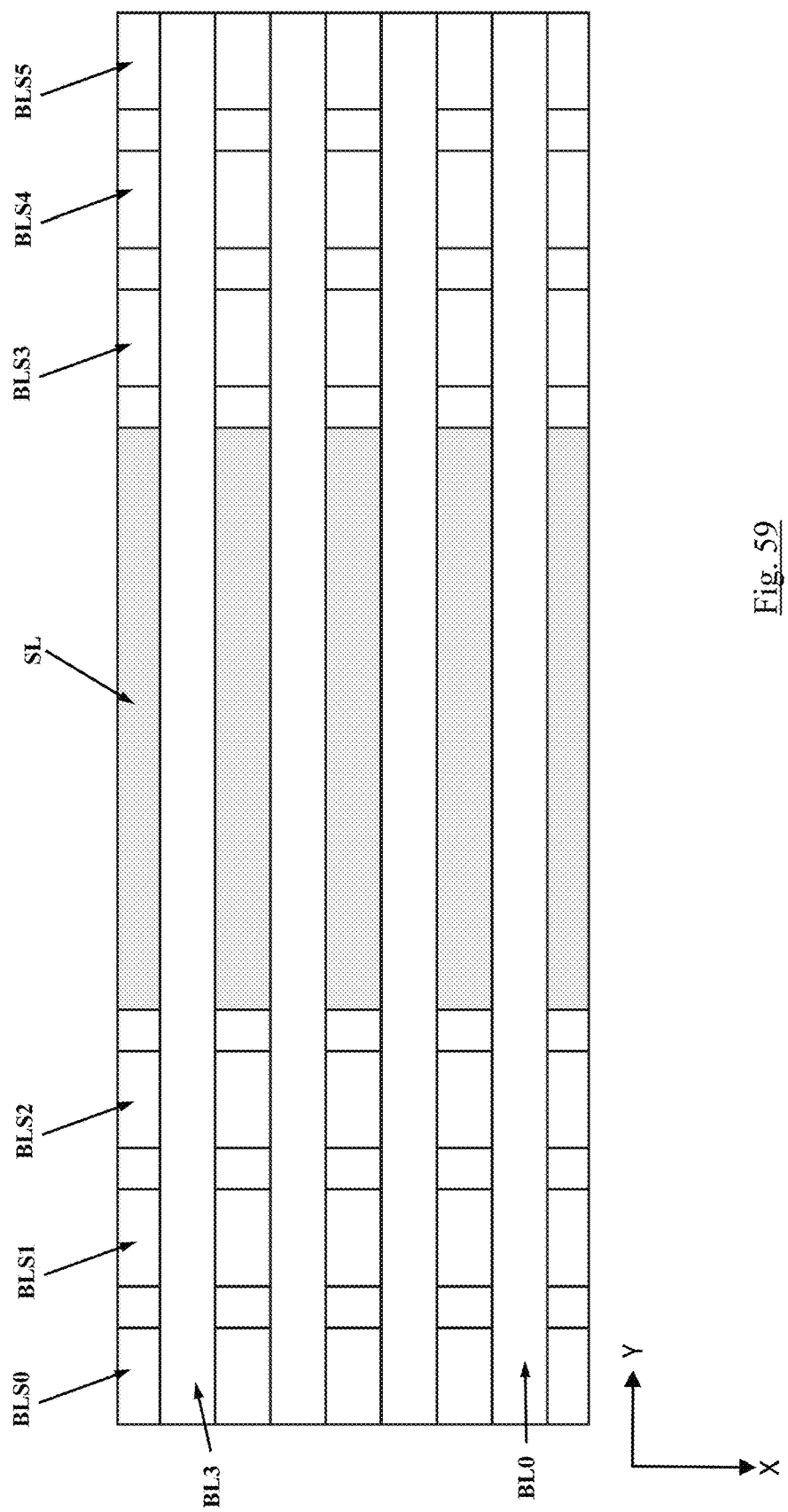
Figure 60:
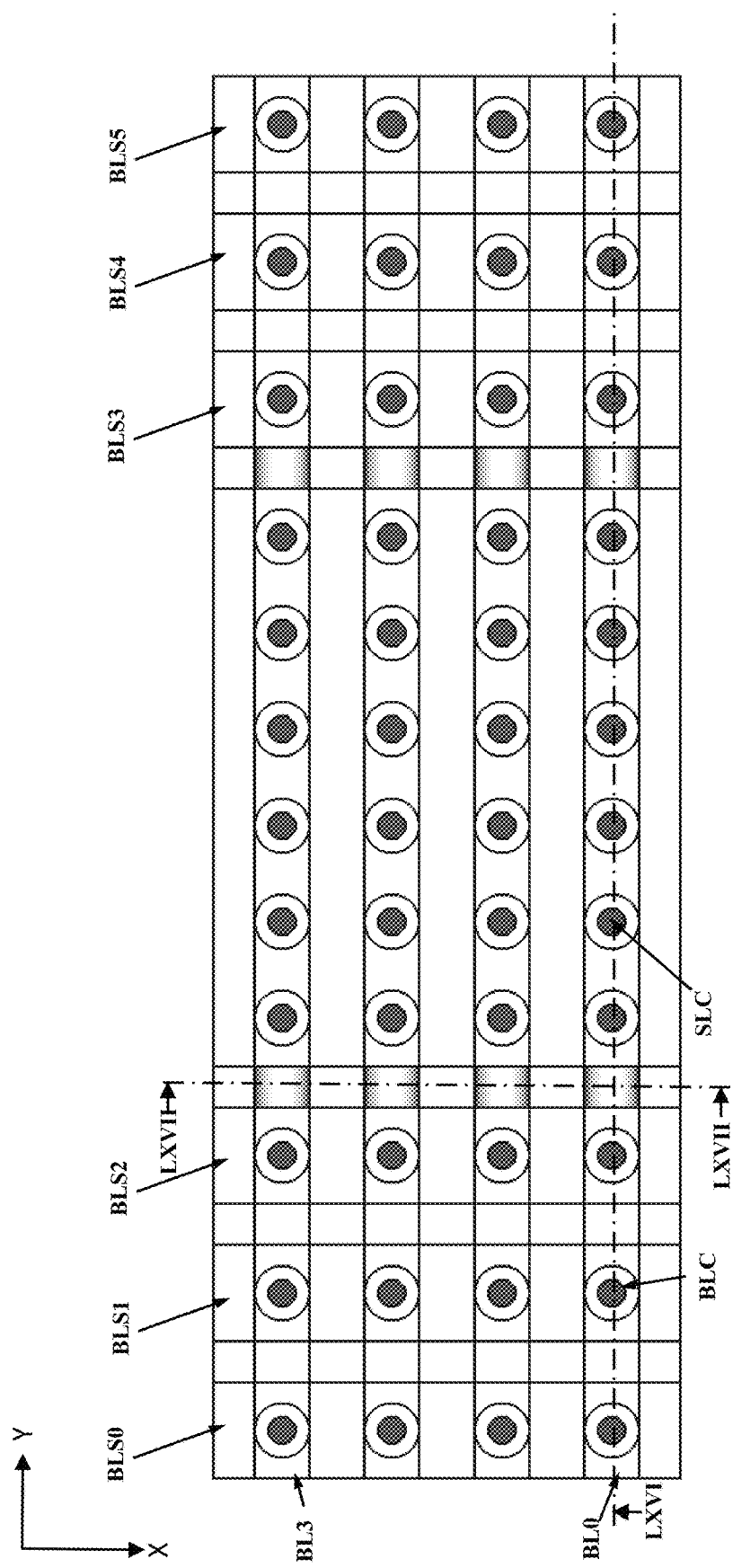
Figure 61:
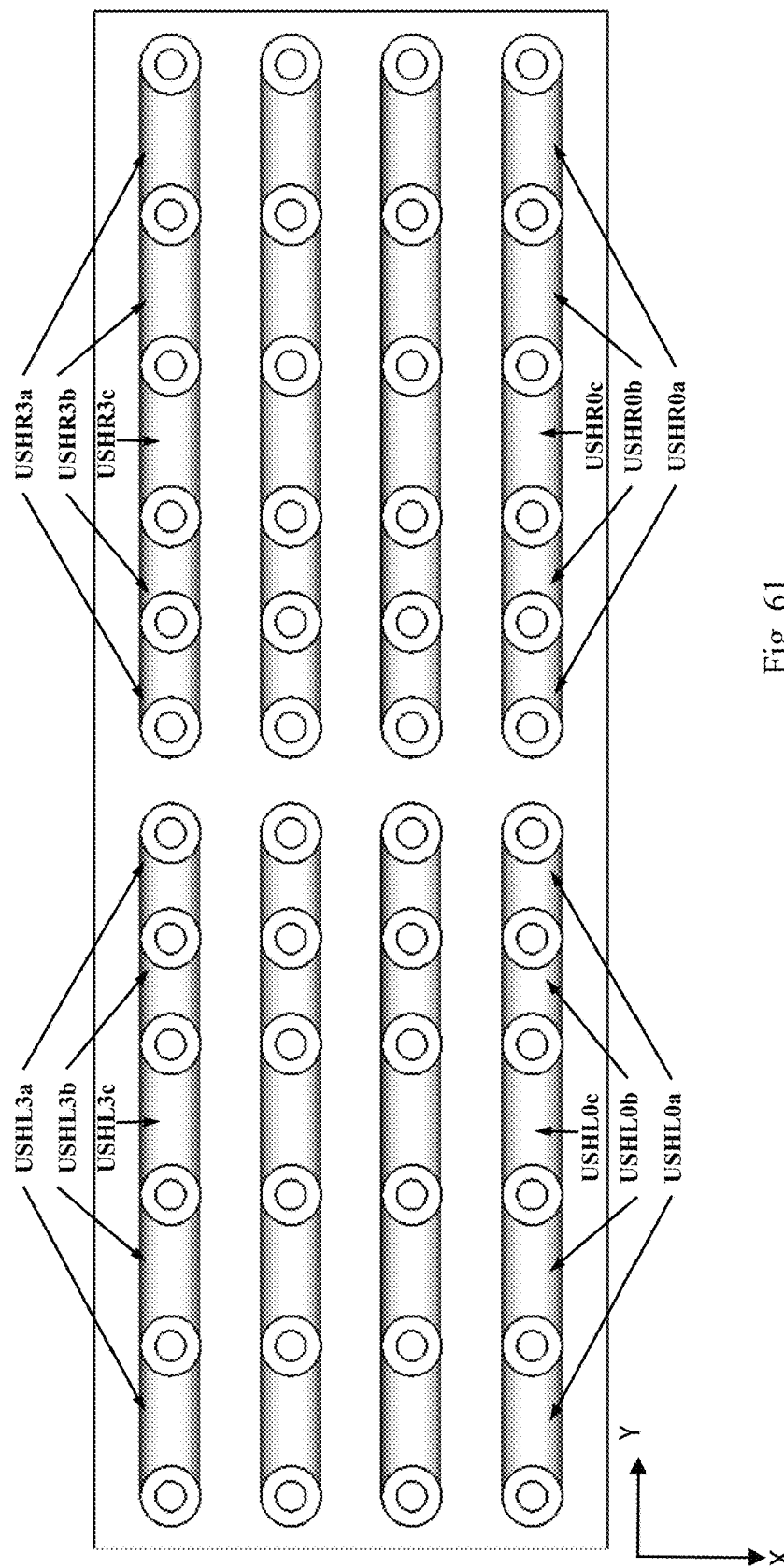
Figure 62:
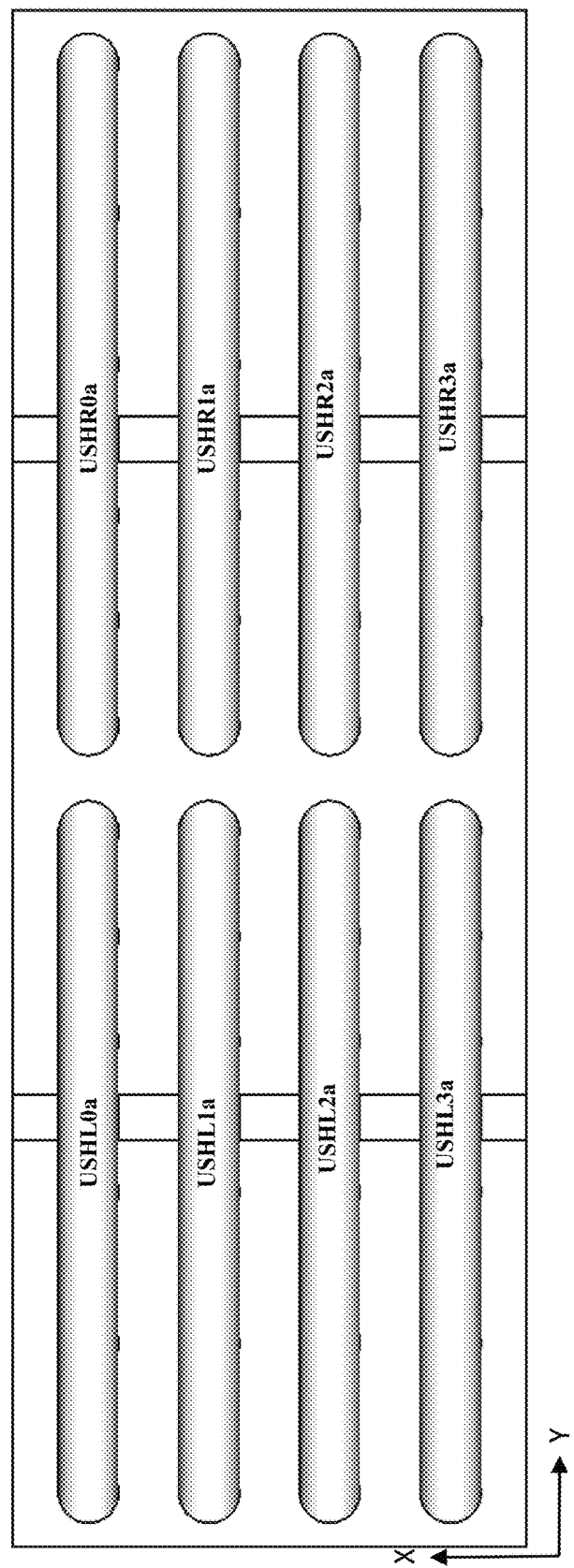
Figure 63:
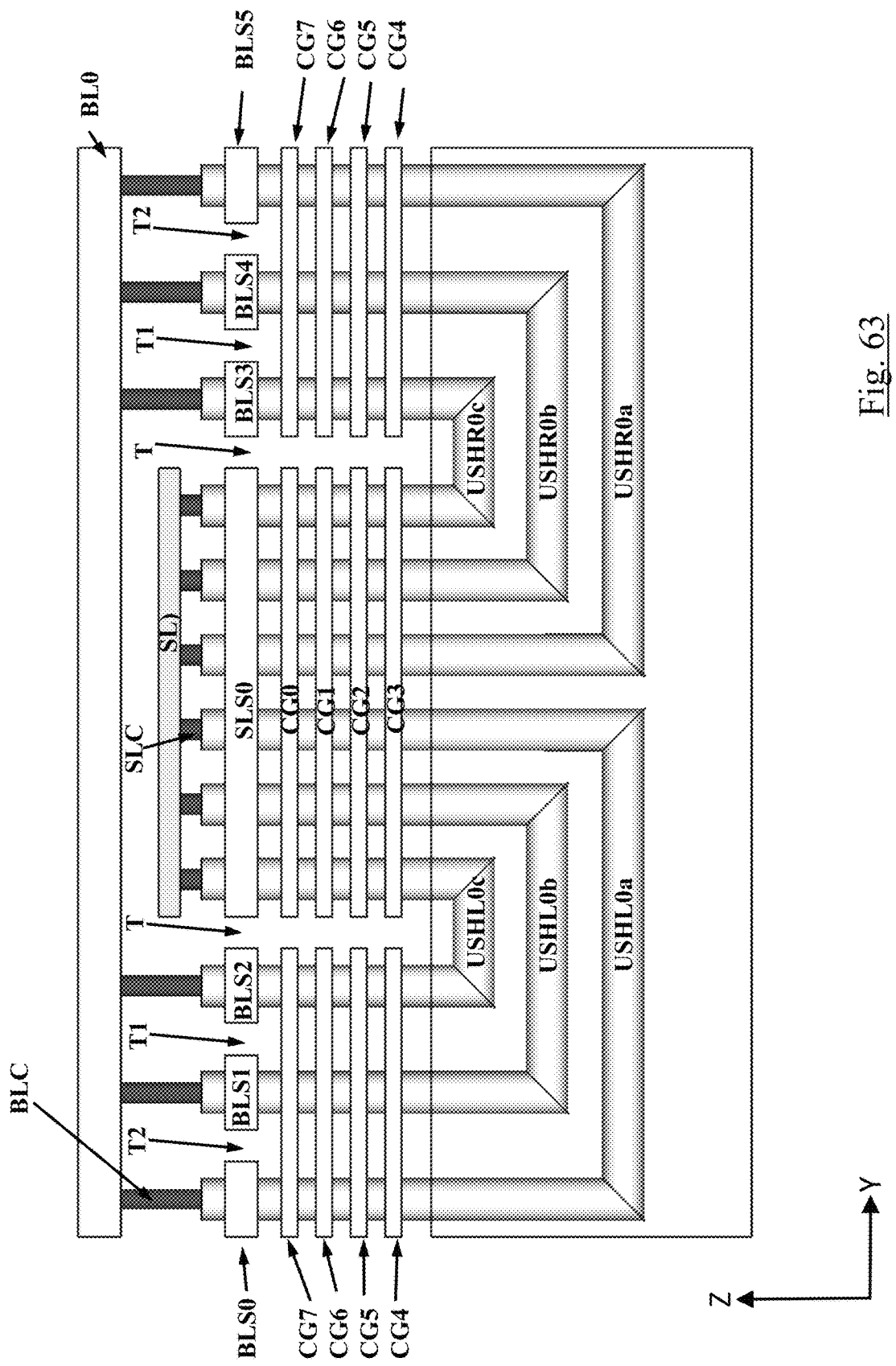
Figure 64:
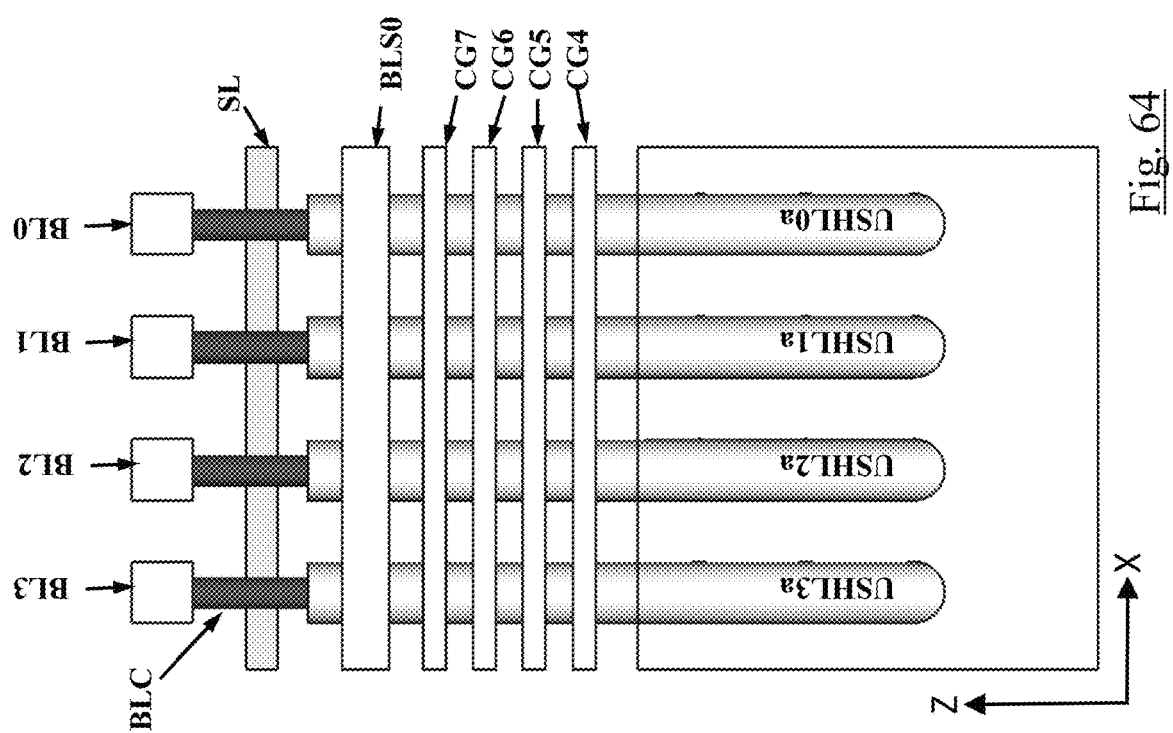
Figure 65:
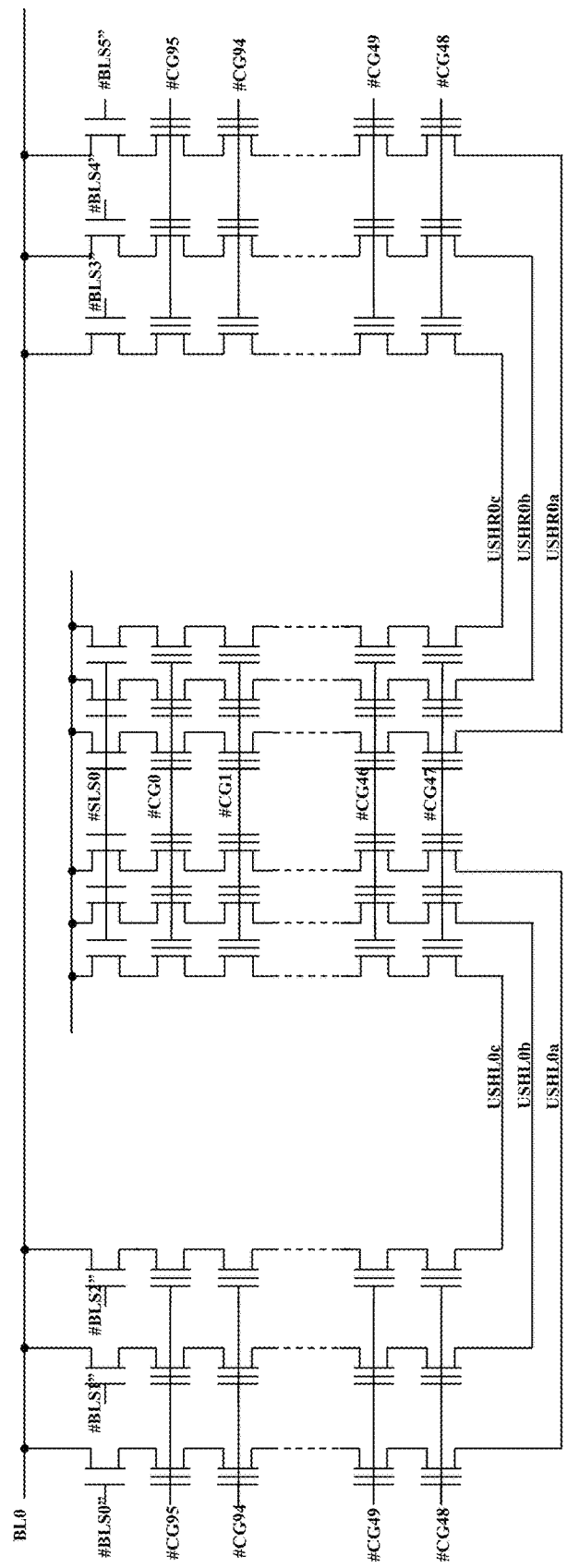
Figure 66:
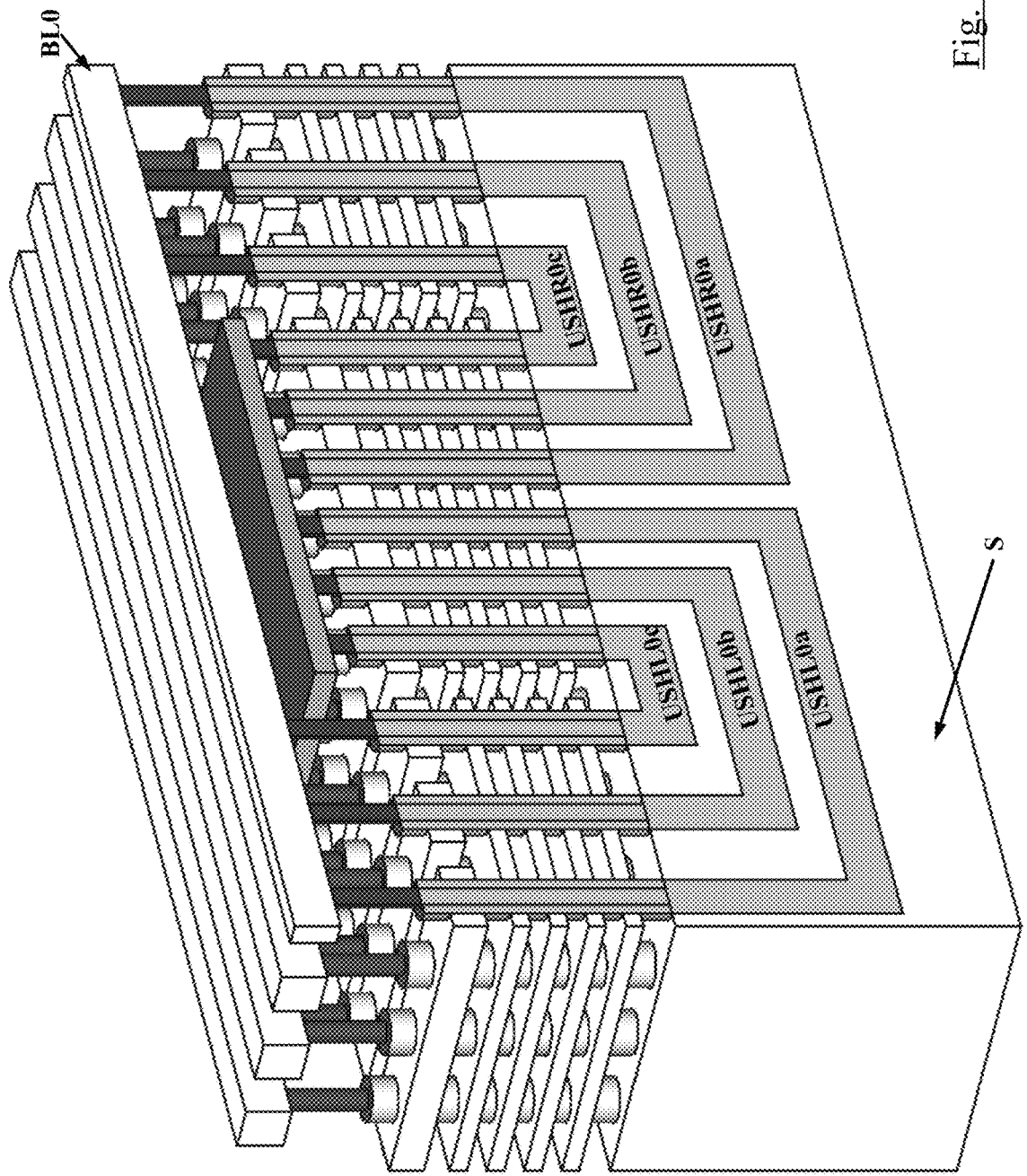
Figure 68:
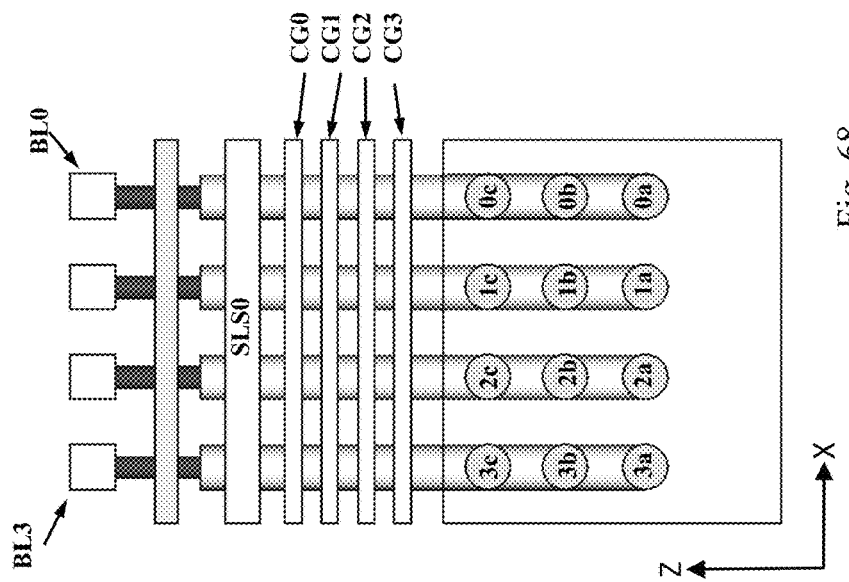
Figure 67:
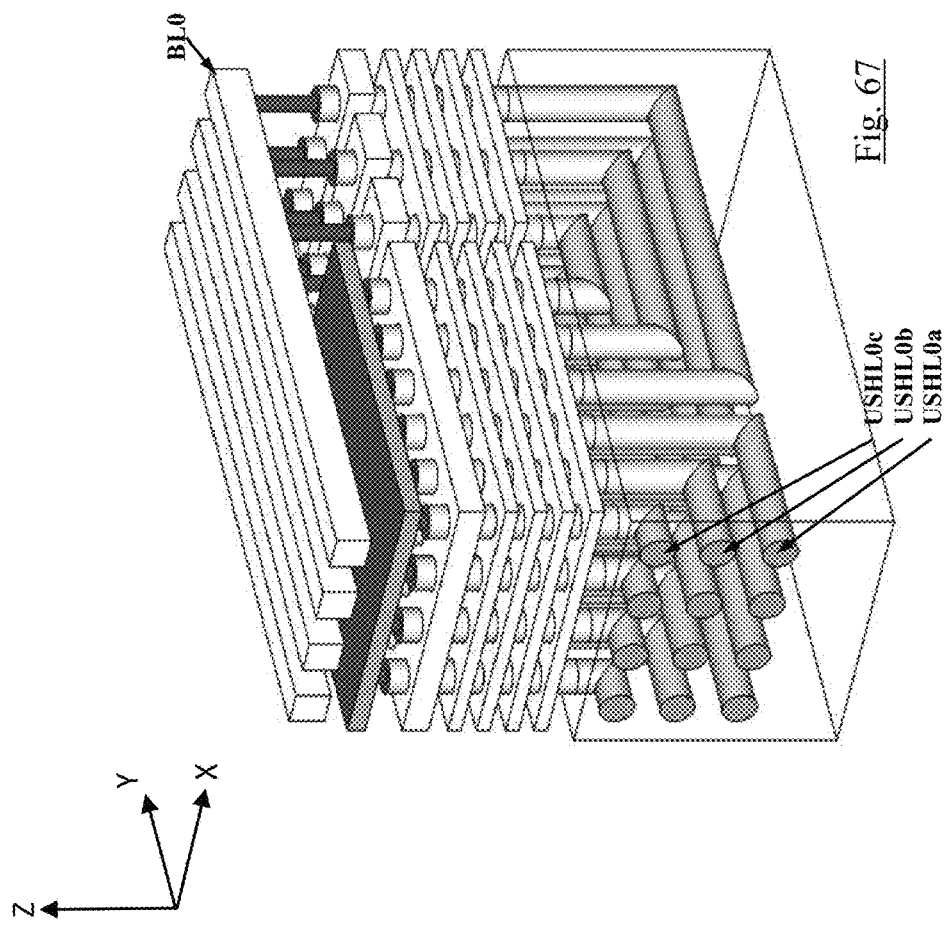

FIG. 3 corresponds to FIG. 2 but with a portion of substrate represented in transparency;

FIG. 4 is a top plan view of the portion of memory device of FIG. 2;

FIG. 5 corresponds to FIG. 4 but with the bit lines and the source line represented in transparency;

FIG. 6 is a top plan view of the portion of memory device of FIG. 2 at the level of the top surface of the substrate, with the substrate represented in transparency as in FIG. 3;

FIG. 7 is a plan view from below of the memory device portion of FIG. 2 with the substrate represented in transparency as in FIG. 3;

FIG. 8 is a front view (in the x direction shown in the figures) of the memory device portion of FIG. 2 with the substrate represented in transparency as in FIG. 3;

FIG. 9 is a side view (in the y direction shown in the figures) of the memory device portion of FIG. 2 with the substrate represented in transparency as in FIG. 3;

FIG. 10 is an equivalent circuit diagram of a portion of a memory device having the architecture shown in FIGS. 2-9 but with a greater number of memory cells (96 instead of 8);

FIGS. 11-16 are sectional views of the memory device portion of FIG. 2, according to the sectional plans XI, XII, XIII, XIV, XV, XVI indicated in FIG. 5;

FIG. 17 is a sectional view of the memory device portion of FIG. 2, according to the plane XVII-XVII shown in FIG. 5;

FIG. 18 is a front view (in the y direction shown in the figures) of FIG. 17;

FIG. 19 is an isometric view of a portion of a memory device in accordance with a second exemplary embodiment of the invention;

FIG. 20 corresponds to FIG. 19 but with a portion of substrate represented in transparency;

FIG. 21 is a top plan view of the memory device portion of FIG. 19;

FIG. 22 corresponds to FIG. 21 but with the bit lines and the source line represented in transparency;

FIG. 23 is a top plan view of the memory device portion of FIG. 19 at the level of the top surface of the substrate, with the substrate as represented in transparency in FIG. 20;

FIG. 24 is a plan view from below of the memory device portion of FIG. 19 with the substrate as represented in transparency as in FIG. 20;

FIG. 25 is a front view (in the x direction shown in the figures) of the memory device portion of FIG. 19 with the substrate represented in transparency as in FIG. 20;

FIG. 26 is a side view (in the y direction shown in the figures) of the memory device portion of FIG. 19 with the substrate represented in transparency as in FIG. 20;

FIG. 27 is an equivalent circuit diagram of a portion of a memory device having the architecture shown in FIGS. 19-26 but with a greater number of memory cells (96 instead of 8);

FIGS. 28 and 29 are sectional views of the memory device portion of FIG. 19, according to the sectional planes XXVIII and XXIX shown in FIG. 22;

FIG. 30 is a sectional view of the memory device portion of FIG. 19, according to the plane XXX indicated in FIG. 22;

FIG. 31 is a front view (in the y direction shown in the figures) of FIG. 30;

FIG. 32 is an isometric view of a portion of a memory device in accordance with a third exemplary embodiment of the invention;

FIG. 33 corresponds to FIG. 32 but with a portion of the substrate represented in transparency;

FIG. 34 is a top plan view of the portion of memory device of FIG. 32;

FIG. 35 corresponds to FIG. 34 but with the bit lines and the source line represented in transparency;

FIG. 36 corresponds to FIG. 35 but with bit line contact plates represented in transparency;

FIG. 37 is a top plan view of the memory device portion of FIG. 32 at the level of the top surface of the substrate, with the substrate represented in transparency as in FIG. 33;

FIG. 38 is a plan view from below of the memory device portion of FIG. 32 with the substrate represented in transparency as in FIG. 33;

FIG. 39 is a front view (in the x direction shown in the figures) of the memory device portion of FIG. 32 with the substrate represented in transparency as in FIG. 33;

FIG. 40 is a side view (in the y direction shown in the figures) of the memory device portion of FIG. 32 with the substrate represented in transparency as in FIG. 33;

FIG. 41 is an equivalent circuit diagram of a portion of a memory device having the architecture shown in FIGS. 32-40, but with a greater number of memory cells (96 instead of 8);

FIGS. 42 and 43 are sectional views of the memory device portion of FIG. 32, according to the sectional planes XLII and XLIII indicated in FIG. 36;

FIG. 44 is a front view (in the y direction shown in the figures) of FIG. 43;

FIG. 45 is an isometric view of a portion of a memory device in accordance with a fourth exemplary embodiment of the invention;

FIG. 46 corresponds to FIG. 45 but with a portion of substrate represented in transparency;

FIG. 47 is a top plan view of the memory device portion of FIG. 45;

FIG. 48 corresponds to FIG. 47 but with the bit lines and the source line represented in transparency;

FIG. 49 is a top plan view of the memory device portion of FIG. 45 at the level of the top surface of the substrate, with the substrate represented in transparency as in FIG. 46;

FIG. 50 is a plan view from below of the memory device portion of FIG. 45 with the substrate represented in transparency as in FIG. 46;

FIG. 51 is a front view (in the x direction shown in the figures) of the memory device portion of FIG. 45 with the substrate represented in transparency as in FIG. 46;

FIG. 52 is a side view (in the y direction shown in the figures) of the memory device portion of FIG. 45 with the substrate represented in transparency as in FIG. 46;

FIG. 53 is an equivalent circuit diagram of a portion of a memory device having the architecture shown in FIGS. 45-52 but with a greater number of memory cells (96 instead of 8);

FIGS. 54 and 55 are sectional views of the memory device portion of FIG. 45, according to the sectional plans LIV-LIV and LV-LV indicated in FIG. 48;

FIG. 56 is a front view (in the y direction shown in the figures) of FIG. 55;

FIG. 57 is an isometric view of a memory device portion in accordance with a fifth exemplary embodiment of the invention;

FIG. 58 corresponds to FIG. 57 but with a portion of substrate represented in transparency;

FIG. 59 is a top plan view of the memory device portion of FIG. 57;

FIG. 60 corresponds to FIG. 59 but with the bit lines and the source line represented in transparency;

FIG. 61 is a top plan view of the memory device portion of FIG. 45 at the level of the top surface of the substrate, with the substrate represented in transparency as in FIG. 58;

FIG. 62 is a plan view from below of the memory device portion of FIG. 57 with the substrate represented in transparency as in FIG. 58;

FIG. 63 is a front view (in the x direction shown in the figures) of the memory device portion of FIG. 57 with the substrate represented in transparency as in FIG. 58;

FIG. 64 is a side view (in the y direction shown in the figures) of the memory device portion of FIG. 57 with the substrate represented in transparency as in FIG. 58;

FIG. 65 is an equivalent circuit diagram of a portion of a memory device having the architecture shown in FIGS. 57-65 but with a greater number of memory cells (96 instead of 8);

FIGS. 66 and 67 are sectional views of the memory device of FIG. 57 portion, according to the sectional plans LXVI-LXVI and LXVII-LXVII shown in FIG. 60, and FIG. 68 is a front view (in the y direction shown in the figures) of FIG. 67.

DETAILED DESCRIPTION OF EMBODIMENT EMBODIMENTS OF THE INVENTION

Figure 1:
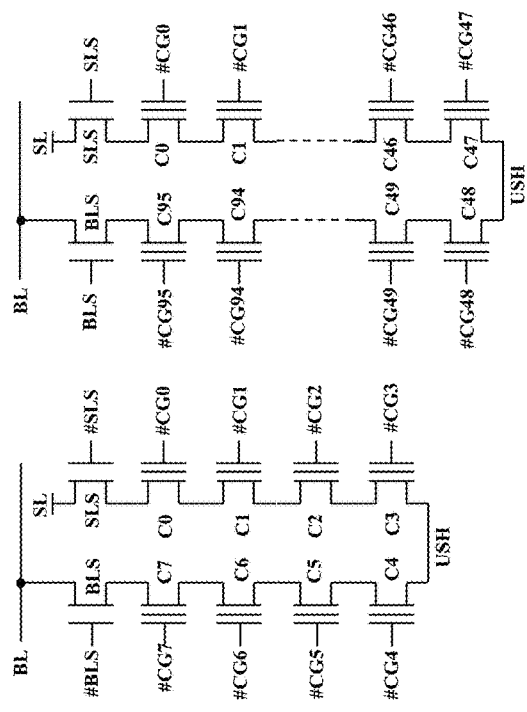
FIGS. 1A and 1B show the constituent basic elements of an 8 memory cells "U" shaped string.
FIG. 1C shows the equivalent electrical circuit of the string of memory cells of FIGS. 1A and 1B.
FIG. 1D shows the equivalent electrical circuit of a string of memory cells similar to that of FIGS. 1A and 1B but comprising 96 memory cells.

In FIGS. 1A and 1B there is schematically shown the structure of a "U"-shaped string of 8 memory cells of a 3D non-volatile NAND semiconductor memory, with the constituent basic elements; the structure is per-se known and will not be described in detail.

Reference numeral BL indicates a bit line, made of electrically conductive material, typically metal. Reference numeral SL indicates a source line, also made of electrically conductive material, for example metal. A bit line selector BLS is electrically connected to the bit line BL via a bit line contact BLC; the bit line selector BLS for example comprises a transistor (eg. a MOS transistor) for selectively electrically connecting/disconnecting the "U"-shaped string of memory cells to the bit line BL. A source line selector SLS is electrically connected to the source line SL; the source line selector for example comprises a transistor (eg. a MOS transistor) for selectively electrically connecting/disconnecting the "U"-shaped string of memory cells to the source line SL. Reference numerals CG0-CG7 indicate 8 control gates of a same number of memory cells (indicated by C0-C7 in FIG. 1C), arranged along a tubular structure with a "U" shape; in particular, the tubular structure comprises a bit line selector side string portion (or pillar) P-BL and a source line selector side string portion (or pillar) P-SL, the two pillars P-BL and P-SL being joined by a lower tubular portion USH (according to the orientation of the figures), or buried string portion, which electrically connects the two pillars P-BL and P-SL (the lower tubular portion USH is typically formed in a substrate, not shown in FIGS. 1A and 1B, which may be a layer referred to as "pipe gate layer", of the same material as the control gate, for example polysilicon, or a layer of a semiconductor material, such as silicon, or in an insulating material such as silicon oxide).

The bit line selector side pillar P-BL and the source line selector side pillar P-SL comprise various layers of material, not shown in the figures, that define the structure of the memory cells. In particular, the memory cells may be of a Charge Trap (CT) type or a floating gate type (Floating Gate or FG), for example. The specific structure of the memory cells is not essential for the purposes of the present invention, which is for example applicable to both CT memory cells and FG memory cells, as well as to memory cells of different structure.

FIG. 1C shows the equivalent electrical circuit of the "U"-shaped string of memory cells of FIGS. 1A and 1B. The bit line selector BLS is controlled by a bit line selection signal #BLS, the source line selector SLS is controlled by a source line selection signal #SLS, and the 8 control gates CG0-CG7 of the memory cells C0-C7 are controlled by respective control gate (selection) signals CG0 #-# CG7. The bit line selection signals #BLS, the source line selection signals #SLS and the control gate selection signals CG0 #-# CG7 are generated by decoding circuits of memory cell addressing signals. The control gates CG0-CG7 constitute the word lines of the memory. In particular, the control gates CG0-CG3 are source line selector side word lines and the word lines CG4-CG7 are bit line selector side word lines.

In the "U"-shaped memory cells string of FIGS. 1A and 1B, 4 control gates CG0-CG3 (and thus 4 memory cells) are arranged in succession, stacked along the source line SL selector side pillar and 4 control gates CG4-CG7 (and thus 4 more memory cells) are arranged in succession, stacked along the bit line BL selector side pillar. Each of the 4 control gates CG0-CG3 along the source line selector side pillar P-SL is at the same height (according to the direction indicated by z in the figures) of a respective one of the 4 control gates CG4-CG7 arranged along the bit line selector side pillar P-BL, and for this reason the "U"-shaped string is said to have 4 layers. The state of the art knows 3D memory devices with 24, 36 and even 48 layers, each "U"-shaped string of memory cells containing 48, 72 and 96 memory cells, respectively. FIG. 1D shows the equivalent electrical circuit of a "U"-shaped string of memory cells with 48 layers, with 96 memory cells, of which 48 memory cells C0-C47 (control gates CG0-CG47, controlled by respective control gate selection signals #CG0-#CG47) are arranged in succession, stacked along the source line selector side pillar P-SL, and other 48 memory cells C48-C95 (control gates CG48-CG95, controlled by respective control gate selection signals #CG48-#CG95) are arranged in succession, stacked along the bit line selector side pillar P-BL. The present invention is applicable irrespective of the number of layers (i.e. irrespective of the number of memory cells in the strings).

First Embodiment

A first exemplary embodiment of the invention is shown in FIGS. 2-18. Similarly to FIGS. 1A and 1B, the figures (except for FIG. 10, which shows the equivalent electrical circuit of a memory with 48 layers) illustrate for simplicity a memory with 4 layers, but this is not to be construed as limiting. In particular, FIGS. 2-18 relate to a so-called memory (cell) block, to be understood as a set of memory cells that share the same set of (eight in the example considered) control gates CG0-CG7.

The memory block includes two groups (first and second group) of 16 "U"-shaped strings of memory cells, each "U"-shaped string having the structure shown in FIGS. 1A and 1B. In a first group of 16 "U"-shaped strings of memory cells (at the left of the figures) each "U"-shaped string is electrically connectable/disconnectable to/from a respective bit line among the 16 bit lines BL0-BL15 through a respective bit line selector (MOS transistor), wherein the 16 bit line selectors of the 16 "U"-shaped strings of the first group are indicated in their entirety with BLS0 and are controlled by a same bit line selection control signal #BLS0. Similarly, in the second group of 16 "U"-shaped strings of memory cells (at the right in the figures) each "U"-shaped string is electrically connectable/disconnectable to/from a respective bit line among the 16 bit lines BL0-BL15 through a respective bit line selector (MOS transistor), where the 16 bit line selectors of the first group of 16 strings are indicated in entirety with BLS1 and are controlled by a same bit line selection control signal #BLS1. Each "U"-shaped string, of the first or of the second group, is electrically connectable/disconnectable to/from a source line SL common to (shared by) all the memory blocks, by means of a respective source line selector, where the source line 32 selectors of the 16 "U"-shaped strings of the first group and of the 16 "U"-shaped strings of the second group are indicated in their entirety with SLS0 and are controlled by a same source line selection control signal #SLS0. The source line selectors SLS0 (and the source line SL) are arranged between the bit line selectors BLS0 of the "U"-shaped strings of the first group and the bit line selectors BLS1 of the "U"-shaped strings of the second group. From the constructive point of view, the source line SL, the source line selectors SLS0 and the control gates along the source line side pillars P-SL are separated (electrically and physically) by the bit line selectors BLS0 and BLS1 and from the bit line side control gates CG4-CG7 of the two groups of "U"-shaped strings by two excavations or trenches T, in jargon called "slits" (cuts, cracks, separations, subdivisions) which extend in depth down to the top (according to the orientation of the figures) surface of the substrate S in which the lower tubular portions USHL0-USHL15 and USHR0-USHR15 of the "U"-shaped tubular structures are formed.

In each of the two groups of "U"-shaped strings, the "U"-shaped strings are arranged in rows extending along the direction x; in the example considered here, the 16 "U"-shaped strings of each group are arranged in 4 rows in the direction x. In each row, the (e.g. 4) "U"-shaped strings are equally spaced by one pitch p. "U"-shaped strings (belonging to rows) consecutive in the direction y are staggered by half a pitch p, in one direction and the other along the direction x, at zig-zag, so that groups of (2 in the example) of "U"-shaped strings belonging to alternated rows are aligned, lying on the same planes parallel to the direction y (planes yz).

On top of each alignment of "U"-shaped strings along the direction y, a pair of bit lines of the 16 bit lines BL0-BL15 extends. The bit line contacts BLC to the bit line side pillars of the "U"-shaped strings that are aligned along the direction y are staggered in one direction and the other along the direction x, resulting arranged at zig-zag, with respect to the centerline of such "U"-shaped strings. In this way it is possible to realize the contact to the bit line side pillars of the "U"-shaped strings that are aligned along the direction y to one or to the other bit line of the pair that overhangs, alternately along the direction y. Preferably, between the bit line contacts BLC and the respective bit line side pillars it is possible to introduce an intermediate level of contact PC (pillar contact) to facilitate the achievement of the electrical contact.

The source line contact SLC to the source line side pillars of the "U"-shaped strings are made substantially at the center of the source line pillars themselves.

In each of the two groups of "U"-shaped strings, the "U"-shaped strings are made so as to have one of four possible depths (depth along the direction z of the lower tubular portions USHL0-USHL3, USHR0-USHR3) and one of four possible widths (dimension along the direction y), wherein the choice of the depth and the width of a given "U"-shaped string among the 16 of the own group is carried out depending on the position (along the direction x and along the direction y) of the "U"-shaped string itself.

In particular, considering the "U"-shaped strings of the generic alignment along the direction y, the "U"-shaped string whose bit line selector side pillar is more outward with respect to the centerline of the memory block (outer "U"-shaped string) has a greater width than the "U"-shaped string whose bit line selector side pillar is more internal with respect to the centerline of the memory block (inner "U"-shaped string), and the external "U"-shaped string has a greater depth than the inner "U"-shaped string (see for example in FIG. 6, the pairs of lower tubular portions USHL0 and USHL1, USHL2 and USHL3, USHL12 and USHL13, USHL14 and USHL15 for the group of "U"-shaped strings on the left, and the pairs of lower tubular portions USHR1 and USHR0, USHR3 and USHR2, USHR15 and USHR14 for the group of "U"-shaped strings on the right). In this way, the internal "U"-shaped string is contained, both in the direction y and in the direction z, within the external "U"-shaped string.

In addition, considering, within the same group of 16 "U"-shaped strings, a generic pair of adjacent alignments of "U"-shaped strings along the direction y, consecutive in the direction x, the depth of the internal "U"-shaped string of a first alignment of said pair of alignments is less than the depth of the internal "U"-shaped string of the second alignment of the pair, adjacent to the first alignment, and the depth of the external "U"-shaped string of the first alignment of the pair is less than the depth the external "U"-shaped string of the second alignment of the pair, where the internal "U"-shaped strings have however depth less than that of the external "U"-shaped strings.

Advantageously, considering two pairs of "U"-shaped strings aligned along the direction y, a first pair of "U"-shaped strings belonging to one of two groups of 16 "U"-shaped strings and a second pair belonging to the other of the two groups of 16 "U"-shaped strings, the width of the inner "U"-shaped string of the first pair is smaller than the width of the inner "U"-shaped string of the second pair, and the width of the external "U"-shaped string of the first pair is smaller the width of the external "U"-shaped string of the second pair, where the inner "U"-shaped strings however have smaller width than the external "U"-shaped strings. As shown in FIG. 6, considering consecutive alignments along the direction y (in the direction x) the role of "first pair" and "second pair" is alternately assumed by a pair of "U"-shaped strings of the first group (left) and by a corresponding pair of "U"-shaped strings of the second group (right).

In this way it is possible to compact the "U"-shaped strings in the direction x and in the direction y without the risk that two or more strings come into mutual contact.

Advantageously, in each of the two groups of "U"-shaped strings, the "U"-shaped strings are made so as to have their respective centerlines on a same plane parallel to the direction x.

With the architecture of FIGS. 2-18, in which in particular it is necessary to provide only two separations (slits) T, it is possible to realize very compact memory blocks containing a number of cells equal to the number of layers multiplied by 64, with 16 bit lines and a source line. For comparison, considering the architecture of FIG. 5A of US 2015/017771 A1, with an equal number of layers, in order to have a number of cells equal to those of the memory block according to the first embodiment of the present invention, it should be necessary to place side by side, in the direction y, two structures as those of FIG. 5A of US 2015/017771 A1, but the memory block that would be obtained in this way would be less compact, since it would be necessary to have five separations instead of only two separations T. The savings in terms of area obtainable with the memory block architecture according to the first embodiment of the present invention is estimated to be a 10-15%.

Second Embodiment

A second exemplary embodiment of the invention is shown in FIGS. 19-31. As before, the figures (except for FIG. 27, which shows the equivalent electrical circuit of a memory with 48 layers) illustrate for simplicity a memory with 4 layers, but this is not to be construed as limiting. In particular, as for the first embodiment described, FIGS. 19-31 relate to a memory (cell) block, i.e., the set of memory cells that share the same set of (eight in the example considered) control gates CG0-CG7.

Compared to the first embodiment, in the second embodiment the 16 bit line selectors of the 16 "U"-shaped strings of the first group are grouped into two groups of bit line selectors indicated in their entirety with BLS0' and BLS1', respectively, and all the bit line selectors of the group BLS0', respectively BLS1', are controlled by a same bit line selection control signal #BLS0', respectively #BLS1'. Similarly, the 16 bit line selectors of the 16 "U"-shaped strings of the second group are grouped into two groups of bit line selectors indicated in their entirety with BLS2' and BLS3', respectively, and all the bit line selectors of the group BLS2', respectively BLS3', are controlled by a same bit line selection control signal #BLS2', respectively #BLS3'.

From the constructive point of view, in addition to the two separations T already provided in the first embodiment, two additional separations T1 are provided, extending in depth down to the topmost control gate layer, to separate, electrically and physically, the bit line selectors group BLS0' from the bit line selectors group BLS1', and the bit line selectors group BLS2' from the bit line selectors group BLS3'.

Having divided the bit line selectors into four groups, instead of into two groups as in the first embodiment, the number of bit lines can be halved (as the bit line selection signals are doubled): with the same number of "U"-shaped strings of the memory block, in the second embodiment there are provided 8 bit lines BL0-BL7 instead of the sixteen bit lines of the first embodiment.

Thanks to the halving of the number of bit lines, in the second embodiment it is possible to avoid having to provide the offset of the bit line contacts to the bit line side pillars of the "U"-shaped strings. In fact, having halved the number of bit lines, on top of each alignment of "U"-shaped strings along the direction y now only one bit line of the 8 bit lines BL0-BL7 extends.

The arrangement of the 16 "U"-shaped strings in each of the two groups of "U"-shaped strings does not change with respect to the first embodiment.

In each of the two groups of "U"-shaped strings, the first two rows of "U"-shaped strings along the direction x (that is, the two more external rows of "U"-shaped strings with respect to the centerline of the memory block) are afferent to a the same group of bit line selectors BLS0', BLS3'; the latter two rows of "U"-shaped strings along the direction x (that is, the two more internal rows of "U"-shaped strings with respect to the centerline of the memory block) are afferent to a same group of bit line selectors BLS1', BLS2'.

In FIGS. 19-31 the lower tubular segments of the 8 "U"-shaped strings of the "U"-shaped strings of the first two rows in the direction x of the "U"-shaped strings group on the left are indicated with USHL0a-USHL7a, and the lower tubular segments of the 8 "U"-shaped strings of the "U"-shaped strings of the second two rows in the direction x of the group of "U"-shaped strings on the left are indicated with USHL0b-USHL7b; similarly, the lower tubular segments of the 8 "U"-shaped strings of the "U"-shaped strings of the first two rows in the direction x of the group of "U"-shaped strings on the right are indicated with USHR0a-USHR7a, and the lower tubular segments of the 8 "U"-shaped strings of the "U"-shaped strings of the second two rows in the direction x of the group of "U"-shaped strings on the right are indicated with USHR0b-USHR7b.

The architecture of the memory block in accordance with the second embodiment is slightly less compact than the architecture according to the first embodiment (in particular as a result of provision of four slits T and T1), but has the advantage of a greater simplicity, even constructive, thanks to the halving of the number of bit lines, which also makes unnecessary the offset of the bit line contacts to the bit line side pillars of the "U"-shaped strings. The memory block architecture in accordance with the second embodiment is still advantageous with respect to the architecture of FIG. 5A of US 2015/017771 A1.

Third Embodiment

A third exemplary embodiment of the invention is shown in FIGS. 32-44. As before, the figures (except for FIG. 41, which shows the equivalent electrical circuit of a memory with 48 layers) illustrate for simplicity a memory with 4 layers, but this is not to be construed as limiting. In particular, as for the previously described embodiments, FIGS. 32-44 relate to a memory (cell) block, i.e., the set of memory cells that share the same set of (eight in the example considered) control gates CG0-CG7.

The third embodiment can be considered a variation of the second embodiment.

As in the second embodiment (and also as in the first embodiment), in each of the two groups of "U"-shaped strings, the "U"-shaped strings are arranged in rows that extend along the direction x (in the example considered here, the 16 "U"-shaped strings of each group are arranged in 4 rows in the direction x), and in each row the (4 in the example) "U"-shaped strings are equally spaced by one pitch p.

However, unlike the second embodiment (and also unlike the first embodiment), the architecture of the memory block in accordance with the third embodiment does not provide that the "U"-shaped strings (belonging to rows) consecutive in direction y are offset by half a pitch p, in one direction and the other along the direction x, i.e. the zig-zag arrangement of the first two embodiments is not provided. Therefore, the "U"-shaped strings belonging to the (4 in the example) rows of each group of 16 "U"-shaped strings are aligned, lying on the same planes parallel to the direction y (planes yz).

Consequently, although in the third embodiment the same number of (8 in the example) bit lines BL0-BL7 as in the second embodiment is provided, it is again necessary (as in the first embodiment) to provide the staggering of the bit line contacts to the bit line side pillars of the "U"-shaped strings. In fact, each alignment of "U"-shaped strings along the direction y is partially overhung by a pair of bit lines of the 8-bit lines BL0-BL7.

In accordance with the third embodiment, the offset of the bit line contacts to the bit line side pillars of the "U"-shaped strings is obtained with the aid of bit line contact plates P-BLC. The bit line contact plates P-BLC are plates of electrically conductive material, for example obtained starting from the same metal layer with which the source line SL is made, generally rectangular in shape and substantially centered each one above a respective bit line selector side pillar of the "U"-shaped strings. The bit line contact plates P-BLC have dimension in the direction y substantially equal to the width (diameter) of the bit line selector side pillars of the "U"-shaped strings, and dimension d in the direction x substantially equal to the width (in the direction x) of a pair of adjacent bit lines. The bit lines BL0-BL7 contact the bit line contact plates P-BLC through the bit line contacts BLC, arranged in an eccentric position, offset in the direction x with respect to the axes of the bit line selector side pillars of the "U"-shaped strings; the bit line contact plates P-BLC contact the bit line selector side pillars of the "U"-shaped strings by means of the pillar contacts PC.

The arrangement of the 16 "U"-shaped strings in each of the two groups of "U"-shaped strings differs from that of the first two embodiments. In particular, in the generic alignment along the direction y of "U"-shaped strings of the generic group of 16 "U"-shaped strings, moving from the center line of the memory block to the outside along the direction y, the more internal "U"-shaped strings (i.e., whose bit line selector side pillar is closer to the centerline of the memory block; these are for example the "U"-shaped strings visible in FIG. 39 whose lower tubular portion is indicated with USHL0b and USHR1b) have a first width and a first depth; "U"-shaped strings immediately following (for example, in FIG. 39 these are the "U"-shaped strings whose lower tubular portion is indicated with USHL1b and USHR1b) have a second width and a second depth, greater than the first width and the first depth, respectively; "U"-shaped strings still successive (for example, in FIG. 39 these are the "U"-shaped strings whose lower tubular portion is indicated with USHL0a and USHR1a) have a third width and a third depth, greater than the second width and second depth, respectively; more external "U"-shaped strings of the memory block (for example, in FIG. 39 these are the "U"-shaped strings whose lower tubular portion is indicated with USHL1a and USHR0a) have a fourth width and a fourth depth, greater than the third width and third depth, respectively.

The memory block architecture in accordance with the third embodiment is slightly less compact than the architecture in accordance with the second embodiment.

Fourth Embodiment

A fourth exemplary embodiment of the invention is shown in FIGS. 45-56. As before, the figures (except for FIG. 53, which shows the equivalent electrical circuit of a memory with 48 layers) illustrate for simplicity a memory with 4 layers, but this is not to be construed as limiting. In particular, FIGS. 45-56 relate to a memory (cell) block, i.e., the set of memory cells that share the same set of (eight in the example considered) control gates CG0-CG7.

The fourth embodiment can be considered a variation of the third embodiment.

Differently from the third embodiment, the bit line selectors are further subdivided into sub-groups: with reference to the example shown in the figures, the bit line selectors group BLS0' is divided into two sub-groups of bit line selectors BLS0" and BLS1", the bit line selectors group BLS1' is divided into two sub-groups of bit line selectors BLS2" and BLS3", the bit line selectors group BLS2' is divided into two sub-groups of bit line selectors BLS4" and BLS5", and the group of bit line selectors BLS3' is divided into two sub-groups of bit line selectors BLS6" and BLS7", for a total of eight sub-groups of bit line selectors. All the bit line selectors of the sub-group BLS0", BLS1", BLS2", BLS3", BLS4", BLS5", BLS6", BLS7" are controlled by a same bit line selection control signal #BLS0", #BLS1", #BLS2", #BLS3", #BLS4", #BLS5", #BLS6", #BLS7", respectively.

From the constructive point of view, in addition to the two trenches (slits) T and the two additional trenches (slits) T1 already provided for in the second and in the third embodiments, four yet further separations (slits) T2 and T3 are provided, extending in depth down to the higher control gate layer, to separate, electrically and physically, the bit line selectors group BLS0" from the bit line selectors group BLS1", and the bit line selectors group BLS6" from the bit line selectors group BLS7".

Having divided the bit line selectors into eight groups, rather than into four groups as in the third embodiment, the number of bit lines can be further halved (as the bit line selection signals are doubled): for an equal number of "U"-shaped strings of the memory block, in the fourth embodiment there are provided 4 bit lines BL0-BL3 instead of the 8 bit lines of the third embodiment.

Thanks to the halving of the number of bit lines, in the fourth embodiment it is possible to avoid having to provide the offset of the bit line contacts to the bit line side pillars of the "U"-shaped strings. In fact, having halved the number of bit lines, on top of each alignment of "U"-shaped strings along the direction y now a single bit line of the 4 bit lines BL0-BL3 extends.

The arrangement of the 16 "U"-shaped strings in each of the two groups of "U"-shaped strings does not change with respect to the third embodiment.

In FIGS. 45-56 the lower tubular portions of the 16 "U"-shaped strings of the group of "U"-shaped strings on the left are indicated with USHLik, with i=0÷3 and k=a, b, c, d; the index k identifies the group of bit line selectors BLS0", BLS1", BLS2", BLS3" which pertains to a given "U"-shaped string, while the index i identifies the row (among the 4 rows) in the direction y where the considered "U"-shaped string is located. The same notation is adopted to indicate the lower tubular portions USHRik of the 16 "U"-shaped strings of the group of "U"-shaped strings on the right, in which case the index k identifies the bit line selectors group BLS4", BLS5", BLS6", BLS7".

The memory block architecture in accordance with the fourth embodiment is slightly less compact than the architecture in accordance with the third embodiment, as a consequence of the doubling of the number of bit line selectors groups (which requires to provide eight trenches, slits T, T1, T2 and T3).

Fifth Embodiment

A fifth exemplary embodiment of the invention is shown in FIGS. 57-68. As before, the figures (except for FIG. 65, which shows the equivalent electrical circuit of a memory with 48 layers) illustrate for simplicity a memory with 4 layers, but this is not to be construed as limiting. In particular, FIGS. 57-68 relate to a memory (cell) block, i.e., the set of memory cells that share the same set of (eight in the example considered) control gates CG0-CG7.

In the above-described embodiments, memory blocks comprising (two) groups of 16 "U"-shaped strings have always been considered. The number of "U"-shaped strings not to be construed as limiting for the present invention, and the fifth embodiment has a memory block architecture similar to that of the fourth embodiment but in an example of a memory block comprising 2 groups of 12 "U"-shaped strings.

Adopting a notation similar to that of the fourth embodiment, in FIGS. 57-68 the lower tubular segments of the 12 "U"-shaped strings of the group of "U"-shaped strings on the left are indicated with USHLik, with i=0÷3 and k=a, b, c; the index k identifies the group of bit line selectors BLS0", BLS1", BLS2" which pertains to a given "U"-shaped string, while the index i identifies the row (among the 4 rows) in the direction y in which there is the considered "U"-shaped string. The same notation is adopted to indicate the lower tubular segments USHRik of the 12 "U"-shaped string of the group of "U"-shaped strings on the right, in which case the index k identifies the bit line selectors group BLS4", BLS3", BLS4", BLS5".

In the memory block architecture according to the fifth embodiment six slits T, T1 and T2 are provided for.

More generally, it is possible to realize memory blocks containing a generic number n of "U"-shaped strings of memory cells (as well as a generic number of layers), starting from the previously described embodiments.

Replicating in the direction x and in direction y one of the memory blocks according to the embodiments described above, a matrix of memory (cells) is obtained.

The described memory block architectures according to the present invention allow to obtain very compact structures, and consequently memories with high data storage capacity per unit area.

What is claimed is:

1. A 3D memory device comprising:
a substrate;
at least one first group of four first "U"-shaped memory cells strings each including a first buried string portion, a first source line selector side string portion and a first bit line selector side string portion, wherein the first buried string portion is formed in the substrate and connects the first source line selector side string portion and the first bit line selector side string portion, each of the first "U"-shaped memory cells strings including memory cells stacks along the first source line selector side string portion and along the first bit line selector side string portion; and
at least one second group of four second "U"-shaped memory cells strings each including a second buried string portion, a second source line selector side string portion and a second bit line selector side string portion, wherein the second buried string portion is formed in the substrate and connects the second source line selector side string portion and the second bit line selector side string portion, each of the second "U"-shaped memory cells strings including memory cells stacks along the second source line selector side string portion and along the second bit line selector side string portion;
wherein the first and second source line selector side string portions are between the first and second bit line selector side string portions;
wherein a first pair of the first "U"-shaped memory cells strings are mutually co-planar and one surrounded by the other, a second pair of the first "U"-shaped memory cells strings are mutually co-planar but staggered with respect to the first pair of first "U"-shaped memory cells strings and one surrounded by the other, a first pair of the second "U"-shaped memory cells strings are mutually co-planar and one surrounded by the other, a second pair of the second "U"-shaped memory cells strings are mutually co-planar but staggered with respect to the first pair of second "U"-shaped memory cells strings and one surrounded by the other;
wherein first bit line selectors surround the first bit line selector side string portions and second bit line selectors surround the second bit line selector side string portions, and wherein the first bit line selectors comprise one first bit line selector for each of the first bit line selector side string portions and the second bit line selectors comprise one second bit line selector for each of the second bit line selector side string portions;
wherein the 3D memory device comprises a first, a second, a third and a fourth bit lines operatively associated to the first and second groups of four first and second "U"-shaped memory cells strings, wherein:
the first bit line is connected, through a respective first bit line selector and second bit line selector, to the first bit line selector side string portion of one of the first pair of the first "U"-shaped memory cells strings and to the second bit line selector side string portion of one of the first pair of the second "U"-shaped memory cells strings;
the second bit line is connected, through a respective first bit line selector and second bit line selector, to the first bit line selector side string portion of the other one of the first pair of the first "U"-shaped memory cells strings and to the second bit line selector side string portion of the other one of the first pair of the second "U"-shaped memory cells strings;
the third bit line is connected, through a respective first bit line selector and second bit line selector, to the first bit line selector side string portion of one of the second pair of the first "U"-shaped memory cells strings and to the second bit line selector side string portion of one of the second pair of the second "U"-shaped memory cells strings, and
the fourth bit line is connected, through a respective first bit line selector and second bit line selector, to the first bit line selector side string portion of the other one of the second pair of the first "U"-shaped memory cells strings and to the second bit line selector side string portion of the other one of the second pair of the second "U"-shaped memory cells strings.

2. The 3D memory device of claim 1, wherein the first pair of first "U"-shaped memory cells strings have the respective first buried string portions formed at a first and a second different depths in the substrate and with a first and a second different lengths, the second pair of the first "U"-shaped memory cells strings have the respective first buried string portions formed at a third and a fourth different depths in the substrate, different from the first and second depths, and with a third and a fourth different lengths different from the first and second lengths, the first pair of the second "U"-shaped memory cells strings have the respective second buried string portions formed at the third and fourth depths in the substrate and with the third and four lengths, and the second pair of the second "U"-shaped memory cells strings have the respective second buried string portions formed at the first and second depths in the substrate and with the first and second lengths.

3. The 3D memory device of claim 2, wherein the length of the first and second buried string portions increases with their depth in the substrate, and wherein:
the first depth is less than the third depth, the third depths is less than the second depth and the second depth is less than the fourth depth, and
the first length is less than the third length, the third length is less than the second length and the second length is less than the fourth length.

4. The 3D memory device of any one of the preceding claims, wherein the first pair of first "U"-shaped memory cells strings are co-planar with the first pair of second "U"-shaped memory cells strings, and the second pair of first "U"-shaped memory cells strings are co-planar with the second pair of second "U"-shaped memory cells strings.

5. The 3D memory device of claim 1, further comprising:
a plurality of source line selector side word lines stacked over the substrate, wherein the plurality of source line selector side word lines surrounds the first source line selector side string portions and the second source line selector side string portions;
a first plurality and a second plurality of bit line selector side word lines stacked over the substrate, wherein the first plurality of bit line selector side word lines surrounds the first bit line selector side string portions and the second plurality of bit line selector side word lines surrounds the second bit line selector side string portions;
source line selectors stacked over the plurality of source line selector side word lines, wherein the source line selectors surround the first source line selector side string portions and the second source line selector side line string portions, wherein the source line selectors comprise one source line selector for each of the first and second source line selector side string portions; and the first bit line selectors are stacked over the first plurality of bit line selector side word lines and the second bit line selectors are stacked over the second plurality of bit line selector side word lines.

6. The 3D memory device of claim 5, wherein the plurality of source line selector side word lines comprises a stack of layers of source line selector side word lines, the source line selector side word lines in each layer being electrically connected, and the source line selectors are formed so as to be controlled by a common single source line selector control signal.

7. The 3D memory device of claim 5, wherein the first bit line selectors are formed so as to be controlled by a common single first bit line selector control signal, and the second bit line selectors are formed so as to be controlled by a common single second bit line selector control signal.

8. The 3D memory device of claim 5, wherein the first bit line selectors are formed as a first and a second groups of first bit line selectors, each first and second group of first bit line selectors being controlled by a respective common single first bit line selector control signal, each first and second group of first bit line selectors surrounding a respective subset of the first bit line selector side string portions, and the second bit line selectors are formed as a first and second groups of second bit line selectors, each first and second group of second bit line selectors being controlled by a respective common single second bit line selector control signal, each first and second group of second bit line selectors surrounding a respective subset of the second bit line selector side string portions.

9. The 3D memory device of claim 8, comprising a first and a second bit lines operatively associated to the first and second groups of four first and second "U"-shaped memory cells strings, wherein the first bit line is connected, through respective first bit line selectors of the first and second groups of first bit line selectors, to the first bit line selector side string portions of the first pair of the first "U"-shaped memory cells strings and, through respective second bit line selectors of the first and second groups of second bit line selectors, to the second bit line selector side string portions of the first pair of the second "U"-shaped memory cells strings.

* * * * *